United States Patent
Hayashi et al.

(10) Patent No.: US 6,628,086 B2
(45) Date of Patent: Sep. 30, 2003

(54) LIGHT EMITTING BODY, LIGHT EMITTING ELEMENT AND LIGHT EMITTING DISPLAY DEVICE USING SAME

(75) Inventors: Kazuhiko Hayashi, Tokyo (JP); Takashi Fukuchi, Tokyo (JP); Shinzo Tsuboi, Tokyo (JP); Ichiro Fujieda, Tokyo (JP)

(73) Assignee: NEC Corporation, Tokyo (JP)

(*) Notice: Subject to any disclaimer, the term of this patent is extended or adjusted under 35 U.S.C. 154(b) by 9 days.

(21) Appl. No.: 10/085,902

(22) Filed: Feb. 27, 2002

(65) Prior Publication Data

US 2002/0158588 A1 Oct. 31, 2002

(30) Foreign Application Priority Data

Feb. 27, 2001 (JP) .......................... 2001-051410

(51) Int. Cl.[7] ................................. G09G 3/10
(52) U.S. Cl. ................. 315/169.3; 315/169.1; 313/506; 313/520; 257/40; 257/103
(58) Field of Search .............. 315/169.3, 169.1; 313/498, 501, 504, 506, 509, 520; 257/10, 40, 98, 100, 103; 427/66; 428/690

(56) References Cited

U.S. PATENT DOCUMENTS 5,847,506 A * 12/1998 Nakayama et al. ......... 313/504
6,028,327 A * 2/2000 Mizoguchi et al. .......... 257/98
6,416,888 B1 * 7/2002 Kawamura et al. ......... 428/690

FOREIGN PATENT DOCUMENTS

| JP | 5-41281 | 2/1993 |
| JP | 5-182759 | 7/1993 |
| JP | 2800813 | 7/1998 |

OTHER PUBLICATIONS

"Organic Electroluminescent Diodes", Appl. Phys. Lett. 51, pp. 913–915 (1987).
"Conjugated Polymer Light–Emitting Diodes on Silicon Substrates", Appl. Phys. Lett. 65 (21), pp. 2636–2638 (1994).

* cited by examiner

Primary Examiner—Haissa Philogene
(74) Attorney, Agent, or Firm—Scully, Scott, Murphy & Presser

(57) ABSTRACT

An organic electroluminescence device is provided which is capable of providing light emission lasting time that can be practically used, that is, of improving its light emission life. A light emitting body used in the organic electroluminescence device is made up of a lower electrode layer, a light emitting layer and a transparent electrode layer being stacked in order on a substrate. As a material for the transparent electrode layer, a substance "$In_{2-x}Sn_xO_{3-y}$" being a mixture of an oxide of indium with tin is employed as its chief component. A material having hygroscopicity is formed adjacent to the transparent electrode layer. Light emitting element portion made up of the electrode and light emitting material layer is the electroluminescence device.

26 Claims, 45 Drawing Sheets

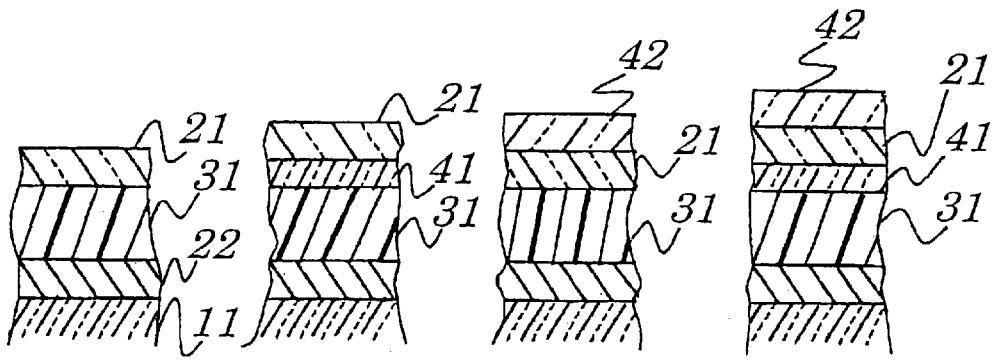
*FIG.1A*  *FIG.1B*  *FIG.1C*  *FIG.1D*
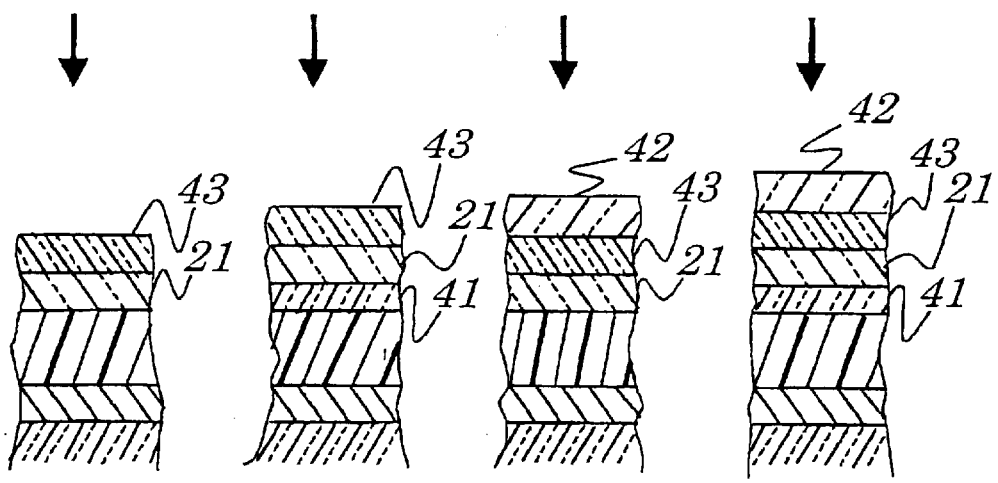
*FIG.1E*  *FIG.1F*  *FIG.1G*  *FIG.1H*

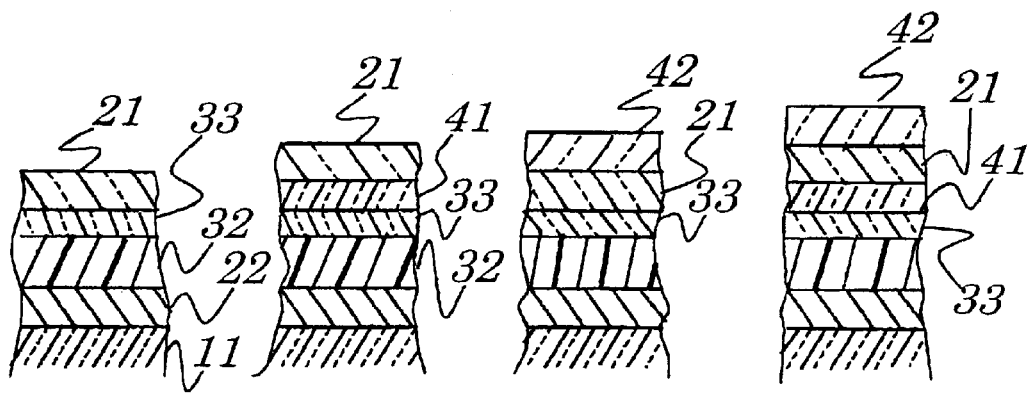
*FIG.2A*  *FIG.2B*  *FIG.2C*  *FIG.2D*
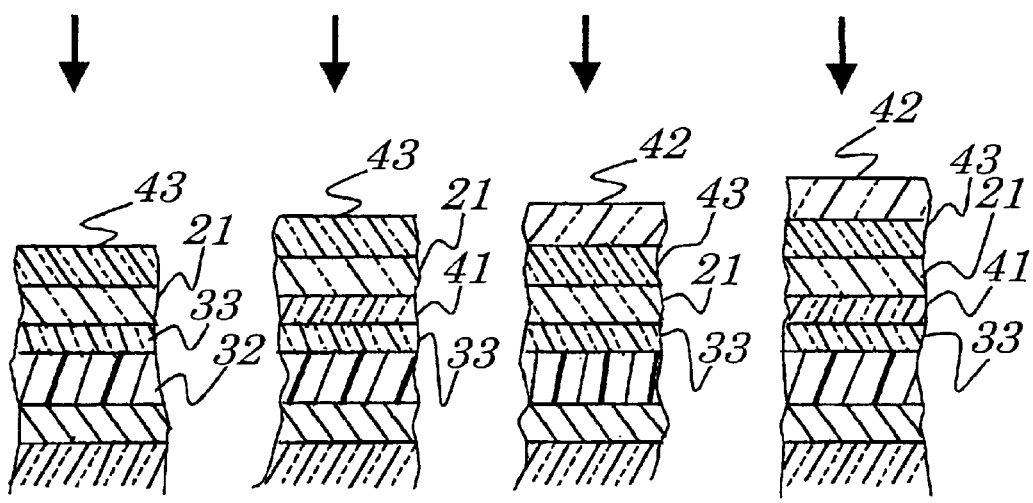
*FIG.2E*  *FIG.2F*  *FIG.2G*  *FIG.2H*

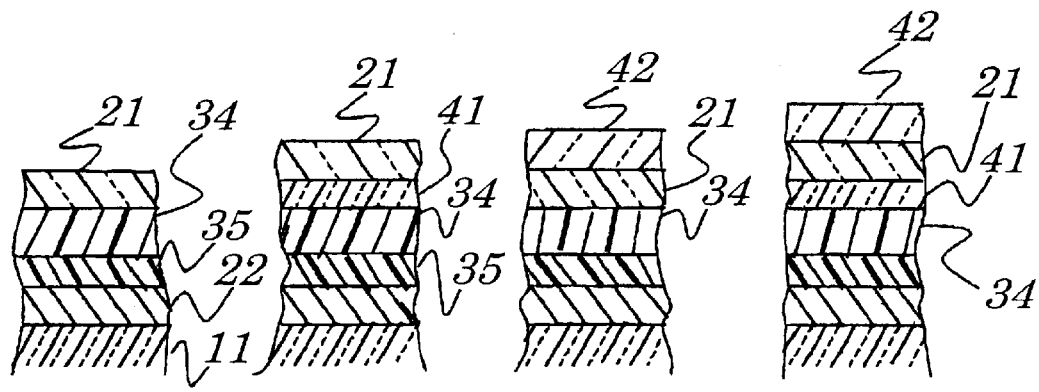
*FIG.3A*  *FIG.3B*  *FIG.3C*  *FIG.3D*
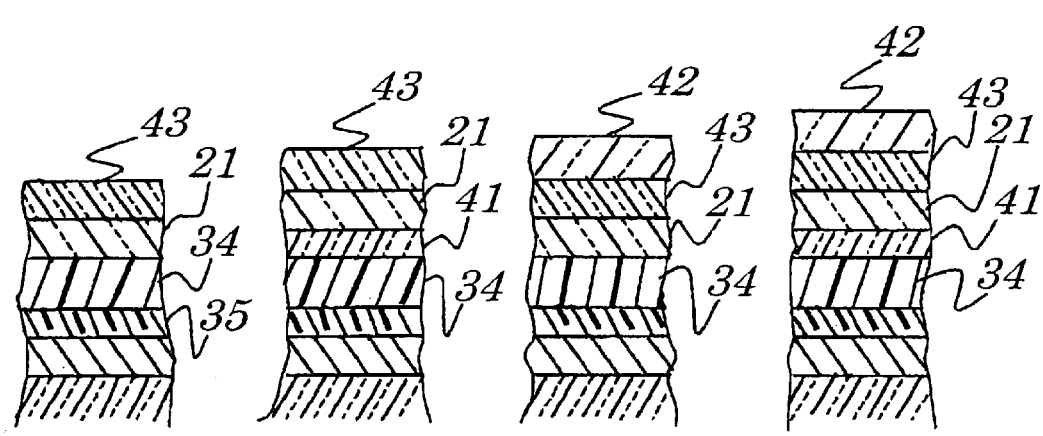
*FIG.3E*  *FIG.3F*  *FIG.3G*  *FIG.3H*

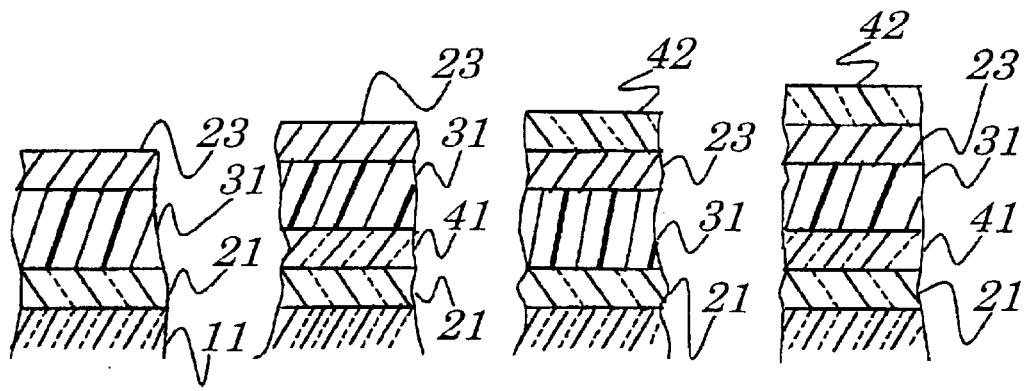
FIG.5A  FIG.5B  FIG.5C  FIG.5D
   
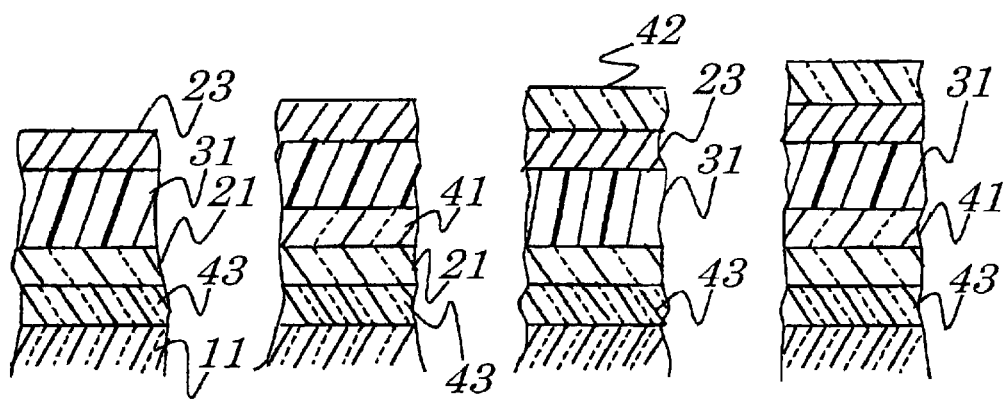
FIG.5E  FIG.5F  FIG.5G  FIG.5H

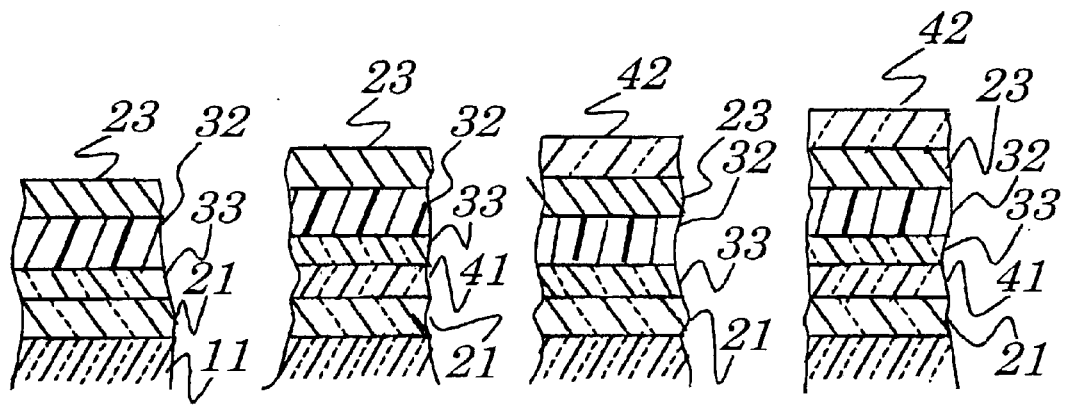
FIG.6A  FIG.6B  FIG.6C  FIG.6D
   
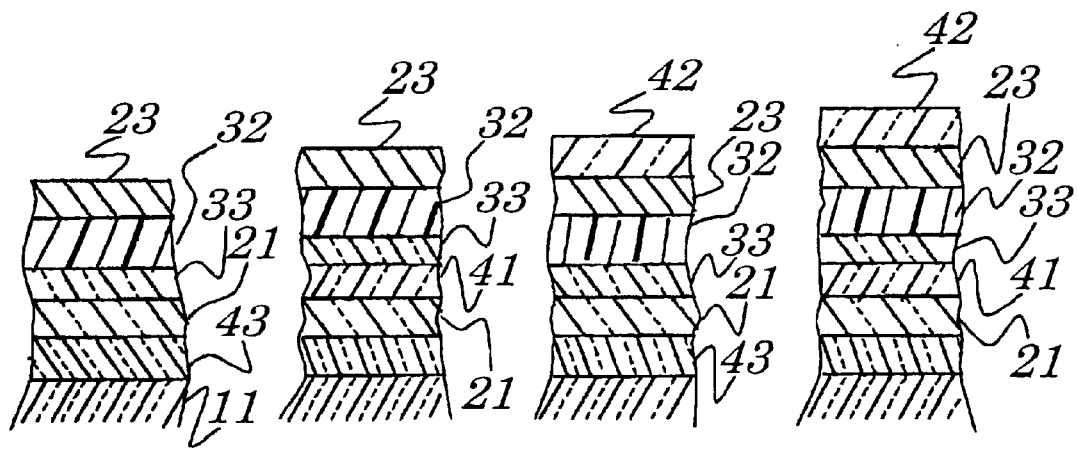
FIG.6E  FIG.6F  FIG.6G  FIG.6H

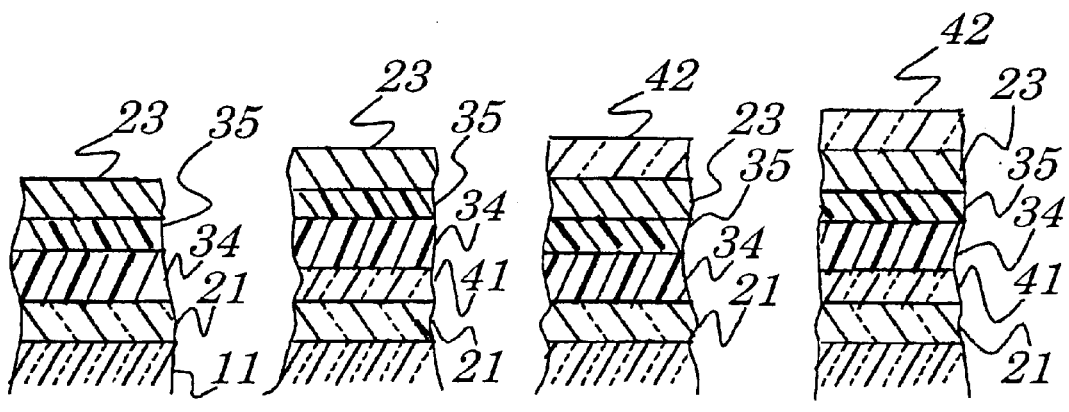
FIG. 7A  FIG. 7B  FIG. 7C  FIG. 7D
   
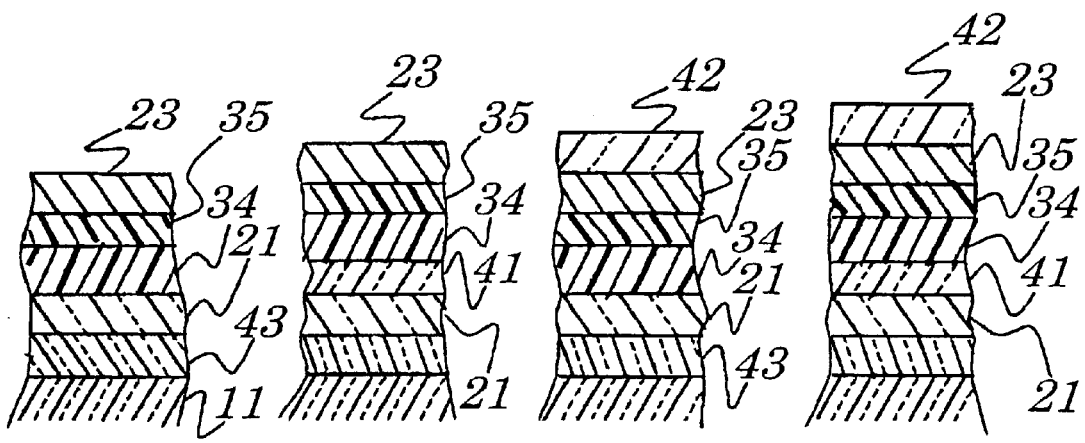
FIG. 7E  FIG. 7F  FIG. 7G  FIG. 7H

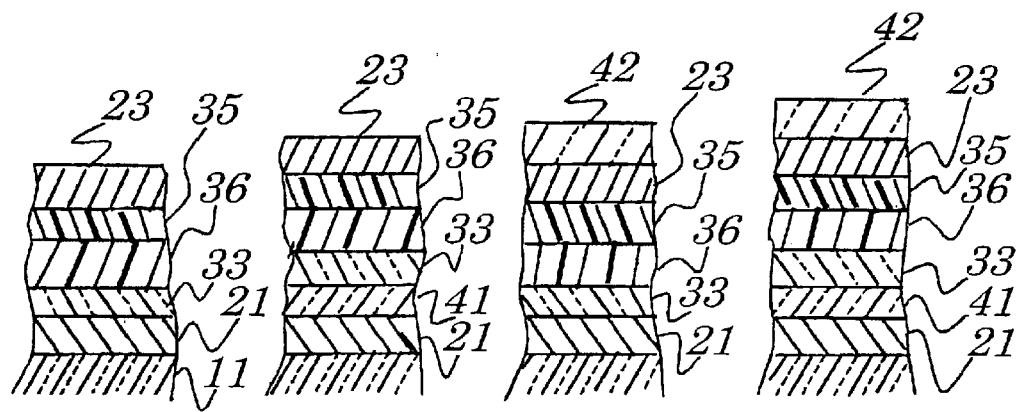
FIG.8A  FIG.8B  FIG.8C  FIG.8D
   
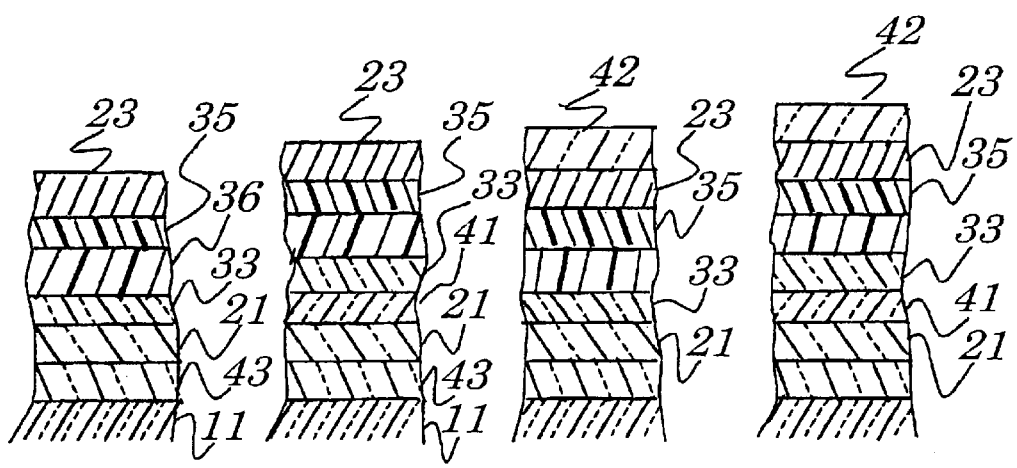
FIG.8E  FIG.8F  FIG.8G  FIG.8H

LIGHT EMITTING BODY, LIGHT EMITTING ELEMENT AND LIGHT EMITTING DISPLAY DEVICE USING SAME

BACKGROUND OF THE INVENTION

1. Field of the Invention

The present invention relates to a light emitting body, light emitting element and light emitting display device using the same and more particularly to the light emitting body and light emitting element which can secure practical light emission lasting time and to the light emitting display device using the light emitting body and light emitting element.

The present application claims priority of Japanese Patent Application No.2001-051410 filed on Feb. 27, 2001, which is hereby incorporated by reference.

2. Description of the Related Art

Generally, as a self-emitting body used for a display device, a field mission device and an electroluminescence (EL) device are available. The EL device can be classified into two types of devices, one being an organic EL device using an organic material as a light emitting layer and another being an inorganic EL device using an inorganic material as the light emitting layer.

The organic EL device is generally made up of an anode, a cathode and a super-thin film organic EL layer made of an organic light emitting compound and being sandwiched between the anode and the cathode. When a voltage is applied between the anode and cathode, a hole is injected from the anode into the organic EL layer and an electron is injected from the cathode into the organic EL layer where the hole and electron are re-bonded to each other. By energy occurring at this time, a molecule in the organic light emitting compound making up the organic EL layer is excited. A light emitting phenomenon occurs when the excited molecule is deactivated while being put into a ground state. The organic EL device is a light emitting body using this light emitting phenomenon.

The organic EL layer has a single-layer structure or a multi-layer structure including an organic layer called a light emitting layer in which light is emitted when the hole and electron are re-bonded together and at least one layer out of an organic layer called a hole transporting layer where the hole is easily injected into the organic EL layer and the electron is not easily moved therein and an organic layer called an electron transporting layer where the electron is easily injected into the EL layer and the hole is not easily moved therein.

In recent years, the organic EL device is under rapid development and becomes commercially practical. Such the organic El device is basically constructed so that a thin film made of a hole injecting material such as triphenyldiamine (TPO) or a like is grown, by a deposition method, on a transparent electrode (serving as a hole injecting electrode, that is, as an anode) made from indium tin oxide (ITO) or a like and then on the thin film is formed, in a stacked manner, a light emitting layer made from a fluorescent substance such as alumi-quinolinol complex ($Alq_3$) or a like and on the light emitting layer is further formed a metal electrode (serving as an electron injecting electrode, that is, as a cathode) using such as silver (Ag), magnesium (Mg), or a like which provides a small work function. Such the organic EL device can provide very high luminance of hundreds $cd/m^2$ to ten-thousands $cd/m^2$ by application of a voltage as low as about 10 V, it is expected to be used in electrical components and/or display devices for household electrical appliance, automobiles, two-wheelers, airplanes, or a like. In such the above organic EL device, for example, an organic layer serving as a light emitting layer is put between a scanning (common line) electrode serving as the electron injecting electrode and a data (segment line) electrode serving as the hole injecting electrode, that is, the transparent electrode.

Moreover, the display device using the organic EL device described above can be roughly classified into two types of display devices, one being a matrix-type display device and another being a segment-type display device. In the matrix-type display device, a dot-matrix display is performed by arranging the scanning electrode and data electrode in a matrix form in which information such as an image, character or a like is displayed in a form of an aggregate of pixels made up of dots. In the segment-type display device, a predetermined content for a specified purpose is displayed as an individual and independent display unit having a predetermined shape and size. The segment-type display can be operated by a static driving method to cause the display unit to display individually and separately, however, the dot-matrix display device has to be operated by a dynamic driving method which causes each of the data lines and scanning lines to be driven in a timeshared manner.

The light emitting body making up a light emitting element portion in the organic EL device can be also classified into two types of light emitting bodies, one being a substrate surface light emitting body type and another being a film surface light emitting body type. The substrate surface light emitting body, is so constructed that a transparent electrode is formed on a transparent substrate and a light emitting layer is formed on the transparent electrode and a metal electrode is further formed on the light emitting layer and that light produced in the light emitting layer is transmitted and transferred through the transparent electrode and the transparent substrate to an outside. On the other hand, the film surface light emitting body is so constructed that a metal electrode is formed on a substrate and a light emitting layer is formed on the metal electrode and a transparent electrode is further formed on the light emitting layer and that light produced in the light emitting layer is transmitted and transferred through the transparent electrode and then from a side of a film being placed opposite to a surface of the substrate to the outside. An example of the substrate surface light emitting body is disclosed in a collection of articles titled "Appl. Phys. Lett., No. 51, pp. 913–915 (1987)". An example of the film surface light emitting body is disclosed in the "Appl. Phys. Lett., No.65, pp. 2636–2638 (1994)".

However, a fluorescent organic body used as a material for the light emitting layer in the conventional organic EL device used as the light emitting body or light emitting element is susceptible to moisture, oxygen, or a like. Moreover, a characteristic of the conventional electrode (hereinafter being called a facing electrode) being placed directly on the light emitting layer or with a hole injecting layer or an electron injecting layer being interposed between the light emitting layer and the facing electrode is easily deteriorated by oxidation. Because of this, when the conventional organic EL device is operated in the atmosphere, a characteristic of its light emission is rapidly deteriorated. If oxygen or moisture exists in the vicinity of the conventional organic EL device, organic materials are deteriorated easily by oxidation which causes peeling of the film and growth of a dark spot (non-emitting portion) and, as a result, a phenomenon with which no light is emitted occurs. This presents a problem in that a life of the organic EL device is shortened.

Therefore, in order to obtain a practical organic EL device, some improvements are necessary so that moisture or oxygen does not invade its light emitting layer and so that its facing electrodes are not oxidized.

To solve this problem, a method of encapsulating the organic EL device to seal out the oxygen is disclosed in, for example, Japanese Patent Application Laid-open No. Hei 5-182759, in which an organic EL device is covered with a moisture-resistant light curing resin layer and with a small and low water-permeable substrate being adhered on an upper portion of the light curing resin layer. Another method for encapsulating an organic EL device is disclosed in Japanese Patent Application Laid-open No. Hei 5-41281 in which the organic EL device is put into an inert liquid produced by using a fluorocarbon oil containing a dehydrating agent such as a synthetic zeolite. Still another method of encapsulating an organic EL device is disclosed in Japanese Patent No. 2800813 in which the organic EL device is coated with a fluorine polymer protecting layer on which a sealing portion having a cap structure and being filled with an inert medium is further formed.

However, only by applying such the encapsulating technologies as described above, it is impossible to completely remove moisture and/or oxygen existing in the vicinity of an organic EL device. As a result, it is difficult to secure a sufficient light emitting life of the conventional organic EL device. Another problem is that, if such the conventional method of encapsulating technology is employed, an increase in a thickness of a display device itself using such the organic EL device is inevitable due to an additionally attached sealing material. It is therefore desirous that long light emission lasting time is secured without pig using such the process of encapsulation of the organic EL device.

SUMMARY OF THE INVENTION

In view of the above, it is an object of the present invention to provide a light emitting body, light emitting element and light emitting display device making up an organic EL device using the same which are capable of securing longer light emission lasting time by using a process of encapsulation and of securing practical long light emission lasting time even without use of processes of the encapsulation.

According to a first aspect of the present invention, there is provided a light emitting body including:
a substrate;
a transparent electrode;
a light emitting material;
an upper electrode;
wherein the transparent electrode is formed on the substrate and the light emitting material and the upper electrode are formed in order on the transparent electrode;
wherein the transparent electrode is made up of a mixture of an oxide of indium with tin having a structural formula of "$In_{2-x}Sn_xO_{3-y}$" as a chief component and a value of the "y" is set to be within a range between not less than 0.05 and not more than 0.2.

According to a second aspect of the present invention, there is provided a light emitting body including:
a substrate;
a transparent electrode;
a light emitting material;
a lower electrode;
wherein the lower electrode is formed on the substrate and the light emitting material and the transparent electrode are formed in order on the lower electrode; and
wherein the transparent electrode is made up of a mixture of an oxide of indium with tin having a structural formula of "$In_{2-x}Sn_xO_{3-y}$" as a chief component and a value of the "y" is set to be within a range between not less than 0.05 and not more than 0.2.

In the foregoing, a preferable mode is one wherein a layer made of a hygroscopic material is formed adjacent to the transparent electrode.

Also, a preferable mode is one wherein a light emitting element portion includes a layer of the transparent electrode, a layer of the light emitting material and a layer of the upper/lower electrode is an electroluminescence device.

Another preferable mode is one wherein the electroluminescence device using an organic material as the light emitting material has a structure in which light is emitted from a thin film made of the organic material when a current is fed to the thin film.

Also, a preferable mode is one wherein a hole injecting layer is formed between the layer of the transparent electrode and the layer of the light emitting material.

Also, a preferable mode is one wherein an electron transporting layer is formed between the layer of the light emitting material and the layer of the upper/lower electrode.

Also, a preferable mode is one that wherein using the light Ad emitting body according to the first aspect or the second aspect as light emitting element, includes three groups of the light emitting elements including a first light emitting element group, a second light emitting element group and a third light emitting element group, each being independently stacked and each being made up of at least one of the light emitting elements and each being placed in juxtaposition in a plane manner on a substrate wherein the first light emitting element group emits light at a wavelength region for a red color, the second light emitting element group emits light at a wavelength region for a green color and the third light emitting element group emits light at a wavelength region for a blue color.

Also, a preferable mode is one wherein each of the light emitting groups is so configured that light is emitted simultaneously at each of wavelength regions for red, green and blue colors.

Also, a preferable mode is one wherein mixed color light is emitted which contains light in blue, red and green colors produced by each of the plurality of light emitting element groups being placed in juxtaposition in a plane manner on the substrate.

According to a third aspect of the present invention, there is provided a light emitting element portion using as light emitting element the light emitting body according to the first aspect or the second aspect including the layer of the transparent electrode, the layer of the light emitting material and the layer of the upper electrode, the light emitting element portion including the light emitting element and current supplying element used to be connected electrically and feed a current to the light emitting element.

In the foregoing, a preferable mode is one that wherein further includes a switching element connected to the current supplying element which has a function to judge whether or not a current is to be fed to the light emitting element including the layer of the transparent electrode, the layer of the light emitting material, and the layer of the upper electrode.

Also, a preferable mode is one that wherein further includes wirings connected to the current supplying element and used to feed a current to the current supplying element and wirings to supply voltage information about an ON/OFF state to the switching element.

According to a fourth aspect of the present invention, there is provided a light emitting display device having a plurality of the light emitting element portions according to the third aspect, wherein the wirings to feed a current to the current supplying element and wirings to supply voltage information about an ON/OFF state to the switching element are arranged in a matrix form.

With the above configurations, by using a substance "$In_{2-x}Sn_xO_{3-y}$" as a material for a transparent electrode layer making up a stacked light emitting body and by setting a value "y" to be within a range of 0.06 to 0.2, it is possible to secure a light emission lasting time that can be used practically, that is, to obtain a light emitting body and light emitting element that can improve their light emission life and a light emitting display device using the light emitting body and light emitting element.

With another configuration as above, by using a method of encapsulating the light emitting body and light emitting element, it is possible to lengthen the light emission lasting time and, even without using the encapsulating method, obtain the organic EL device that can provide long light emission lasting time that can be commercially used and a display device using the organic EL device.

BRIEF DESCRIPTION OF THE DRAWINGS

The above and other objects, advantages, and features of the present invention will be more apparent from the following description taken in conjunction with the accompanying drawings in which:

FIGS. 1A to 1H are cross-sectional views partially illustrating various types of layer structures of a light emitting body according to a first embodiment of the present invention;

FIGS. 2A to 2H are cross-sectional views partially illustrating various types of layer structures of the light emitting body according to the first embodiment;

FIGS. 3A to 3H are cross-sectional views partially illustrating various types of layer structures of the light emitting body according to the first embodiment of the present invention;

FIGS. 5A to 5H are cross-sectional views partially illustrating various types of layer structures of a light emitting body according to a second embodiment of the present invention;

FIGS. 6A to 6H are cross-sectional views partially illustrating various types of layer structures of the light emitting body of the second embodiment of the present invention;

FIGS. 7A to 7H are cross-sectional views partially illustrating various types of layer structures of the light emitting body according to the second embodiment of the present invention;

FIGS. 8A to 8H are cross-sectional views partially illustrating various types of layer structures of the light emitting body of the second embodiment of the present invention;

FIG. 27A is a cross-sectional view of a group of other light emitting elements and FIG. 26B is a plan view conceptually illustrating the group of the other light emitting elements according to the sixth embodiment of the present invention;

DETAILED DESCRIPTION OF THE PREFERRED EMBODIMENTS

Figures 4A, 4B, 4C, 4D:
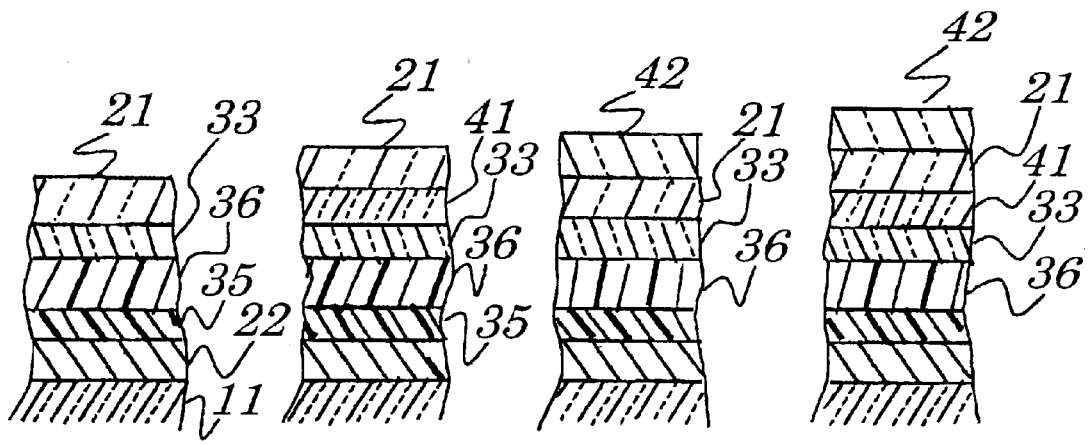
FIGS. 4A to 4H are cross-sectional views partially illustrating various types of layer structures of the light emitting body according to the first embodiment of the present invention.

Best modes of carrying out the present invention will be described in further detail using various embodiments with reference to the accompanying drawings.

First Embodiment

A layer structure of a light emitting body will be described by referring to FIGS. 1A to 4H. FIGS. 1A to 1H are cross-sectional views partially illustrating various types of layer structures of the light emitting body according to a first embodiment of the present invention. FIGS. 2A to 2H are also cross-sectional views partially illustrating various types of layer structure of the light emitting body according to the first embodiment. FIGS. 3A to 3H are cross-sectional views partially illustrating various types of layer structures of the light emitting body according to the first embodiment. FIGS. 4A to 4H are cross-sectional views partially illustrating various types of layer structures of the light emitting body according to the first embodiment. Each size of the layer shown in each of the drawings and each hatch pattern illustrated in each of the drawings are only to provide positional relations in the layer and which are provided just for reference. Moreover, even in the case of an electrode having no layer structure, since it has overlapped portions forming a layer in some cases, such the electrode is expressed by adding a word of a "layer" to the electrode. The light emitting body shown in FIGS. 1A to 4H is of the type of the film surface light emitting body in which light is emitted toward an upper direction on the substrate 11 and a display can be seen from a direction of an upper side of the layers stacked on the substrate 11 to a direction of its downward side.

The light emitting body shown in FIG. 1A is so constructed that a lower electrode layer 22 is formed on the substrate 11 and a light emitting layer 31 serving also as a hole injecting layer and an electron injecting layer is formed on the lower electrode layer 22 and then a transparent electrode layer 21 is formed on the light emitting layer 31. The light emitting layer 31 corresponds to the light emitting material layer described above. As a material for the transparent electrode layer 21, a substance $In_{2-x}Sn_xO_{3-y}$ ($0.05 \leq y \leq 0.2$) is used which contains a mixture of an oxide of indium with tin as a chief component.

In FIG. 1B, an anode buffer layer 41 is additionally formed between the light emitting layer 31 and the transparent electrode layer 21. Also, in FIG. 1C, a protecting layer 42 is formed further on the stacked layers shown in FIG. 1A. Also, in FIG. 1D, a protecting layer 42 is formed further on the stacked layers shown in FIG. 1B. In FIGS. 1E, 1F, 1G, and 1H, a hygroscopicity enhancing layer 43 is formed on an upper surface of the transparent electrode layer 21 shown, respectively, in FIGS. 1A, 1B, 1C, and 1D. Therefore, in FIGS. 1G and 1H, the hygroscopicity enhancing layer 43 is interposed between the transparent electrode layer 21 and the protecting layer 42.

In FIG. 2A, on the substrate 11 are formed, in order, the lower electrode layer 22, a light emitting layer 32 also serving as an electron transporting layer, a hole injecting layer 33, and the transparent electrode layer 21. In this case, the light emitting layer 32 and hole injecting layer 33 correspond to the light emitting material layer described above. Other configurations are the same as in the case shown in FIG. 1A.

In FIG. 2B, the anode buffer layer 41 is formed between the light emitting layer 32 and the transparent electrode layer 21. In FIG. 2C, the protecting layer 42 is formed on the stacked layers shown in FIG. 2A. In FIG. 2D, the protecting layer 42 is formed on the stacked layers shown in FIG. 2B. In FIG. 2E, the hygroscopicity enhancing layer 43 is formed on the transparent electrode layer 21 shown in FIG. 1A. Similarly, in FIGS. 2F, 2G, and 2H, the hygroscopicity enhancing layer 43 is formed on the transparent electrode layer 21 shown in, respectively, FIGS. 2B, 2C, and 2D. Therefore, in FIGS. 2G and 2H, the hygroscopicity enhancing layer 43 is interposed between the transparent electrode layer 21 and the protecting layer 42.

In FIG. 3A, on the substrate 11 are formed, in order, the lower electrode layer 22, an electron transporting layer 35, a light emitting layer 34 also serving as the hole injecting layer and the transparent electrode layer 21. In this case, the electron transporting layer 35 and the light emitting layer 34 correspond to the light emitting material layer described above. Other configurations are the same as in the case shown in FIG. 1A.

In FIG. 3B, the anode buffer layer 41 is formed between the light emitting layer 34 and the transparent electrode layer 21. In FIG. 3C, the protecting layer 42 is formed on the stacked layers shown in FIG. 3A. In FIG. 3D, the protecting layer 42 is formed on the stacked layers shown in FIG. 3B. In FIG. 3E, the hygroscopicity enhancing layer 43 is formed on the transparent electrode layer 21 shown in FIG. 3A. Similarly, in FIGS. 3F, 3G, and 3H, the hygroscopicity enhancing layer 43 is formed on, the transparent electrode layer 21 shown in, respectively, FIGS. 3B, 3C, and 3D. Therefore, in FIGS. 3G and 3H, the hygroscopicity enhancing layer 43 is interposed between the transparent electrode layer 21 and the protecting layer 42.

In FIG. 4A, on the substrate 11 are formed, in order, the lower electrode layer 22, the electron transporting layer 35, a light emitting layer 36 being a single layer not being multifunctional, the hole injecting layer 33, and the transparent electrode layer 21. In this case, the electron transporting layer 35, hole injecting layer 33 and light emitting layer 36 correspond to the light emitting material layer described above. Other configurations are the same as in the case shown in FIG. 1A.

Figures 4E, 4F, 4G, 4H:
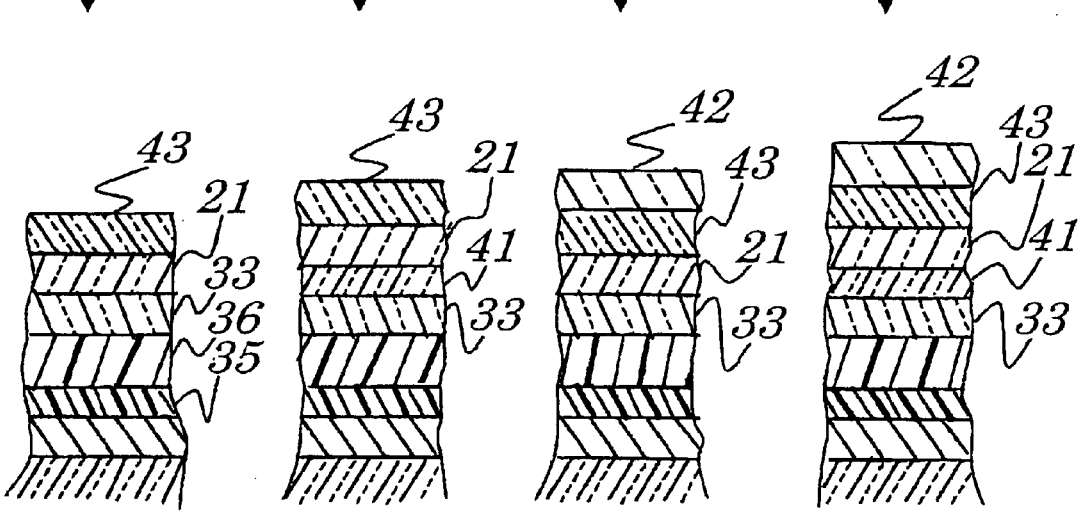

In FIG. 4B, the anode buffer layer 41 is formed between the light emitting layer 36 and the transparent electrode layer 21. In FIG. 4C, the protecting layer 42 is formed on the stacked layers shown in FIG. 4A. In FIG. 4D, the protecting layer 42 is formed on the stacked layers shown in FIG. 4B. In FIG. 4E, the hygroscopicity enhancing layer 43 is formed on the transparent electrode layer 21 shown in FIG. 4A. Similarly, in FIGS. 4F, 4G, and 4H, the hygroscopicity enhancing layer 43 is formed on the transparent electrode layer 21 shown in, respectively, FIGS. 4B, 4C, and 4D. Therefore, in FIGS. 4G and 4H, the hygroscopicity enhancing layer 43 is interposed between the transparent electrode layer 21 and the protecting layer 42.

Second Embodiment

A layer structure of a light emitting body of a second embodiment will be described by referring to FIGS. 5A to 8H. FIGS. 5A to 5H are cross-sectional views partially illustrating various types of layer structures of the light emitting body according to the second embodiment of the present invention. FIGS. 6A to 6H are cross-sectional views partially illustrating various types of layer structures of the light emitting body of the second embodiment. FIGS. 7A to 7H are cross-sectional views partially illustrating various types of layer structures of the light emitting body according to the second embodiment. FIGS. 8A to 8H are cross-sectional views partially illustrating various types of layer structures of the light emitting body of the second embodiment. The light emitting body shown in FIGS. 5A to 5H to FIGS. 8A to 8H is of the type of the substrate surface light emitting body in which light is emitted toward a downward direction on a substrate 11 and a display can be seen from a direction of a lower side of the layers stacked on the substrate 11 made of, for example, glass.

In FIG. 5A, the light emitting body is so constructed that a transparent electrode layer 21 is formed on the substrate 11 and a light emitting layer 31 serving also as a hole injecting layer and an electron injecting layer is formed on the transparent electrode layer 21 and an upper electrode layer 23 is formed on the light emitting layer 31. In this case, the light emitting layer 31 also serving as the hole injecting layer and electron transporting layer corresponds to the light emitting material layer described above. Configuration of the transparent electrode layer 21 is same as that shown in FIGS. 1A to 1H and its description is omitted accordingly.

In FIG. 5B, an anode buffer layer 41 is formed between the light emitting layer 31 and the transparent electrode layer 21. In FIG. 5C, a protecting layer 42 is formed on the stacked layers shown in FIG. 5A. In FIG. 5D, the protecting layer 42 is formed on the stacked layers shown in FIG. 5B. In FIG. 5E, the hygroscopicity enhancing layer 43 is formed under the transparent electrode layer 21 shown in FIG. 5A. Similarly, in FIGS. 5F, 5G, and 5H, the hygroscopicity enhancing layer 43 is formed under the transparent electrode layer 21 shown in, respectively, FIGS. 5B, 5C, and 5D. Therefore, in FIGS. 5E to 5H, the hygroscopicity enhancing layer 43 is interposed between the transparent electrode layer 21 and the substrate 11.

In FIG. 6A, on the substrate 11 are formed in order the transparent electrode layer 21, the hole injecting layer 33, a light emitting layer 32 also serving as an electron transporting layer, and the upper electrode layer 23. In this case, the light emitting layer 32 also serving as the electron transporting layer corresponds to the light emitting material layer described above. Configuration of the transparent electrode layer 21 is same as that shown in FIGS. 1A to 1H and its description is omitted accordingly.

In FIG. 6B, the anode buffer layer 41 is formed between the hole injecting layer 33 and the transparent electrode layer 21. In FIG. 6C, a protecting layer 42 is formed on the stacked layers shown in FIG. 6A. In FIG. 6D, the protecting layer 42 is formed on the stacked layers shown in FIG. 6B. In FIG. 6E, a hygroscopicity enhancing layer 43 is formed under the transparent electrode layer 21 shown in FIG. 5A. Similarly, in FIGS. 6F, 6G and 6H, the hygroscopicity enhancing layer 43 is formed under the transparent electrode layer 21 shown in, respectively, FIGS. 6B, 6C, and 6D. Therefore, in FIGS. 6E to 6H, the hygroscopicity enhancing layer 43 is interposed between the transparent electrode layer 21 and the substrate 11.

In FIG. 7A, on the substrate 11 are formed the transparent electrode layer 21, a light emitting layer 34 also serving as the hole injecting layer, and the upper electrode layer 23. In this case, the light emitting layer 32 also serving as the hole injecting corresponds to the light emitting material layer described above. Configuration of the transparent electrode layer 21 is the same as that shown in FIGS. 1A to 1H and its description is omitted accordingly.

In FIG. 7B, an anode buffer layer 41 is formed between the light emitting layer 34 and the transparent electrode layer 21. In FIG. 7C, the protecting layer 42 is formed on the stacked layers shown in FIG. 7A. In FIG. 7D, the protecting layer 42 is formed on the stacked layers shown in FIG. 7B. In FIG. 7E, the hygroscopicity enhancing layer 43 is formed under the transparent electrode layer 21 shown in FIG. 7A. Similarly, in FIGS. 7F, 7G, and 7H, the hygroscopicity enhancing layer 43 is formed under the transparent electrode layer 21 shown in, respectively, FIGS. 7B, 7C, and 7D. Therefore, in FIGS. 7E to 7H, the hygroscopicity enhancing layer 43 is interposed between the transparent electrode layer 21 and the substrate 11.

In FIG. 8A, on the substrate 11 are formed in order the transparent electrode layer 21, a hole injecting layer 33, a single light emitting layer 36, the electron transporting layer 35, and the upper electrode layer 23. In this case, the light emitting layer 36 corresponds to the light emitting material layer. Configuration of the transparent electrode layer 21 is the same as that shown in FIGS. 1A to 1H and its description is omitted accordingly.

In FIG. 8B, an anode buffer layer 41 is formed between the hole injecting layer 33 and the transparent electrode layer 21. In FIG. 8C, a protecting layer 42 is formed on the stacked layers shown in FIG. 8A. In FIG. 8D, the protecting layer 42 is formed on the stacked layers shown in FIG. 8B. In FIG. 8E, the hygroscopicity enhancing layer 43 is formed under the transparent electrode layer 21 shown in FIG. 8A. Similarly, in FIGS. 8F, 8G, and 8H, the hygroscopicity enhancing layer 43 is formed under the transparent electrode layer 21 shown in, respectively, FIGS. 8B, 8C, and 8D. Therefore, in FIGS. 8E to 8H, the hygroscopicity enhancing layer 43 is interposed between the transparent electrode layer 21 and the substrate 11.

Third Embodiment

Figure 9A:
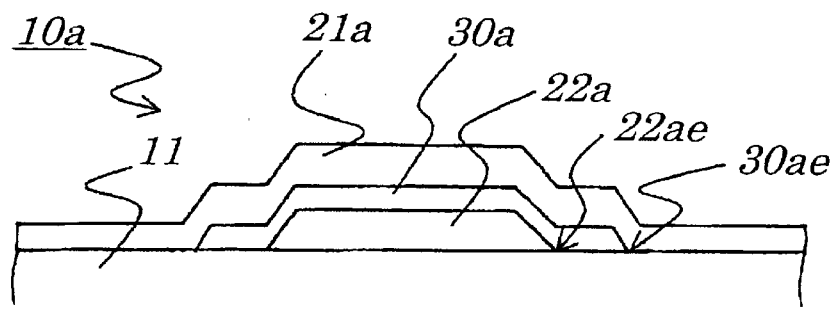
FIGS. 9A and 9C are cross-sectional views illustrating configurations of a light emitting body and FIG. 9B is a plan view of the light emitting body according to a third embodiment of the present invention.
Figure 9B:
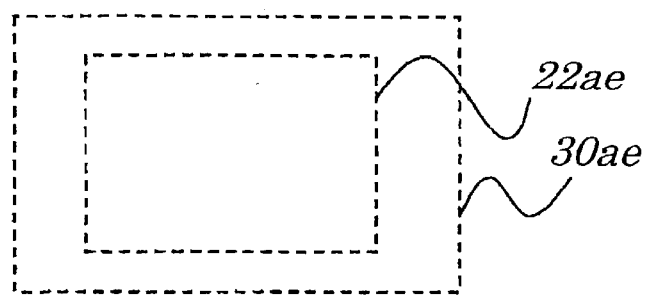
Figure 9C:
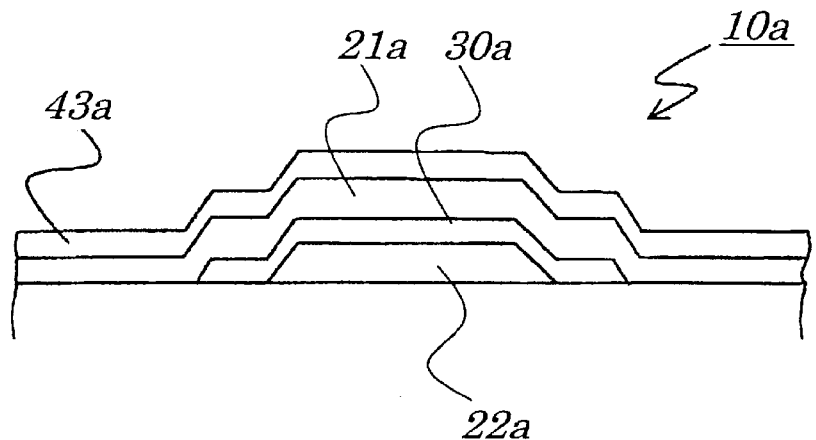
Figure 10A:
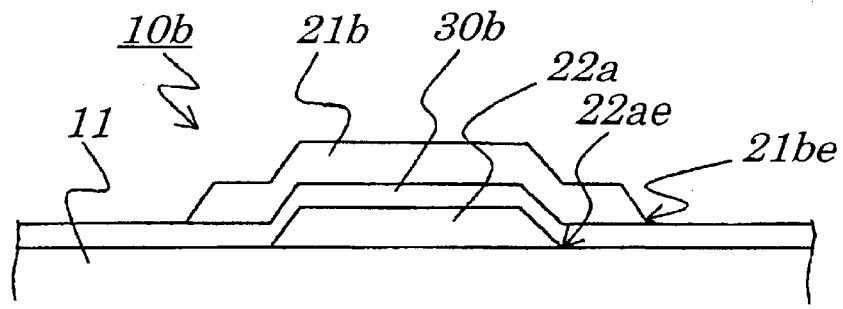
FIGS. 10A and 10C are cross-sectional views illustrating configurations of the light emitting body and FIG. 10B is a plan view of the light emitting body according to the third embodiment of the present invention.
Figure 10B:
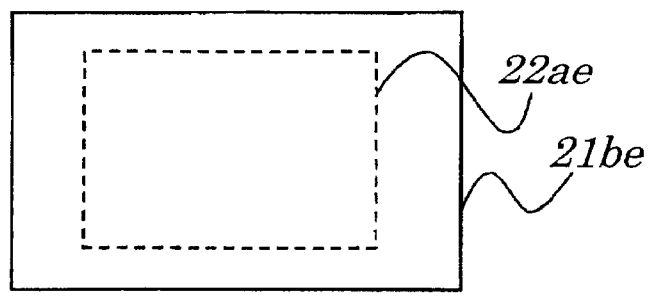
Figure 10C:
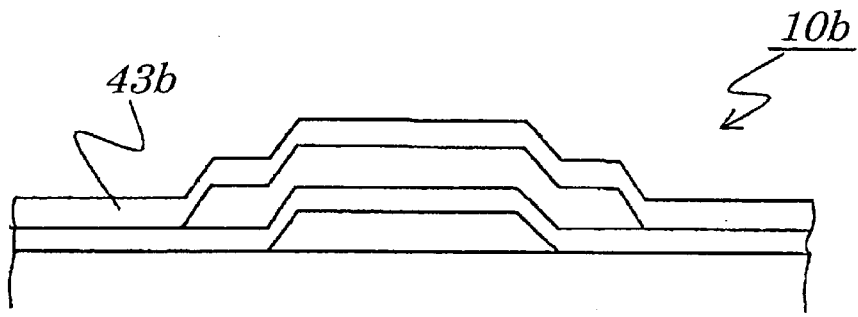
Figure 11A:
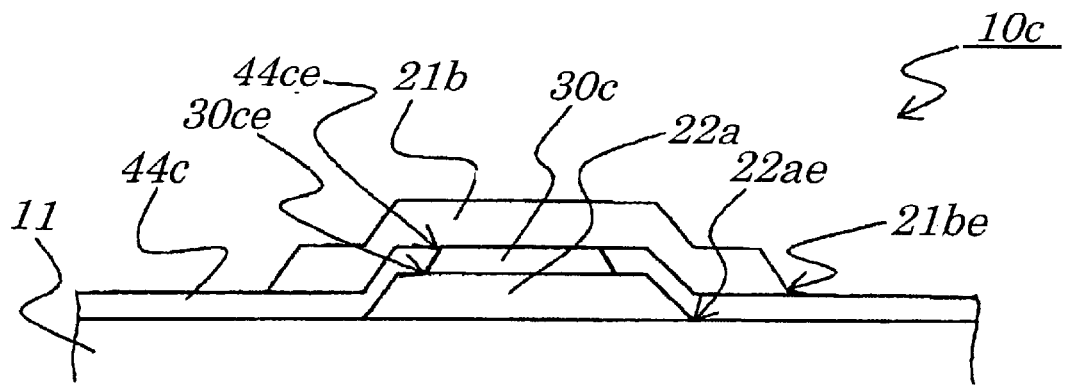
FIGS. 11A and 11C are cross-sectional views illustrating configurations of the light emitting body and FIG. 11B is a plan view of the light emitting body according to the third embodiment of the present invention.
Figure 11B:
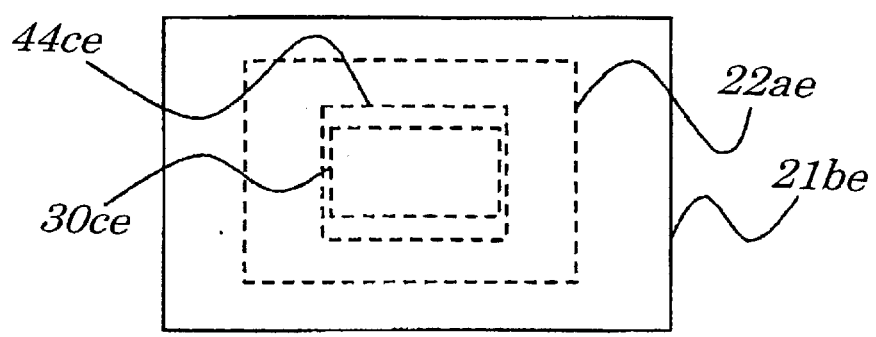
Figure 11C:
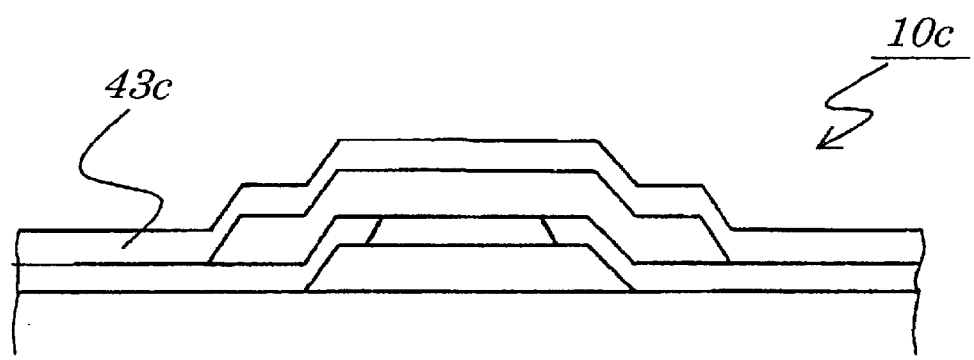
Figure 12A:
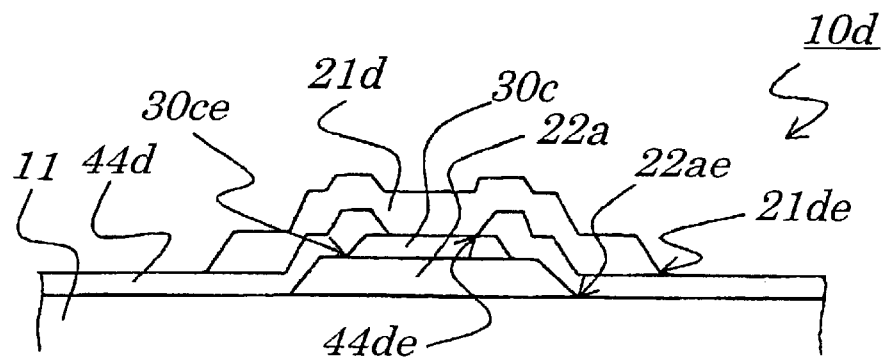
FIGS. 12A and 12C are cross-sectional views illustrating configurations of the light emitting body and FIG. 12B is a plan view of the light emitting body according to the third embodiment of the present invention.
Figure 12B:
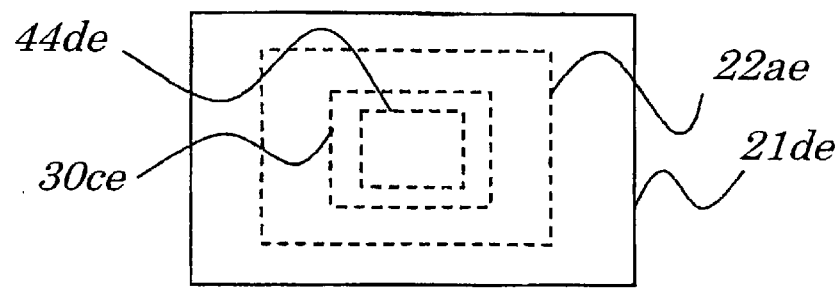
Figure 12C:
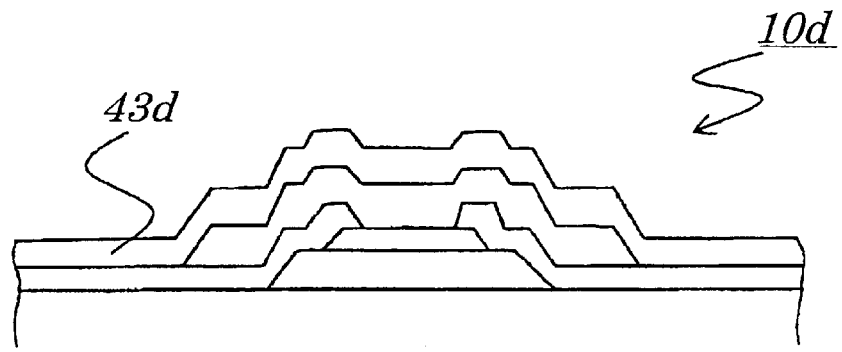
Figure 13A:
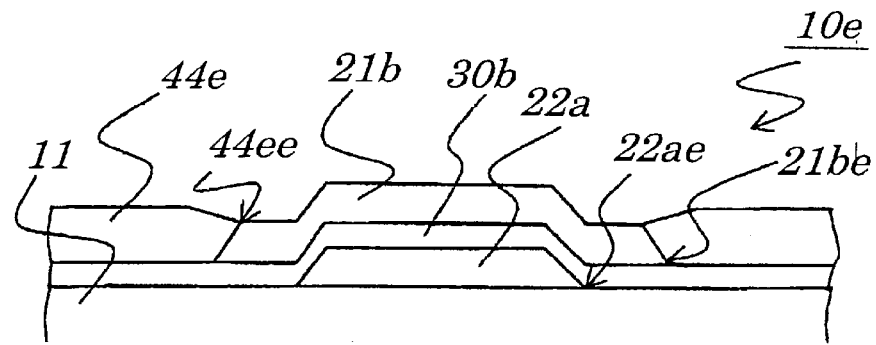
FIGS. 13A and 13C are cross-sectional views illustrating configurations of the light emitting body and FIG. 13B is a plan view of the light emitting body according to the third embodiment of the present invention.
Figure 13B:
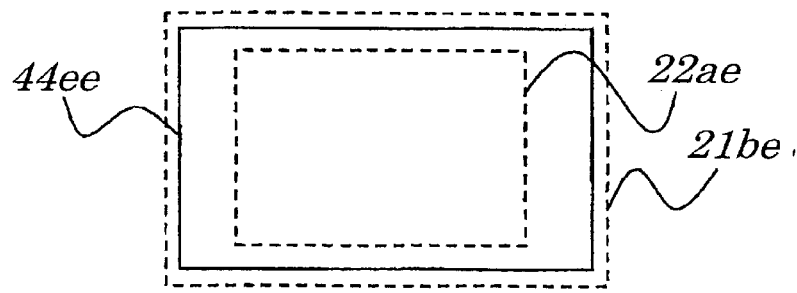
Figure 13C:
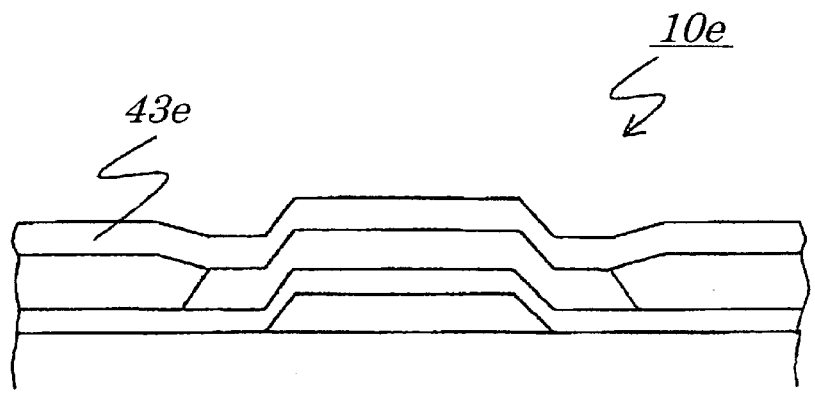
Figure 14A:
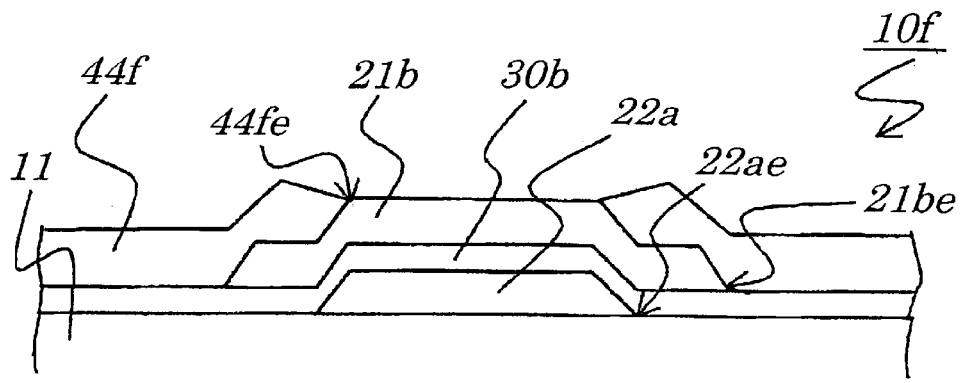
FIGS. 14A and 14C are cross-sectional views illustrating configurations of the light emitting body and FIG. 14B is a plan view of the light emitting body according to the third embodiment of the present invention.
Figure 14B:
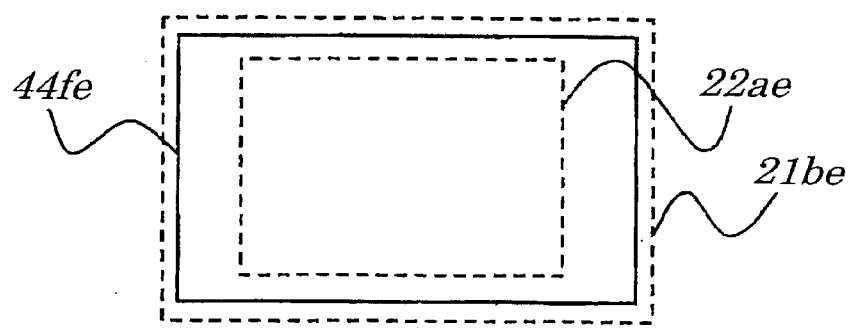
Figure 14C:
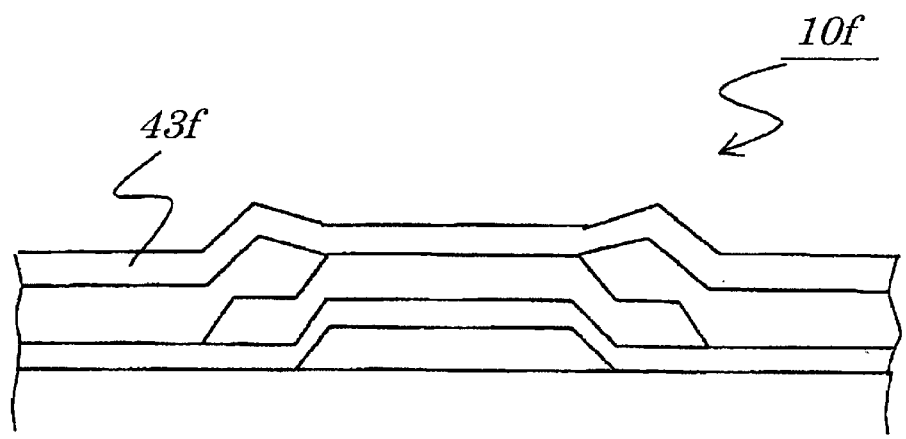

Configurations of a light emitting body of a third embodiment of the present invention will be described by referring to FIGS. 9A to 14C. FIGS. 9A and 9C are cross-sectional views illustrating configurations of the light emitting body and FIG. 9B is a plan view of the light emitting body according to the third embodiment. FIGS. 10A and 10C are cross-sectional views illustrating configurations of the light emitting body and FIG. 10B is a plan view of the light emitting body according to the third embodiment. FIGS. 11A and 11C are cross-sectional views illustrating It configurations of the light emitting body and FIG. 11B is a plan view of the light emitting body according to the third embodiment. FIGS. 12A and 12C are cross-sectional views illustrating configurations of the light emitting body and FIG. 12B is a plan view of the light emitting body according to the third embodiment. FIGS. 13A and 13C are cross-sectional views illustrating configurations of the light emitting body and FIG. 13B is a plan view of the light emitting body according to the third embodiment. FIGS. 14A and 14C are cross-sectional views illustrating configurations of the light emitting body and FIG. 14B is a plan view of the light emitting body according to the third embodiment. Each size of the layer shown in each of the drawings and each pattern illustrated in each of the drawings are only to provide positional relations in the layer and which are provided just for reference. In FIGS. 9A to 14C, same reference numbers are assigned to components having same functions or configurations or being made from same materials as those in FIG. 1A to FIG. 8H. If a component in FIG. 9A to FIG. 14C is made from the same material and the same function as that in FIG. 1A to FIG. 8H but has a shape different from that in FIG. 1A to FIG. 8H, suffixes "a" to "f" are added to a same numerical number assigned to each of the components in FIG. 9A to FIG. 14C. Also, a second suffix "e" is additionally assigned to the above number having the first suffix to express an end portion of each of layers in plan views shown in FIGS. 9B, 10B, 11B, 12B, 13B and 14B.

Moreover, as described later, a plurality of the light emitting bodies is formed on a substrate. The substrate is a base body on which the plurality of the light emitting bodies and other films or elements are formed. As in the above embodiments, even in the case of an electrode having no layer structure, since it has overlapped portions forming the layer in some cases, such the electrode is expressed by adding a word of a "layer" to the electrode.

The light emitting bodies 10a to 10f shown in FIGS. 9A to 14C are of the type of the film surface light emitting body in which light is emitted toward an upper direction on the substrate 11 and a display can be seen from an upper side of the layers stacked on the substrate 11 to their downward side.

First, configurations of the light emitting body 10a will be described by referring to FIGS. 9A to 9C.

As shown in FIGS. 9A and 9B, a lower electrode layer 22a is formed on the substrate 11 by a patterning method. On the lower electrode layer 22a is formed a light emitting material layer 30a by the patterning method. The light emitting material layer 30a includes a material layer which emits light by application of a current and may also include either of an electron transporting layer or a hole injecting layer. A pattern for the light emitting material layer 30a is larger in size than that for the lower electrode layer 22a and covers all regions of the pattern for the lower electrode layer 22a. That is, an end portion 30ae of the light emitting material layer 30a is placed, in its all regions, outside of an end portion 22ae of the lower electrode layer 22a, as shown in FIG. 9B.

On the light emitting material layer 30a is formed a transparent electrode layer 21a by the patterning method. In FIG. 9A, a patterned configuration of the transparent electrode layer 21a is not shown, however, this means that its pattern is so large that it cannot be drawn in a range shown in FIG. 9A.

As a material for the transparent electrode layer 21a, as described in FIGS. 1A to 1H, the substance "$In_{2-x}Sn_xO_{3-y}$ ($0.05 \leq y \leq 0.2$)" is used which contains the mixture of the oxide of indium with tin as the chief component.

The substance $In_{2-x}Sn_xO_{3-y}$ ($0.05 \leq y \leq 0.2$) exhibiting hygroscopicity due to its oxygen-deficient characteristic is formed on all regions of the lower electrode layer 22a and the light emitting material layer 30a. Therefore, the substance $In_{2-x}Sn_xO_{3-y}$ ($0.05 \leq y \leq 0.2$) absorb a trace amount of moisture existing in the vicinity of the light emitting layer 30a, thus keeping the light emitting material away from the moisture.

In the embodiment, all regions of the lower electrode layer 22a are covered by the pattern for the light emitting material layer 30a, however, even if the lower electrode layer 22 is not partially covered by the light emitting material layer, the same effects obtained in the above embodiment can be achieved. Moreover, in the embodiment, all the pattern for the light emitting material layer 30a are covered by the pattern for the transparent electrode layer 21a, however, even if the pattern of the light emitting material layer 30a is not partially covered by the pattern for the transparent electrode layer, the same effects obtained above can be achieved.

Moreover, as shown in FIG. 9C, a hygroscopicity enhancing layer 43a may be formed on the transparent electrode layer 21a made from the substance "$In_{2-x}Sn_xO_{3-y}$ ($0.05 \leq y \leq 0.2$)". The hygroscopicity enhancing layer 43 can receive moisture absorbed by the transparent electrode layer 21a which can strongly keep the light emitting material away from the moisture. Moreover, in order to completely keep the lower electrode layer 22a or the light emitting material layer 30a from the moisture and/or oxygen in the atmosphere, as in the case shown in FIGS. 1C, 1D, 1G, and 1H, a protecting layer (not shown) may be formed on the transparent electrode layer 21a or on the hygroscopicity enhancing layer 43a.

Next, configurations of another light emitting body 10b of the present invention will be explained by referring to FIGS. 10A to 10C. First, as shown in FIG. 10A, a lower electrode layer 22a is formed on a substrate 11 by a patterning method as in the case shown in FIG. 9A. A pattern for the light emitting material layer 30b is larger in size than that for the lower electrode layer 22a and covers all regions of the pattern for the lower electrode layer 22a. However, unlike in the case shown in FIG. 9B, a pattern for the light emitting material layer 30b is large and its end portion is not placed within a size range shown in FIG. 10A. Moreover, on the light emitting layer 30b is formed a transparent electrode layer 21b by the patterning method. Also, unlike in the case shown in FIG. 9, a pattern for the transparent electrode layer 21b is smaller in size than that for the light emitting material layer 30b, however, it is larger in size than that for the lower electrode layer 22a and covers all regions of the pattern for the lower electrode layer 22a. That is, an end portion 22ae of the lower electrode 22a is placed within an end portion 21be of the transparent electrode layer 21a. As described above, as a material for the transparent electrode layer 21b, the substance "$In_{2-x}Sn_xO_{3-y}$ ($0.05 \leq y \leq 0.2$)" is used which contains the mixture of the oxide of indium with tin as the chief component.

The substance $In_{2-x}Sn_xO_{3-y}$ ($0.05 \leq y \leq 0.2$) exhibiting hygroscopicity due to its oxygen-deficient characteristic is formed on all regions of the patterns for the lower electrode layer 22a and for the light emitting material layer 30b. Here, a light emitting element portion is a part of the light emitting material layer 30b which is sandwiched between the lower electrode layer 22a and the transparent electrode layer 21b and in which light is emitted by application of a voltage between the lower electrode layer 22a and the transparent electrode layer 21b. In this case, it almost matches a portion being in contact with the lower electrode layer 22a out of the light emitting material layer 30b. The substance "$In_{2-x}Sn_xO_{3-y}$ ($0.05 \leq y \leq 0.2$)" absorbs even a trace amount of moisture existing in the vicinity of the light emitting element portion in the light emitting layer 30b, which can keep the light emitting material away from the moisture.

By configuring the light emitting body 10b as above, a precise patterning so that the pattern for the light emitting material layer 30b covers all the pattern of the lower electrode layer 22a and that, at the same time, the pattern for the light emitting material layer 30b is covered by the pattern of the transparent electrode layer 21b is not required, which makes it easier to manufacture the light emitting body 10b compared with the case shown in FIGS. 9A to 9C and which enables its manufacturing costs to be reduced. However, in a portion of the pattern for the light emitting material layer 30b which is not covered by the pattern of the transparent electrode layer 21b, the moisture cannot be absorbed by the transparent electrode layer 21b. Though this portion is located far from the light emitting element portion and has no direct bearing on the light emission, peeling of the light emitting material layer 30b occurs due to corrosion in the portion and a light emission characteristic of the light emitting body 10b is adversely affected in some cases. Therefore, it is desirous that a material for the light emitting layer which is resistant to moisture and/or oxygen is used.

In the example, all the regions of the pattern for the lower electrode layer 22a is covered by the pattern for the light emitting material layer 30b, however, even if the pattern for the lower electrode layer 22a is not partially covered by the pattern for the light emitting material layer 30b, the same effects as obtained above can be achieved. Moreover, in the example, all the regions of the pattern for the transparent electrode layer 21b are formed on the light emitting material layer 30b, however, even if a part of the pattern for the transparent electrode layer 21b is not formed on the pattern for the light emitting material layer 30b, the same effects as obtained above can be achieved.

As shown in FIG. 10C, a hygroscopicity enhancing layer 43b may be formed on the transparent electrode layer 21b made from the substance "$In_{2-x}Sn_xO_{3-y}$ ($0.05 \leq y \leq 0.2$)". Here, the hygroscopicity enhancing layer 43b serves to receive moisture absorbed by the transparent electrode layer 21b to keep the light emitting material layer 30b further away from the moisture.

Moreover, in order to completely keep the lower electrode layer 22a or the light emitting material layer 30b free of moisture and/or oxygen in the atmosphere, a protecting layer (not shown) may be formed on the transparent electrode layer 21b or on the hygroscopicity enhancing layer 43b, as in the case shown in FIG. 1A to FIG. 4H.

Next, configurations of another light emitting body 10c will be explained by referring to FIGS. 11A to 11C. As shown in FIG. 11A, a lower electrode layer 22a is formed on a substrate 11, as in the case shown in FIGS. 9A to 9C. A light emitting material layer 30c is formed on the lower electrode layer 22a by a patterning method. Unlike in the case shown in FIGS. 9A to 9C and in FIGS. 10A to 10C, a pattern for the light emitting material layer 30c is placed within a region of the pattern for the lower electrode layer 22a. As shown in FIG. 11B, an end portion 30ce of the light emitting material layer 30c is in contact with an end portion 44ce of an insulating layer 44c and a pattern of the insulating layer 44c covers an upper surface of the lower electrode layer 22a and an upper surface of the substrate 11. On the pattern for the light emitting material layer 30c is formed a pattern of the transparent electrode layer 21b so as to have a same shape as shown in FIG. 10A. As in the above cases, as a material for the transparent electrode layer 21b, $In_{2-x}Sn_xO_{3-y}$ ($0.05 \leq y \leq 0.2$) is also used which contains a mixture of an oxide of indium with tin as a chief component.

In this example, the substance $In_{2-x}Sn_xO_{3-y}$ ($0.05 \leq y \leq 0.2$) exhibiting hygroscopicity due to its oxygen-deficient characteristic is formed on all the pattern for the lower electrode layer 22a and the pattern for the light emitting body layer 30c. Therefore, the substance $In_{2-x}Sn_xO_{3-y}$ ($0.05 \leq y \leq 0.2$) can absorb even a trace amount of moisture existing in the vicinity of the light emitting material layer 30c, thus keeping the light emitting material away from the moisture.

The light emitting body 10c is configured in a manner that the lower electrode layer 22a and the light emitting material layer 30c are buried partially in the insulating layer 44c and therefore an upper surface of the light emitting body 10c is made comparatively flat. However, since a new process of forming the insulating layer 44c has to be added, its manufacturing costs increase accordingly.

In this example, all regions of the pattern for the light emitting material layer 30c are placed on the pattern for the lower electrode layer 22a, however, even if a part of the pattern for the light emitting material layer 30c is not formed on the lower electrode layer 22a, the same effects as obtained above can be achieved. Moreover, also in this example, all the regions of the pattern for the light emitting material layer 30c are covered by the transparent electrode layer 21b, however, even if the pattern for the light emitting material layer 30c is not partially covered by the transparent electrode layer 21b, the same effects as described above can be achieved as well.

As shown in FIG. 1C, a hygroscopicity enhancing layer 43c may be formed on the transparent electrode layer 21b made from $In_{2-x}Sn_xO_{3-y}$ ($0.05 \leq y \leq 0.2$). Here, the hygroscopicity enhancing layer 43c serves to receive the moisture absorbed by the transparent electrode layer 21b to keep the light emitting material layer 30c further away from the moisture.

Moreover, in order to completely keep the lower electrode layer 22a or the light emitting material layer 30c free of moisture and/or oxygen in the atmosphere, a protecting layer (not shown) may be formed on the transparent electrode layer 21b or on the hygroscopicity enhancing layer 43b, as in the case shown in FIG. 1A to FIG. 4H.

Next, configurations of still another light emitting body 10d will be explained by referring to FIGS. 12A to 12C. The light emitting body 10d is a variation of the light emitting body 10c shown in FIGS. 11A to 11C. FIGS. 12A, 12B, and 12C correspond, respectively, to FIGS. 11A, 11B, and 12C. The light emitting body 10d differs from the above light emitting body 10c in that an end portion 44de of an insulating layer 44d is placed within an end portion 30ce of a light emitting material layer 30c, as shown in FIG. 12B. Thus, by providing a portion in which a pattern for the insulating layer 44d and a pattern for the light emitting material layer 30c overlap each other, it is possible to prevent a leakage current from occurring between a lower electrode layer 22a and a transparent electrode layer 21d caused by manufacturing errors. However, since the portion in which the pattern for the insulating layer 44d and the pattern for the light emitting material layer 30c overlap each other exists, flatness on an upper surface of the light emitting body 10d decreases compared with the case shown in FIGS. 11A to 11C.

Next, configurations of still another light emitting body 10e will be explained by referring to FIGS. 13A to 13C. The light emitting body 10e is a variation of the light emitting body 10b shown in FIGS. 10A to 10C. FIGS. 13A, 13B, and 13C correspond, respectively, to FIGS. 10A, 10B, and 10C. The light emitting body 10e differs from the above light emitting body 10b in that an insulating layer 44e is formed on a portion in which a light emitting material layer 30b is exposed.

That is, as in the case shown in FIGS. 10A to 10C, a pattern for the light emitting material layer 30b is formed on a lower electrode layer 22a grown on a substrate 11 so as to cover all regions of the lower electrode layer 22a. On the pattern for the light emitting material layer 30b is formed a pattern for a transparent electrode layer 21b so as to cover all surfaces of the lower electrode layer 22a.

However, in the light emitting body 10e, an end portion 21be of the transparent electrode layer 21b is placed so as to be in contact with an end portion 44ee of the insulating layer 44e on the pattern for the light emitting body 30b. As a result, though not shown in FIGS. 13A to 13C, the insulating layer 44e covers all exposed regions not covered by the pattern for the transparent electrode layer 21b on an upper surface of the light emitting material layer 30b. As in the above examples, as a material for the transparent electrode layer 21b, $In_{2-x}Sn_xO_{3-y}$ ($0.05 \leq y \leq 0.2$) is also used which contains the mixture of an oxide of indium with tin as the chief component.

In this example, the substance $In_{2-x}Sn_xO_{3-y}$ ($0.05 \leq y \leq 0.2$) exhibiting hygroscopicity due to its oxygen-deficient characteristic is formed on all the regions of the pattern for the lower electrode layer 22a and on all the regions not being covered by the pattern of the insulating layer 44e out of the pattern for the light emitting material layer 30b. Therefore, the substance $In_{2-x}Sn_xO_{3-y}$ ($0.05 \leq y \leq 0.2$) absorbs even a trace amount of moisture existing in the vicinity of the light emitting layer 30b, thus keeping the light emitting material away from moisture.

Also in this example, all the regions of the pattern for the lower electrode layer 22a are covered by the pattern for the light emitting material layer 30b, however, even if the pattern of the lower electrode layer 22a is not partially covered by the pattern for the light emitting material layer 30b, the same effects as described above can be achieved. Moreover, all the regions of the pattern for the transparent electrode layer 21b are formed on the pattern for the light emitting material layer 30b, however, even if the pattern for the transparent electrode layer 21b is not partially formed on the light emitting material layer 30b, the same effects as described above can be achieved.

As shown in FIG. 13C, a hygroscopicity enhancing layer 43e may be formed on the transparent electrode layer 21b made of the substance "$In_{2-x}Sn_xO_{3-y}$ ($0.05 \leq y \leq 0.2$)". Here, the hygroscopicity enhancing layer 43c serves to receive the moisture absorbed by the transparent electrode layer 21b and to keep the light emitting material further away from the moisture.

Moreover, in order to completely keep the lower electrode layer 22a or the light emitting material layer 30b free of moisture and/or oxygen in the atmosphere, a protecting layer (not shown) may be formed on the transparent electrode layer 21b or on the hygroscopicity enhancing layer 43c, as in the case shown in FIG. 1A to FIG. 4H.

Next, configurations of still another light emitting body 10f will be explained by referring to FIGS. 14A to 14C. The light emitting body 10f is a variation of the light emitting body 10d shown in FIGS. 13A to 13C. FIGS. 14A, 14B, and 14C correspond, respectively, to FIGS. 13A, 13B, and 13C. The light emitting body shown in FIGS. 14A to 14C differ from the light emitting body 10d in that an insulating layer 44f and a transparent electrode layer 21b overlap so that an end portion of a pattern for 44fe of the insulating layer 44f is placed on an end portion of a pattern for the transparent electrode layer 21b. By providing a portion in which the pattern for the insulating layer 44f and the pattern for the transparent electrode layer 21b overlap each other, it is possible to prevent a clearance occurring between the end portion 44fe of the insulating layer 44f and the end portion 21be of the transparent electrode layer 21b caused by manufacturing errors and to lower a probability of occurrence of corrosion in the light emitting layer 30b. However, due to existence of the portion in which the patterns for the insulating layer 44f and light emitting layer 30b overlap each other, flatness on an upper surface of the light emitting body 10f is decreased.

It is needless to say that configurations of layers described in FIGS. 1A to 4H may be applied to those of the light emitting bodies 10a to 10f explained in FIGS. 9A to 14C.

Fourth Embodiment

Figure 15A:
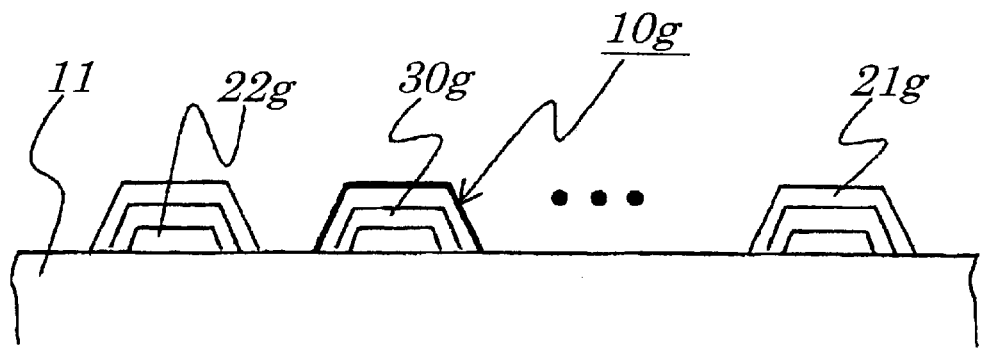
FIG. 15A is a cross-sectional view of a group of light emitting elements and FIG. 15B is a plan view conceptually illustrating the group of the light emitting elements according to a fourth embodiment of the present invention.
Figure 15B:
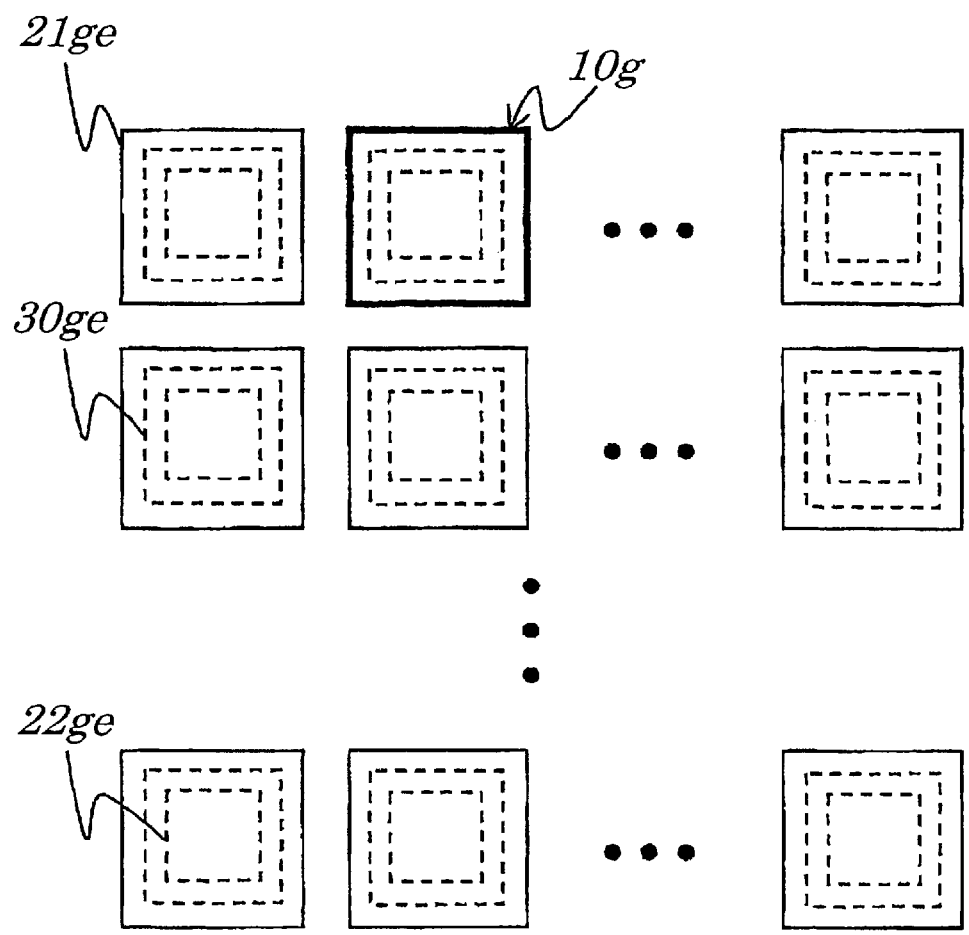
Figure 16A:
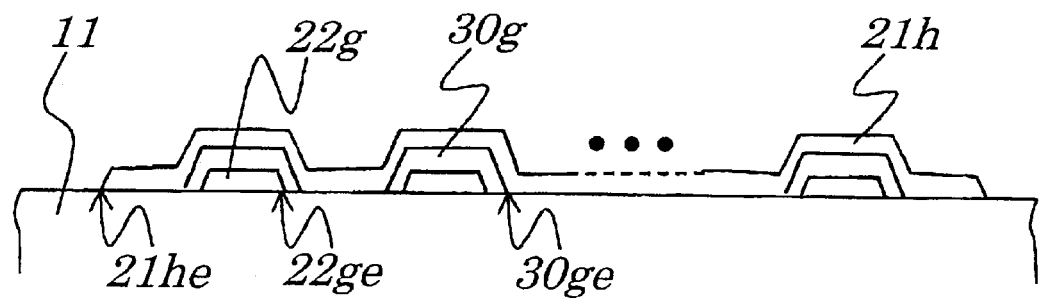
FIG. 16A is a cross-sectional view of a group of other light emitting elements and FIG. 16B is a plan view conceptually illustrating the group of the other light emitting elements according to the fourth embodiment of the present invention.
Figure 16B:
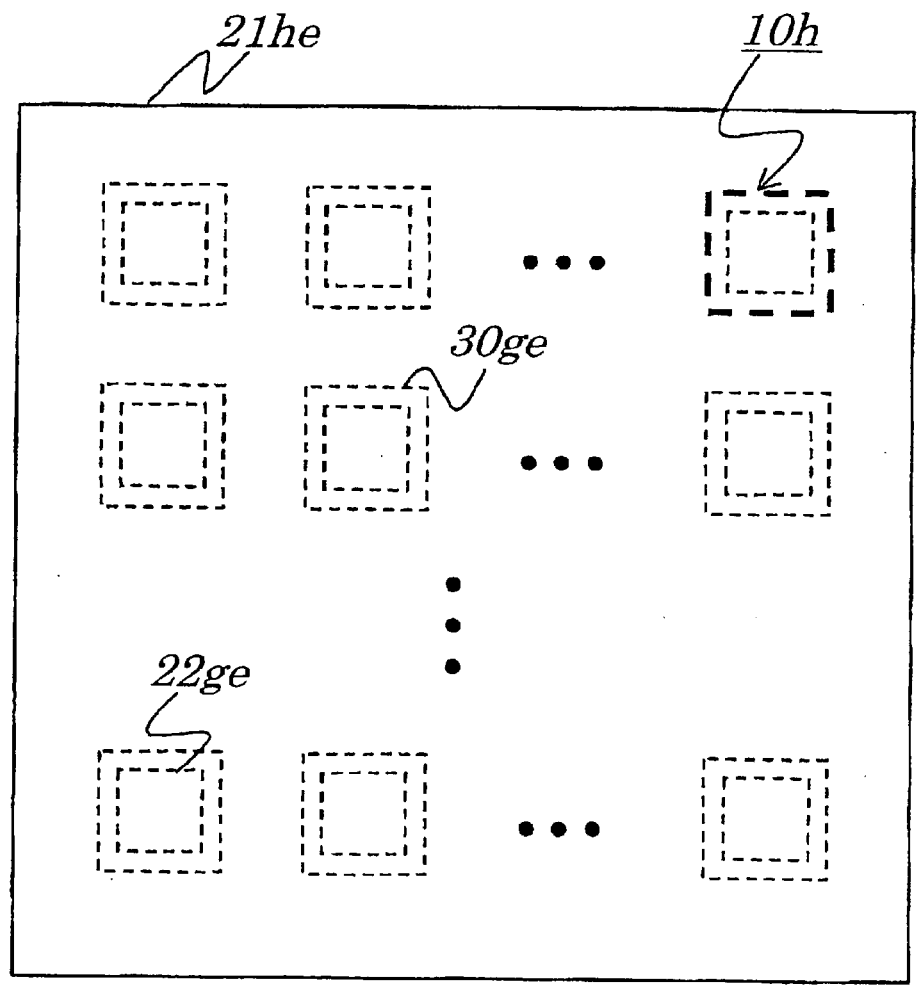
Figure 17A:
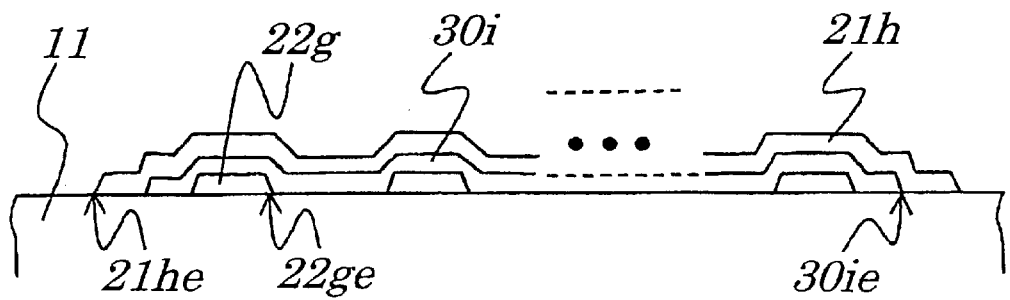
FIG. 17A is a cross-sectional view of a group of still other light emitting elements and FIG. 17B is a plan view conceptually illustrating the group of the other light emitting elements according to the fourth embodiment of the present invention.
Figure 17B:
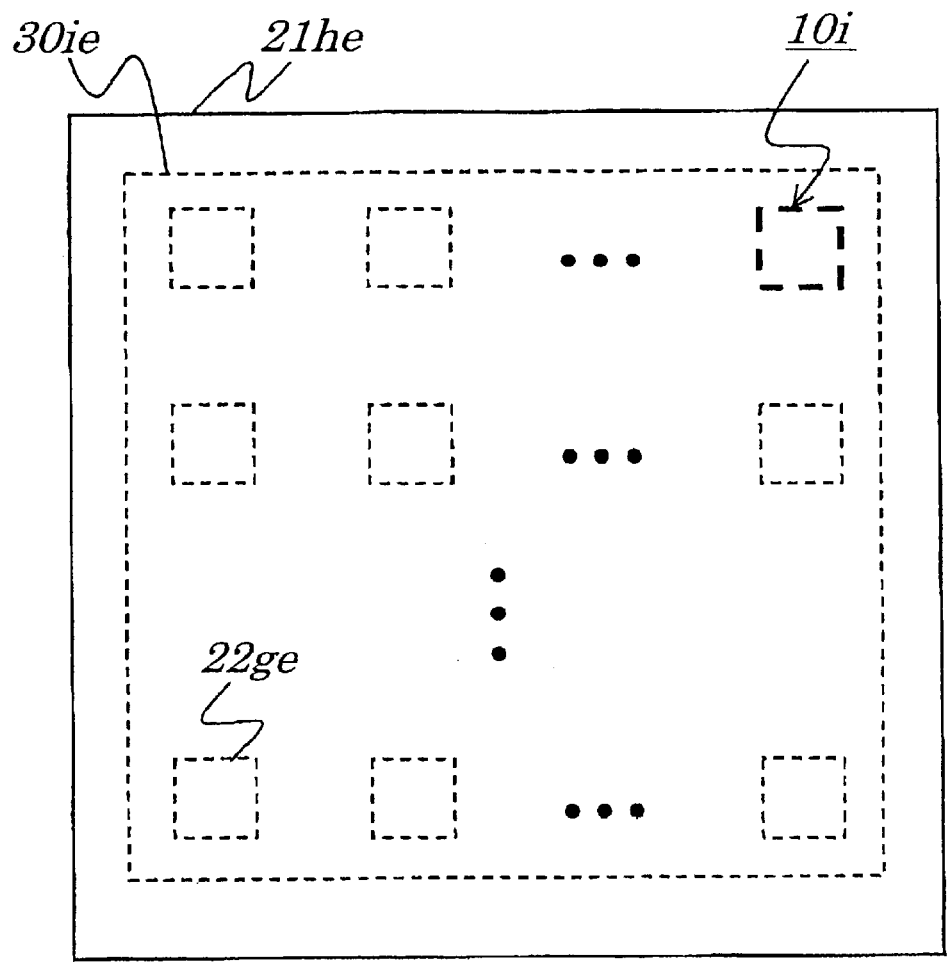

Configurations of a group of light emitting elements serving as light emitting bodies of the present invention being placed in juxtaposition in a plane manner on a substrate will be explained by referring to FIGS. 15A to 17B. FIG. 15A is a cross-sectional view of a group of light emitting elements 10g and FIG. 15B is a plan view conceptually illustrating the group of the light emitting elements 10g according to the fourth embodiment. FIG. 16A is a cross-sectional view of a group of other light emitting elements 10h and FIG. 16B is a plan view conceptually illustrating the group of the light emitting elements 10h according to the fourth embodiment. FIG. 17A is a cross-sectional view of a group of other light emitting elements 10i and FIG. 17B is a plan view conceptually illustrating the group of the light emitting elements 10i according to the fourth embodiment. Each size of the layer shown in each of the drawings and each location of each layer of the light emitting body illustrated in each of the drawings are only to provide positional relations in the layer and which are provided just for reference. In FIGS. 15A to 17B, same reference numbers are assigned to components having same functions or configurations or being made from same materials as those in FIG. 1A to FIG. 4H. If a component in FIG. 15A to FIG. 17B is made from the same material and the same function as that in FIG. 1A to FIG. 4H but has a shape different from that in FIG. 1A to FIG. 4H, suffixes "g" to "i" are added to a same numerical number assigned to each of the components in FIG. 15A to FIG.17B. Also, a second suffix "e" is additionally assigned to the above number having a first suffix to express an end portion of each of layers in plan views shown in FIGS. 15B to 17B.

Moreover, as described above, a plurality of the light emitting bodies is formed on the substrate. The substrate is a base body on which the plurality of the light emitting bodies and other films or elements are formed. As in the above embodiments, even in the case of an electrode having no layer structure, since it has overlapped portions forming a layer in some cases, such the electrode is expressed by adding a word of a "layer" to the electrode.

Each of the light emitting bodies 10g to 10i shown in FIGS. 15A to 17B, as in the case of the light emitting bodies 10a to 10f shown in FIG. 9A to FIG. 14C, is of a type of the film surface light emitting body in which light is emitted toward an upper direction on the substrate 11 and a display can be seen from an upper side of the layers stacked on the substrate 11 to their downward side.

First, one group of the light emitting elements will be described by referring to FIGS. 15A and 15B. As shown in FIGS. 15A and 15B, in each of the light emitting bodies 10g, a pattern for a lower electrode layer 22g is formed on a substrate 11 by a patterning method and a pattern for a light emitting material layer 30g is formed on the lower electrode layer 22g also by the patterning method in a manner that the pattern for the light emitting material layer 30g covers all regions of the pattern for the lower electrode layer 22g. Moreover, a pattern for a transparent electrode layer 21g is formed on the pattern for the light emitting material layer 30g in a manner that the pattern of the transparent electrode layer 21g covers all the regions of the pattern for the light emitting material layer 30g. Such the three-layer structured light emitting bodies 10g are independently arranged in vertical and horizontal directions on the substrate 11, as shown in FIGS. 15A and 15B.

A group of other light emitting bodies 10h will be described by referring to FIGS. 16A and 16B. The group of the other light emitting bodies 10h shown in FIGS. 16A and 16B is a variation of the group of the light emitting bodies 10g shown in FIGS. 15A and 15B. FIGS. 16A and 16B correspond, respectively, to FIGS. 15A and 15B.

The group of the light emitting bodies shown in FIGS. 16A and 16B differ from those in FIGS. 15A and 15B in that, instead of the pattern of the transparent electrode layer 21g covering an uppermost portion of the light emitting body 10g in FIG. 15A, a pattern for a transparent electrode layer 21h covers all regions of the group of the light emitting bodies 10h. Therefore, in this example, no portions being exposed on the substrate 11 on all regions of the group of the light emitting bodies 10h exist.

The light emitting body 10h is a portion in which a pattern for a light emitting material layer 30g is formed on a pattern for lower electrode layers 22g being arranged in vertical and horizontal directions on a substrate 11 in a manner that the pattern for the light emitting material layer 30g covers the pattern for the lower electrode layer 22g. Therefore, in the light emitting body 10h, the lower electrode layer 22g, light emitting material layer 30g and transparent electrode layer 21h are stacked to make the three-layer structure within the pattern for the lower electrode layer 22g. As described above, a plurality of the patterns for the lower electrode layers 22g and the light emitting material layers 30g is covered by one pattern for the transparent electrode layer 21h.

In the example shown in FIG. 16A, all the light emitting bodies 10h are covered by one pattern f or the transparent electrode layer 21h, however, it is not necessary for the one pattern of the transparent electrode layer 12h to cover all of the light emitting bodies 10h. All that is needed is that two or more light emitting bodies are covered by one pattern for the transparent electrode layer 21h. As in the above embodiments, $In_{2-x}Sn_xO_{3-y}$ ($0.05 \leq y \leq 0.2$) is used as a material for the transparent electrode layer 21h, which contains the mixture of an oxide of indium with tin as the chief component.

Next, one group of other light emitting elements 10i will be described by referring to FIGS. 17A and 17B. The group of the other light emitting bodies 10i shown in FIGS. 17A and 17B is a variation of the group of the light emitting bodies 10h shown in FIGS. 16A and 16B. FIGS. 17A and 17B correspond, respectively, to FIGS. 16A and 16B.

The group of the light emitting bodies 10i shown in FIGS. 17A and 17B differ from those in FIGS. 16A and 16B in that, not only a transparent electrode layer 21h but also a light emitting material layer 30i being one of three layers covers all regions of the group of the light emitting bodies 10i. Therefore, the layer being arranged in vertical and horizontal directions and being placed independently on a substrate 11 is only the lower electrode layer 22g and the light emitting body 10i is made up of three layers including the lower electrode layer 22g, light emitting material layer 30i and transparent electrode layer 21h. As described above, a plurality of patterns of the lower electrode layers 22g is covered by one pattern of the light emitting material layer 30i and by one pattern of the transparent electrode layer 21h.

In the example shown in FIG. 17A, all the aligned light emitting bodies 10i are covered by one pattern of the transparent electrode layer 21h and by one pattern of the light emitting material layer 30i, however, it is not necessary for the one pattern of the transparent electrode layer 12h and for the one pattern of the light emitting material layer 30i to cover all of the aligned light emitting bodies 10i. All that is needed is that two or more light emitting bodies 10i are covered by the one pattern of the transparent electrode layer 21h and by the one pattern of the light emitting material layer 30i. As in the above embodiments, $In_{2-x}Sn_xO_{3-y}$ ($0.05 \leq y \leq 0.2$) is used as a material for the transparent electrode layer 21h, which contains the mixture of an oxide of indium with tin as the chief component.

It is needless to say that configurations of layers described in FIGS. 5A to 8H in the second embodiment may be applied to those of the light emitting bodies 10g to 10i explained in FIGS. 15A to 17B.

Fifth Embodiment

Figure 18A:
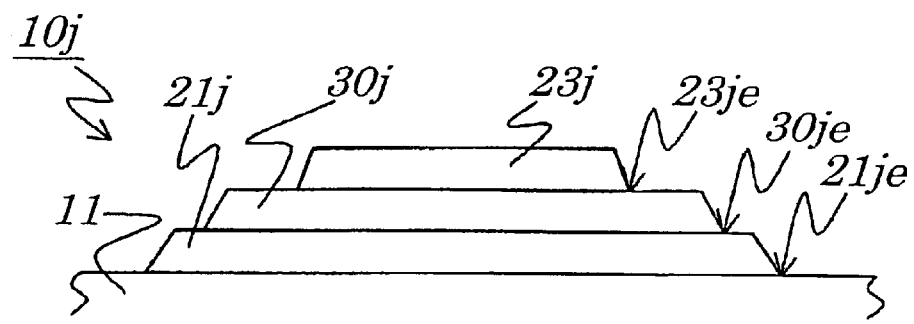
FIGS. 18A and 18C are cross-sectional views of a light emitting body and FIG. 18B is a plan view of the light emitting body according to a fifth embodiment of the present invention.
Figure 18B:
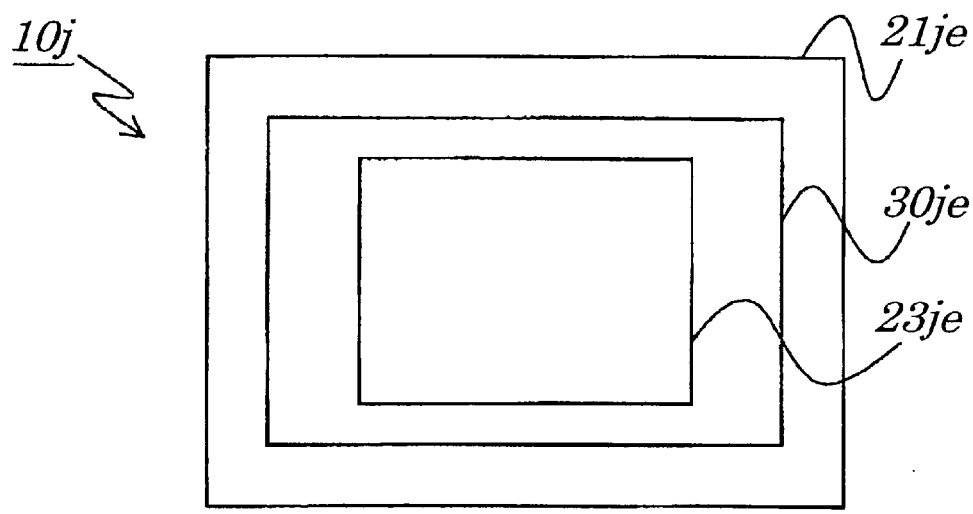
Figure 18C:
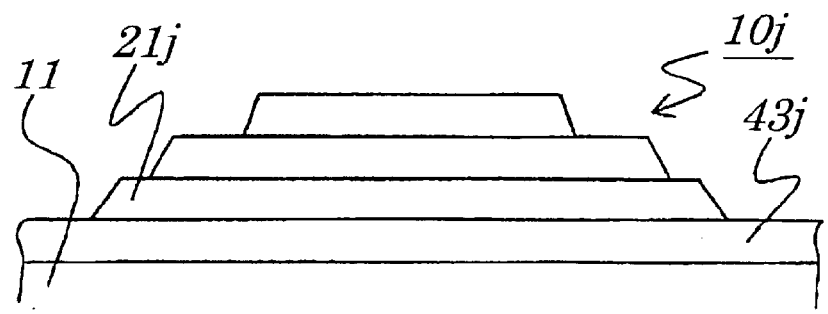
Figure 19A:
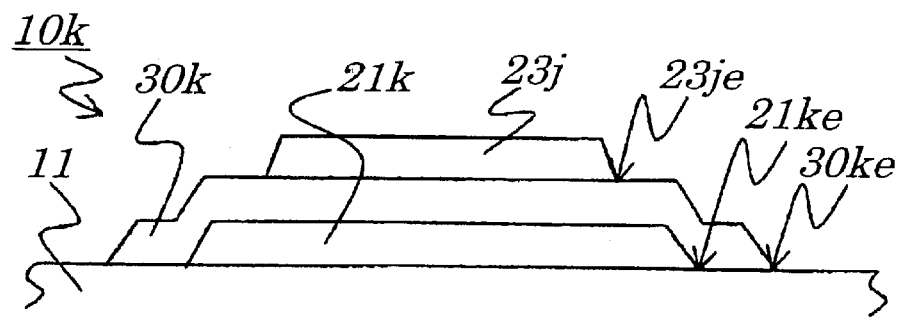
FIGS. 19A and 19C are cross-sectional views of another light emitting body and FIG. 19B is a plan view of the another light emitting body according to the fifth embodiment of the present invention.
Figure 19B:
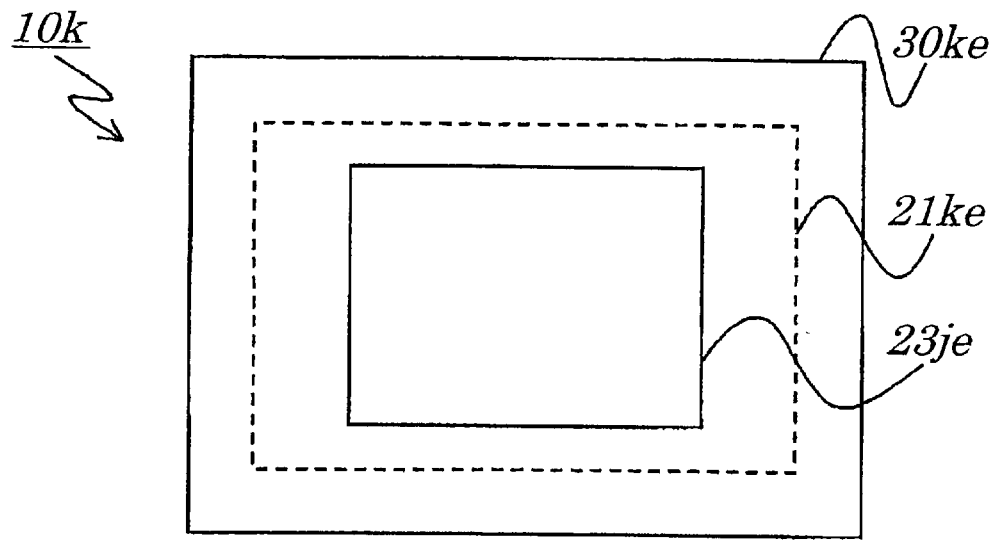
Figure 19C:
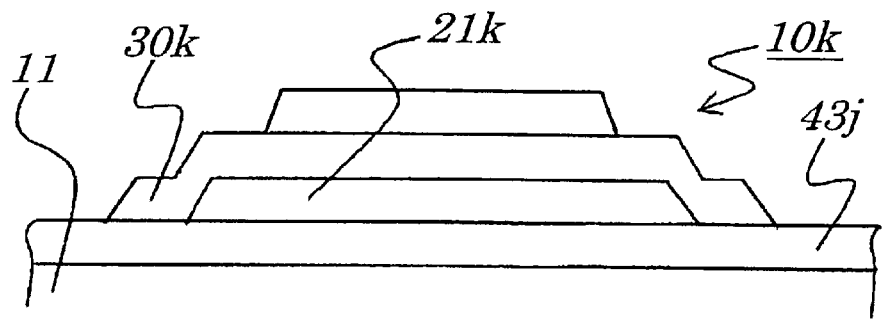
Figure 20A:
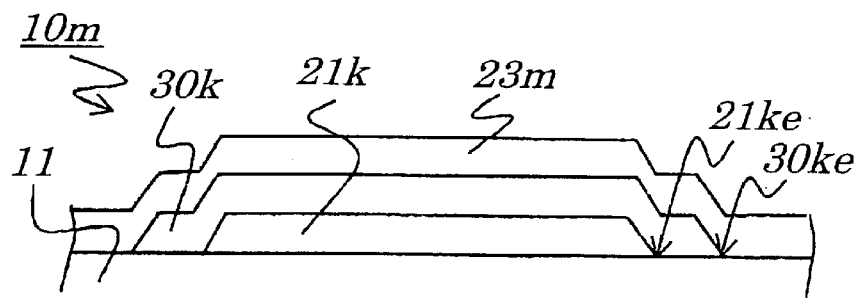
FIGS. 20A and 20C are cross-sectional views of still another light emitting body and FIG. 20B is a plan view of the still another light emitting body according to the fifth embodiment of the present invention.
Figure 20B:
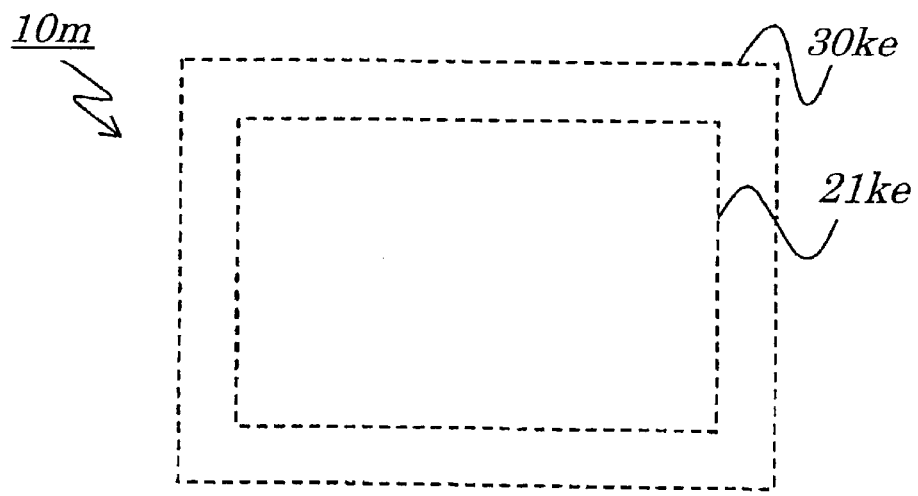
Figure 20C:
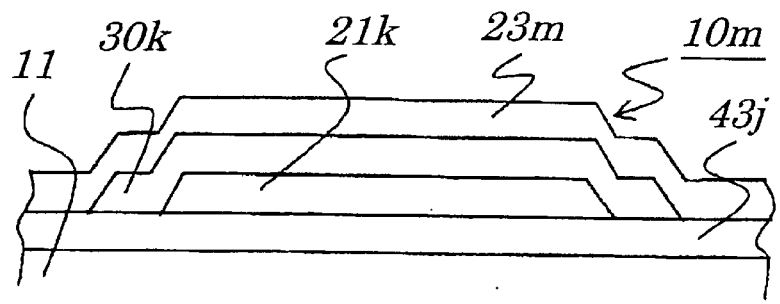
Figure 21A:
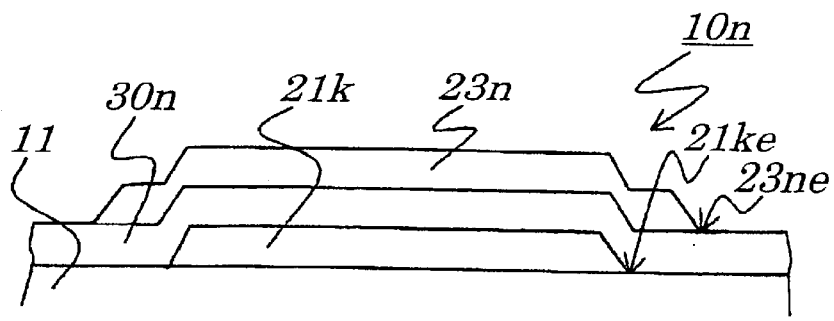
FIGS. 21A and 21C are cross-sectional views of still another light emitting body and FIG. 21B is a plan view of the still another light emitting body according to the fifth embodiment of the present invention.
Figure 21B:
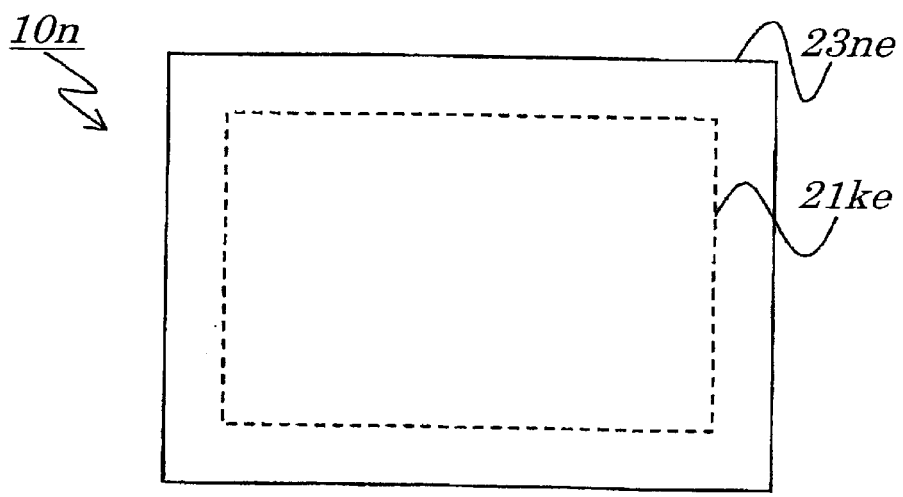
Figure 21C:
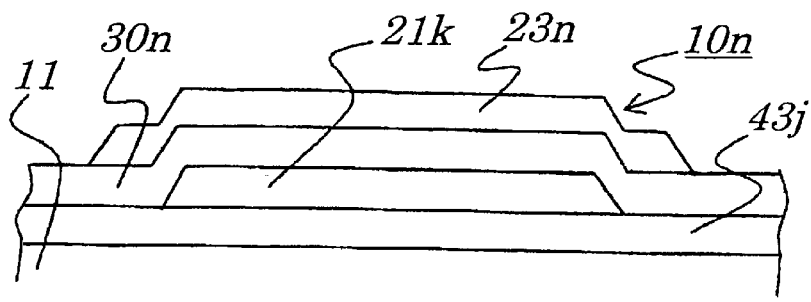
Figure 22A:
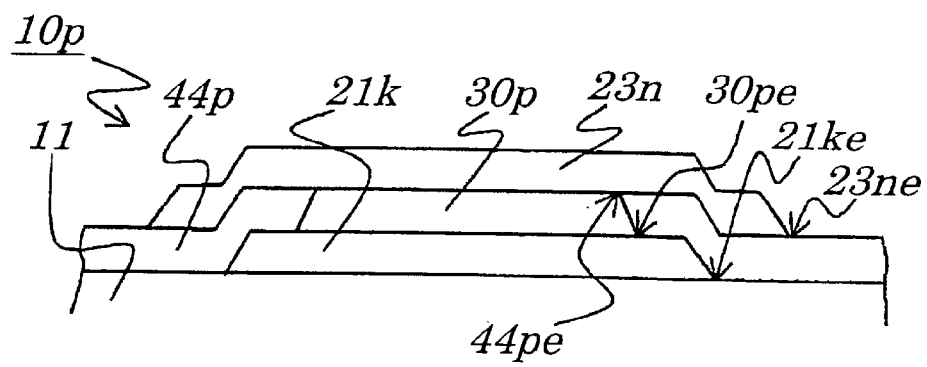
FIGS. 22A and 22C are cross-sectional views of still another light emitting body and FIG. 22B is a plan view of the still another light emitting body according to the fifth embodiment of the present invention.
Figure 22B:
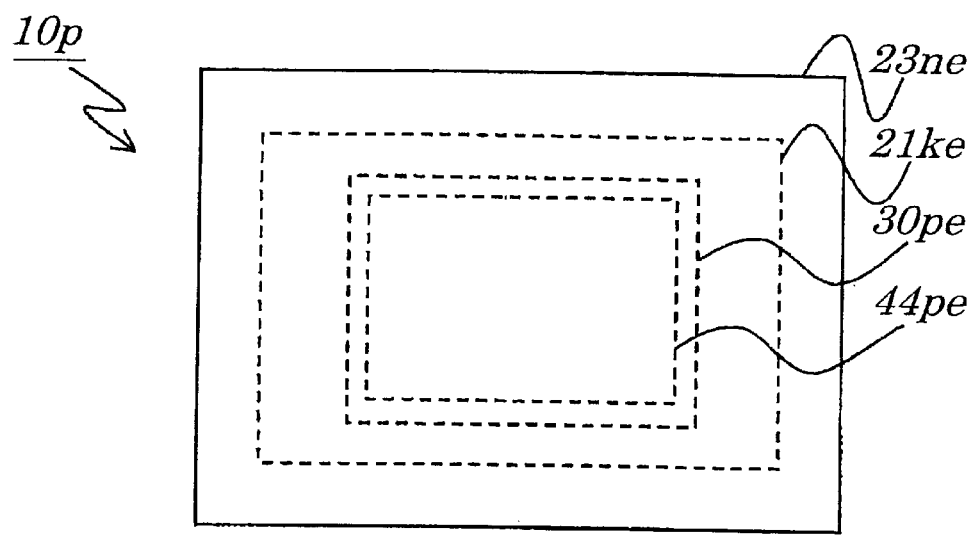
Figure 22C:
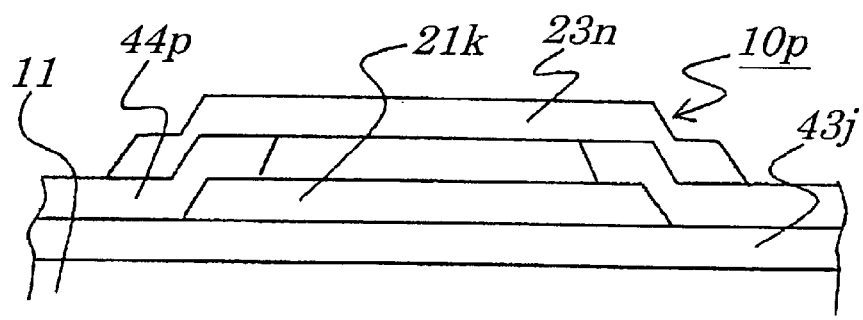
Figure 23A:
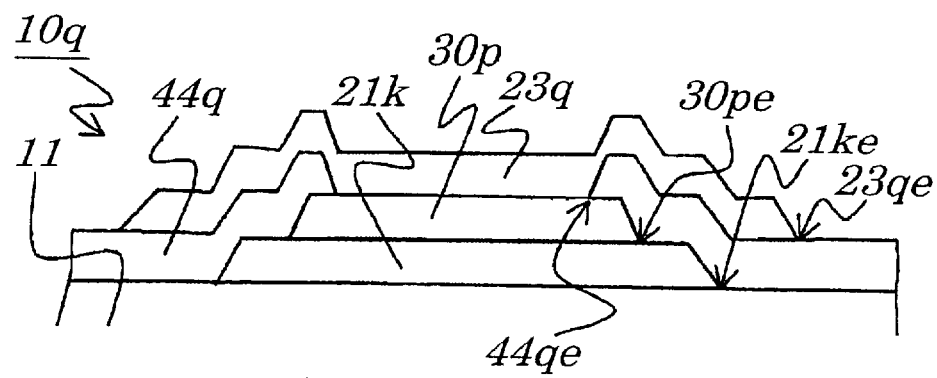
FIGS. 23A and 23C are cross-sectional views of still another light emitting body and FIG. 23B is a plan view of the still another light emitting body according to the fifth embodiment of the present invention.
Figure 23B:
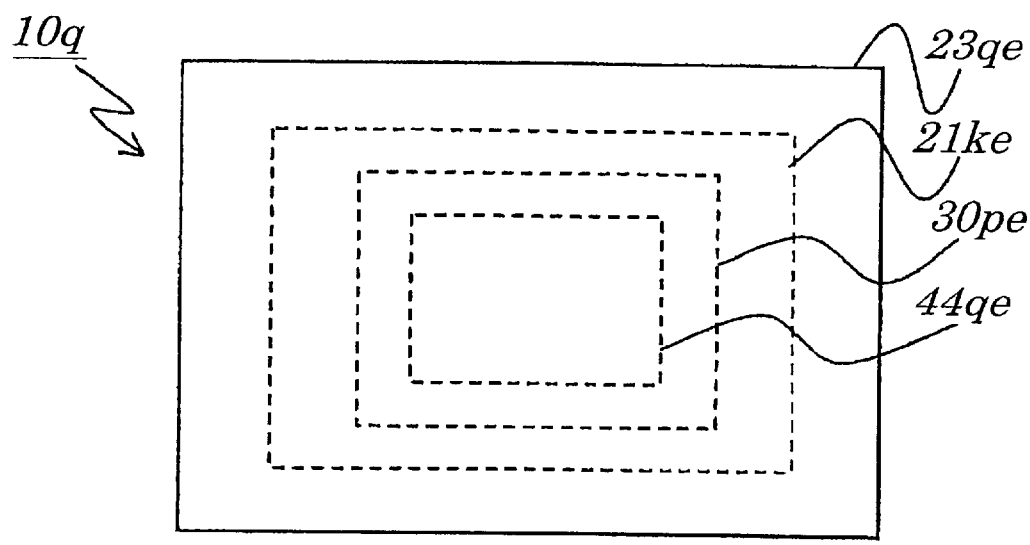
Figure 23C:
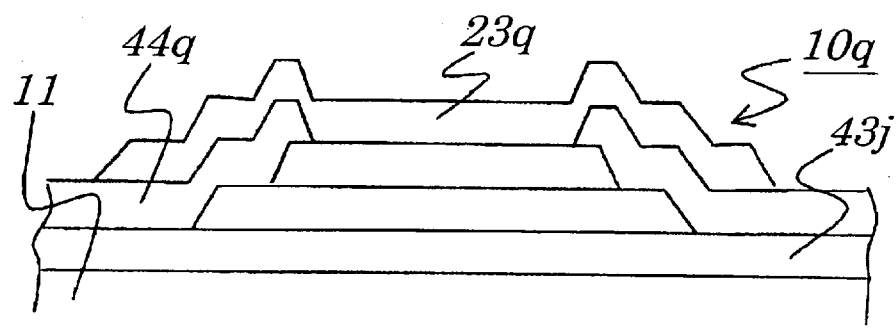
Figure 24A:
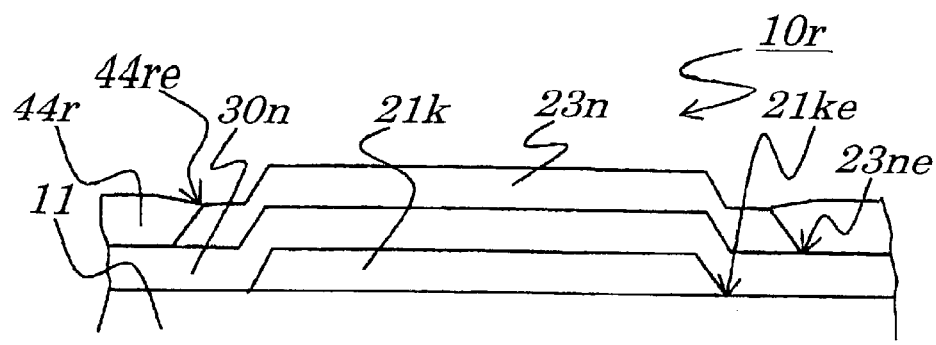
FIGS. 24A and 24C are cross-sectional views of still another light emitting body and FIG. 24B is a plan view of the still another light emitting body according to the fifth embodiment of the present invention.
Figure 24B:
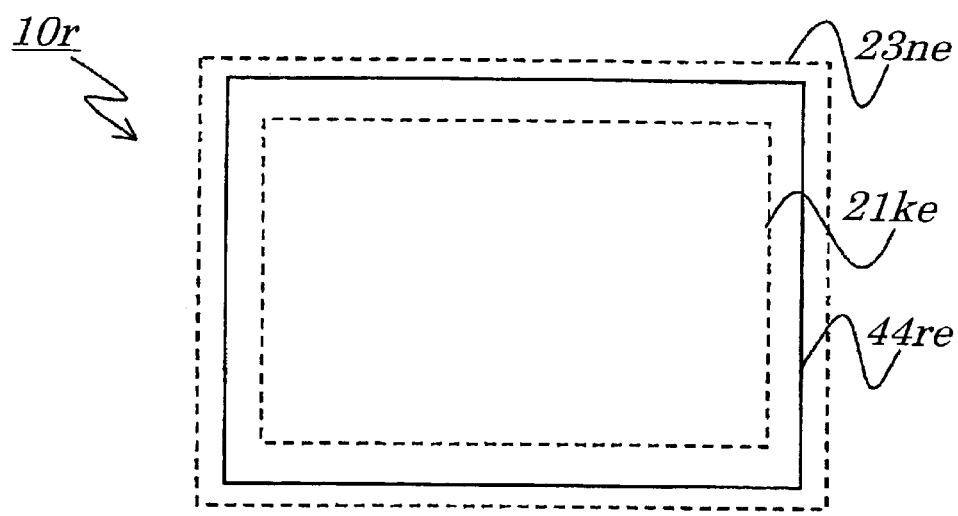
Figure 24C:
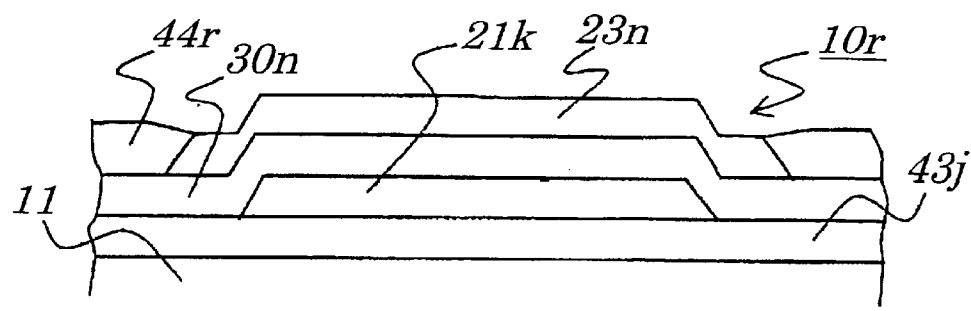
Figure 25A:
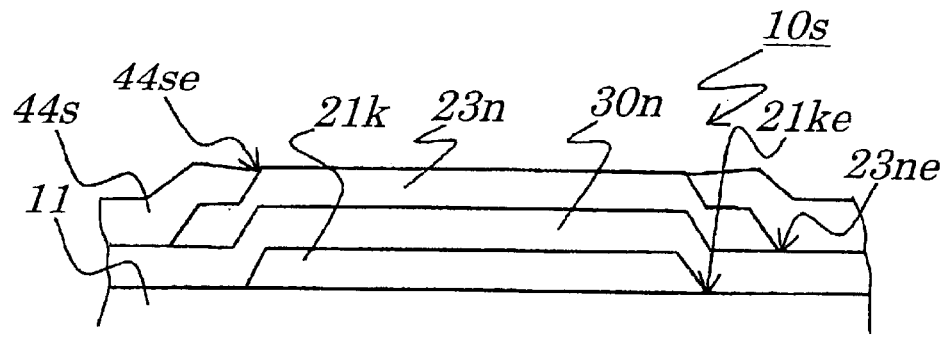
FIGS. 25A and 25C are cross-sectional views of still another light emitting body and FIG. 25B is a plan view of the still another light emitting body according to the fifth embodiment of the present invention.
Figure 25B:
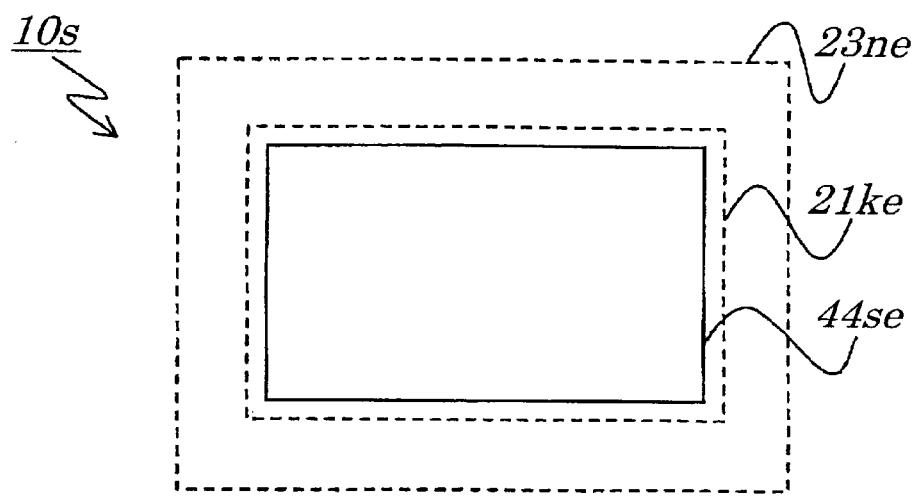
Figure 25C:
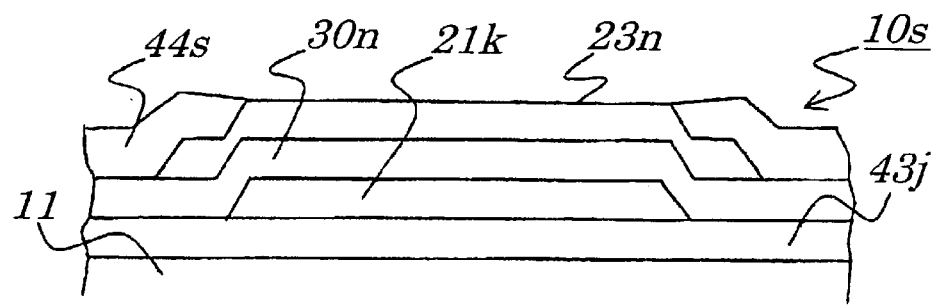

Configurations of a light emitting body of a fifth embodiment of the present invention, which is different from that described in the third embodiment shown in FIGS. 9A to 14C, will be described by referring to FIGS. 18A to 25C. FIGS. 18A and 18C are cross-sectional views of a light emitting body and FIG. 18B is a plan view of the light emitting body according to a fifth embodiment. FIGS. 19A and 19C are cross-sectional views of another light emitting body and FIG. 19B is a plan view of the another light emitting body according to the fifth embodiment. FIGS. 20A and 20C are cross-sectional views of still another light emitting body and FIG. 20B is a plan view of the still another light emitting body according to the fifth embodiment. FIGS. 21A and 21C are cross-sectional views of still another light emitting body and FIG. 21B is a plan view of the still another light emitting body according to the fifth embodiment. FIGS. 22A and 22C are cross-sectional views of still another light emitting body and FIG. 22B is a plan view of the still another light emitting body according to the fifth embodiment. FIGS. 23A and 23C are cross-sectional views of still another light emitting body and FIG. 23B is a plan view of the still another light emitting body according to the fifth embodiment. FIGS. 24A and 24C are cross-sectional views of still another light emitting body and FIG. 24B is a plan view of the still another light emitting body according to the fifth embodiment. FIGS. 25A and 25C are cross-sectional views of still another light emitting body and FIG. 25B is a plan view of the still another light emitting body according to the fifth embodiment. A direction in which light is emitted or in which a display is seen in the light emitting bodies shown in FIGS. 18A to 25C is reverse to that in the light emitting bodies 10j shown in FIG. 9C to FIG. 14C. The light emitting body of the fifth embodiment is of a type of the substrate surface light emitting type in which light is emitted in a downward direction of the substrate. As the substrate, for example, a glass substrate is used, in which a display can be seen from a lower face of the glass substrate toward a surface of stacked layers.

Each size of the layer shown in each of the drawings and each layer and its pattern illustrated in each of the drawings are only to provide positional relations in the layer and which are provided just for reference.

In FIGS. 18A to 25C, same reference numbers are assigned to components having same functions or configurations or being made from same materials as those in FIG. 5A to FIG. 8H. If a component in FIG.18A to FIG. 25C is made from the same material and the same function as that in FIG. 5A to FIG. 8H but has a shape different from that in FIG. 5A to FIG. 8H, suffixes "j" to "s" are added to a same numerical number assigned to each of the components in FIG. 18A to FIG. 25C. Also, a second suffix "e" is additionally assigned to the above number having a first suffix to express an end portion of each of layers in plan views shown in FIGS. 18B, 19B, 20B, 21B, 22B, 23B, 24B, and 25B.

Moreover, as described above, a plurality of the light emitting bodies 10j to 10s is formed on a substrate 11. The substrate is a base body on which the plurality of the light emitting bodies 10j to 10s and other films or elements are formed. As in the above embodiments, even in the case of an electrode having no layer structure, since it has overlapped portions forming a layer in some cases, such the electrode is expressed by adding a word of a "layer" to the electrode.

First, a light emitting body 10j of the present invention will be described by referring to FIGS. 18A to 18C. As shown in FIG. 18A, on the substrate 11 is formed a transparent electrode layer 21j by a patterning method. On the transparent electrode layer 21j is formed a light emitting material layer 30j by the patterning method. A pattern for the light emitting material layer 30j is smaller in size than that of the transparent electrode layer 21j. On the light emitting material layer 30j is formed an upper electrode layer 23j. A pattern for the upper electrode layer 23j is smaller in size than that of the light emitting material layer 30j. As in the above embodiments, the substance "$In_{2-x}Sn_xO_{3-y}$ ($0.05 \leq y \leq 0.2$)" is used as a material for the transparent electrode layer 21j, which contains the mixture of an oxide of indium with tin as the chief component.

In this example, the substance $In_{2-x}Sn_xO_{3-y}$ ($0.05 \leq y \leq 0.2$) exhibiting hygroscopicity due to its oxygen-deficient characteristic is formed under all regions of the patterns for the upper electrode layer 23j and of the light emitting material layer 30j. Therefore, the substance $In_{2-x}Sn_xO_{3-y}$ ($0.05 \leq y \leq 0.2$) absorbs even a trace amount of moisture existing in the vicinity of the light emitting layer 30b, thus keeping the light emitting material away from moisture.

In this example, all the regions of the pattern for the light emitting material layer 30j are formed on the transparent electrode layer 21j, however, even if the pattern for the light emitting material layer 30j is not partially formed on the transparent electrode layer 21j, the same effects as described can be achieved. Moreover, in this example, all the regions of the pattern for the upper electrode layer 23j are formed on the pattern for the light emitting material layer 30j, however, even if the pattern for the upper electrode layer 23j is not partially formed on the light emitting material layer 30j, the same effects as described above can be achieved.

As shown in FIG. 18C, a hygroscopicity enhancing layer 43j may be formed on the transparent electrode layer 21j made of the substance $In_{2-x}Sn_xO_{3-y}$ ($0.05 \leq y \leq 0.2$). Here, the hygroscopicity enhancing layer 43j serves to receive the moisture absorbed by the transparent electrode layer 21j and to keep the light emitting material away from the moisture.

Moreover, in order to completely keep the upper electrode layer 23j or the light emitting material layer 30j free of moisture and/or oxygen in the atmosphere, a protecting layer (not shown) may be formed on all the three-layer structured light emitting body 10j, as in the case shown in FIGS. 5C, 5D, 5G and 5H.

Next, another light emitting body 10k of the present invention will be described by referring to FIGS. 19A to 19C. The light emitting body 10k shown in FIGS. 19A to 19C is a variation of that shown in FIGS. 18A to 18C. FIGS. 19A, 19B, and 19C correspond, respectively, to FIGS. 18A, 18B, and 18C.

The light emitting body 10k in FIGS. 19A to 19C differs from that shown in FIGS. 18A to 18C in that a pattern for the light emitting material layer 30k is formed in a manner that it covers all the regions of a pattern for the transparent electrode layer 21k grown on the substrate 11. Therefore, the pattern for the light emitting material layer 30k is larger in size than that for the transparent electrode layer 21k.

On the pattern for the light emitting material layer 30k is formed the upper electrode layer 23j. A pattern for the upper electrode layer 23j is smaller in size than that for the light emitting layer 30k. As in the above embodiments, the substance "$In_{2-x}Sn_xO_{3-y}$ ($0.05 \leq y \leq 0.2$)" is used as a material for the transparent electrode layer 21k, which contains the mixture of an oxide of indium with tin as the chief component.

In this example, the substance $In_{2-x}Sn_xO_{3-y}$ ($0.05 \leq y \leq 0.2$) exhibiting hygroscopicity due to its oxygen-deficient characteristic is formed under a light emitting element portion in the upper electrode layer 23k and the light emitting material layer 30k. Therefore, the substance "$In_{2-x}Sn_xO_{3-y}$ ($0.05 \leq y \leq 0.2$)" absorbs even a trace amount of moisture existing in the vicinity of the light emitting layer 30k, thus keeping the light emitting material away from moisture.

Also, in this configuration, unlike in the case shown in FIGS. 18A and 18C, there is an advantage that, since the pattern for the light emitting material layer 30k can be made larger in size, a production of the pattern for the light emitting material layer 30k is made easier and choice of producing the pattern for the light emitting material layer 30k is made wider. However, since there exists a portion of the pattern for the light emitting material layer 30k which is not formed on the transparent electrode layer 21k, it is necessary to use a material for the light emitting material layer 30k having an excellent moisture-resistant characteristic.

In this example, all the regions of the pattern for the transparent electrode layer 21k are covered by the light emitting material layer 30k, however, even if the pattern for the transparent electrode layer 21k is not partially covered by the light emitting material layer 30k, the same effects as described can be achieved. Moreover, in this example, all the regions of the pattern for the upper electrode layer 23j are formed on the pattern for the light emitting material layer 30k, however, even if the pattern for the upper electrode layer 23j is not partially formed on the light emitting material layer 30k, the same effects as described above can be achieved.

As shown in FIG. 19C, a hygroscopicity enhancing layer 43j may be formed between the transparent electrode layer 21k made from the substance "$In_{2-x}Sn_xO_{3-y}$ ($0.05 \leq y \leq 0.2$)" and the substrate. Here, the hygroscopicity enhancing layer 43j serves to receive the moisture absorbed by the transparent electrode layer 21k and to keep the light emitting material further away from the moisture.

Moreover, in order to completely keep the upper electrode layer 23j or the light emitting material layer 30k free of moisture and/or oxygen in the atmosphere, a protecting layer (not shown) may be formed on an entire of the light emitting body 10k.

Next, another light emitting body 10m of the present invention will be described by referring to FIGS. 20A to 20C. The light emitting body 10m shown in FIGS. 20A to 20C is a variation of that shown in FIGS. 19A to 19C. FIGS. 20A, 20B, and 20C correspond, respectively, to FIGS. 19A, 19B, and 19C.

The light emitting body 10m in FIGS. 20A to 20C differs from that shown in FIGS. 19A to 19C in that an upper electrode layer 23m is formed on all regions of the pattern for the light emitting material layer 30k covering the pattern for the transparent electrode layer 21k. Therefore, a pattern for the upper electrode layer 23m is larger in size than that for the light emitting material layer 30k.

As in the case shown in FIGS. 19A to 19C, as a material for the transparent electrode layer 21k, the substance containing a mixture of an oxide of indium with tin as a chief component described above is used.

In this example, the substance $In_{2-x}Sn_xO_{3-y}$ ($0.05 \leq y \leq 0.2$) exhibiting hygroscopicity due to its oxygen-deficient characteristic is formed under a light emitting element portion in the upper electrode layer 23m and the light emitting material layer 30k. Therefore, the substance "$In_{2-x}Sn_xO_{3-y}$ ($0.05 \leq y \leq 0.2$)" absorbs even a trace amount of moisture existing in the vicinity of the light emitting layer 30k, thus keeping the light emitting material away from moisture.

Also, in this configuration, unlike in the case shown in FIGS. 18A and 18C, there is an advantage that, since the patterns for the light emitting material layer 30k and for the upper electrode layer 23m can be made larger in size, a production of the patterns for the light emitting material layer 30k and of the upper electrode layer 23m is made easier and choice of producing the pattern for the light emitting material layer 30k is made wider. However, since there exist portions of the patterns for the light emitting material layer 30k and for the upper electrode layer 23m which are not formed on the transparent electrode layer 21k, it is necessary to use a material for the light emitting material layer 30k having an excellent moisture-resistant characteristic.

In this example, all the regions of the pattern for the transparent electrode layer 21k are covered by the light emitting material layer 30k, however, even if the pattern for the transparent electrode layer 21k is not partially covered by the light emitting material layer 30k, the same effects as described can be achieved. Moreover, in this example, all the regions of the pattern for the light emitting material layer 30k are covered by the pattern for the upper electrode layer 23m, however, even if the pattern for the light emitting material layer 30k is not partially covered by the upper electrode layer 23m, the same effects as described above can be achieved.

As shown in FIG. 20C, a hygroscopicity enhancing layer 43j may be formed between the transparent electrode layer 21k and the substrate 11. Here, the hygroscopicity enhancing layer 43j serves to receive the moisture absorbed by the transparent electrode layer 21k and to keep the light emitting material away from the moisture.

Moreover, in order to completely keep the upper electrode layer 23m or the light emitting material layer 30k free of moisture and/or oxygen in the atmosphere, a protecting layer (not shown) may be formed on an entire of the light emitting body 10m.

Next, another light emitting body 10n of the present invention will be described by referring to FIGS. 21A to 21C.

The light emitting body 10n shown in FIGS. 21A to 21C is a variation of that shown in FIGS. 20A to 20C. FIGS. 21A, 21B, and 21C correspond, respectively, to FIGS. 20A, 20B, and 20C.

The light emitting body 10n in FIGS. 20A to 20C differs from that shown in FIGS. 20A to 20C in that a pattern for a light emitting material layer 30n covers a range being wider than a pattern for the transparent electrode layer 21k formed on the substrate 11 and a pattern for an upper electrode layer 23n has a width that can cover the pattern for the transparent electrode layer 21k. Therefore, the pattern of the upper transparent electrode layer 21k is larger in size than that for the light emitting material layer 30n.

As in the case shown in FIGS. 19A to 19C, as a material for the transparent electrode layer 21k, the substance containing the mixture of an oxide of indium with tin as a chief component is used.

In this example, the substance $In_{2-x}Sn_xO_{3-y}$ ($0.05 \leq y \leq 0.2$) exhibiting hygroscopicity due to its oxygen-deficient characteristic is formed under a light emitting element portion in the upper electrode layer 23n and the light emitting material layer 30n. Therefore, the substance "$In_{2-x}Sn_xO_{3-y}$ ($0.05 \leq y \leq 0.2$)" absorbs even a trace amount of moisture existing in the vicinity of the light emitting layer 30n, thus keeping the light emitting material away from moisture.

Also, in this configuration, unlike in the case shown in FIGS. 18A and 18C, there is an advantage that, since the patterns for the light emitting material layer 30n and for the upper electrode layer 23n can be made larger in size, a production of the patterns for the light emitting material layer 30n and of the upper electrode layer 23n is made easier and choice of producing the pattern for the light emitting material layer 30k is made wider. However, since there exist portions of the patterns for the light emitting material layer 30n and for the upper electrode layer 23n which are not formed on the transparent electrode layer 21k, it is necessary to use a material for the light emitting material layer 30n having an excellent moisture-resistant characteristic.

As shown in FIG. 21C, a hygroscopicity enhancing layer 43j may be formed between the transparent electrode layer 21k made of the substance "$In_{2-x}Sn_xO_{3-y}$ ($0.05 \leq y \leq 0.2$)" and the substrate 11. Here, the hygroscopicity enhancing layer 43j serves to receive the moisture absorbed by the transparent electrode layer 21k and to keep the light emitting material away from the moisture.

Moreover, in order to completely keep the upper electrode layer 23n or the light emitting material layer 30n free of moisture and/or oxygen in the atmosphere, a protecting layer (not shown) may be formed on an entire of the light emitting body 10n.

Next, another light emitting body 1op of the present invention will be described by referring to FIGS. 22A to 22C.

The light emitting body 1op shown in FIGS. 22A to 22C is a variation of that shown in FIGS. 21A to 21C. FIGS. 22A, 22B, and 22C correspond, respectively, to FIGS. 21A, 21B, and 21C.

The light emitting body 1op in FIGS. 22A to 22C differs from that shown in FIGS. 21A to 21C in that a pattern for a light emitting material layer 30p is placed within a range of the pattern for the transparent electrode layer 21k formed on the substrate 11 and portions of the pattern for the transparent electrode layer 21k being not covered by the pattern for the light emitting material layer 30p is covered by an insulating layer 44p. Therefore, the pattern for the light emitting layer 30p is smaller in size than that for the transparent electrode layer 21k.

As in the case shown in FIGS. 19A to 19C, as a material for the transparent electrode layer 21k, the substance containing a mixture of an oxide of indium with tin as a chief component is used.

In this example, the substance $In_{2-x}Sn_xO_{3-y}$ ($0.05 \leq y \leq 0.2$) exhibiting hygroscopicity due to its oxygen-deficient characteristic is formed under a light emitting element portion in the upper electrode layer 23n and the light emitting material layer 30p. Therefore, the substance "$In_{2-x}Sn_xO_{3-y}$ ($0.05 \leq y \leq 0.2$)" absorbs even a trace amount of moisture existing in the vicinity of the light emitting layer 30p, thus keeping the light emitting material away from moisture.

The light emitting body 1op is configured in a manner that portions surrounding the pattern for the transparent electrode layer 21k and for the light emitting material layer 30p are buried in the insulating layer 44p and therefore an upper surface of the light emitting body 10p is made comparatively flat. However, since a new process of burying the insulating layer 44p has to be added, its manufacturing costs increase accordingly.

In this example, all the regions of the pattern for the light emitting material layer 30p are formed on the transparent electrode layer 21k, however, even if the pattern for the light emitting material layer 30p is not partially formed on the transparent electrode layer 21k, the same effects as described can be achieved. Moreover, in this example, all the regions of the pattern for the light emitting material layer 30p are covered by the pattern for the upper electrode layer 23n, however, even if the pattern for the light emitting material layer 30p is not partially covered by the upper electrode layer 23n, the same effects as described above can be achieved.

As shown in FIG. 22C, a hygroscopicity enhancing layer 43j may be formed between the transparent electrode layer 21k made of the substance "$In_{2-x}Sn_xO_{3-y}$ ($0.05 \leq y \leq 0.2$)" and the substrate 11. Here, the hygroscopicity enhancing layer 43j serves to receive the moisture absorbed by the transparent electrode layer 21k and to keep the light emitting material away from the moisture.

Moreover, in order to completely keep the upper electrode layer 23n or the light emitting material layer 30p free of moisture and/or oxygen in the atmosphere, a protecting layer (not shown) may be formed on an entire of the light emitting body lop.

Next, another light emitting body 10q of the present invention will be described by referring to FIGS. 23A to 23C.

The light emitting body 10q shown in FIGS. 23A to 23C is a variation of that shown in FIGS. 22A to 22C. FIGS. 23A, 23B, and 23C correspond, respectively, to FIGS. 22A, 22B, and 22C.

The light emitting body 10q in FIGS. 23A to 23C differs from that shown in FIGS. 22A to 22C in that an end portion 44qe of an insulating layer 44q is put on a pattern of the light emitting material layer 30p in an overlapping manner. Thus, by providing a portion in which a pattern for the insulating layer 44q and the pattern for the light emitting material layer 30p overlap each other, it is possible to prevent a leakage current from occurring between a upper electrode layer 23q and a transparent electrode layer 21k caused by manufacturing errors. However, since the portion in which the pattern for the insulating layer 44q and the pattern for the light emitting material layer 30p overlap each other exists, flatness on an upper surface of the light emitting body 10q decreases compared with the case shown in FIGS. 22A to 22C.

Next, another light emitting body 10r of the present invention will be described by referring to FIGS. 24A to 24C.

The light emitting body 10r shown in FIGS. 24A to 24C is a variation of that shown in FIGS. 23A to 23C. FIGS. 24A, 24B, and 24C correspond, respectively, to FIGS. 23A, 23B, and 23C.

The light emitting body 10r in FIGS. 24A to 24C differs from that shown in FIGS. 23A to 23C in that portions of a light emitting material layer 30r being exposed around a pattern of an upper electrode layer 23r are buried in an insulating layer 44r. By configuring as above, a shortcoming in moisture-resistance in the light emitting body 10n shown in FIGS. 21A to 21C can be compensated for. However, a new process of burying the insulating layer 44q has to be added and its manufacturing costs increase accordingly.

Moreover, it is possible to make an upper face of the stacked layers of the light emitting body 10r flatter compared with the light emitting body lop shown in FIGS. 22A to 22C.

Next, another light emitting body 10s of the present invention will be described by referring to FIGS. 25A to 25C.

The light emitting body 10s shown in FIGS. 25A to 25C is a variation of that shown in FIGS. 24A to 24C. FIGS. 25A, 25B, and 25C correspond, respectively, to FIGS. 24A, 24B, and 24C.

The light emitting body 10s in FIGS. 25A to 25C differs from that shown in FIGS. 24A to 24C in that an end portion 44se of an insulating layer 44s is put on an end portion 23ne of the upper electrode layer 23n in an overlapping manner.

Thus, by providing a portion in which the insulating layer 44se and the upper electrode layer 23n overlap each other, it is possible to prevent a clearance from occurring between the end portion 44se of the insulating layer 44s and the end portion 44se of the upper electrode layer 44se caused by a manufacturing error, which can lower a probability of corrosion in the light emitting material layer 30n. However, since the portion in which the pattern for the insulating layer 44s and the light emitting material layer 30n overlap each other exists, flatness on an upper surface of the light emitting body 10s decreases compared with the case of the light emitting body 10r shown in FIGS. 24A to 24C.

It is needless to say that configurations of layers described in FIGS. 5A to 8H in the second embodiment can be applied to those of the light emitting bodies 10j to 10s explained in FIGS. 18A to 25B.

Sixth Embodiment

Figure 26A:
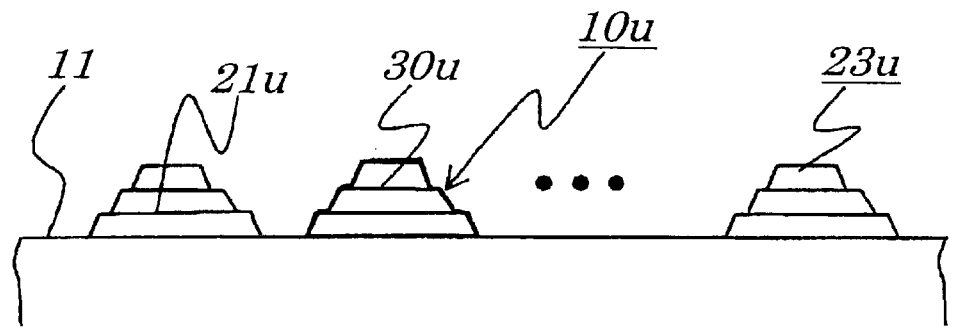
FIG. 26A is a cross-sectional view of a group of light emitting elements and FIG. 26B is a plan view conceptually illustrating the group of the light emitting elements according to a sixth embodiment of the present invention.
Figure 26B:
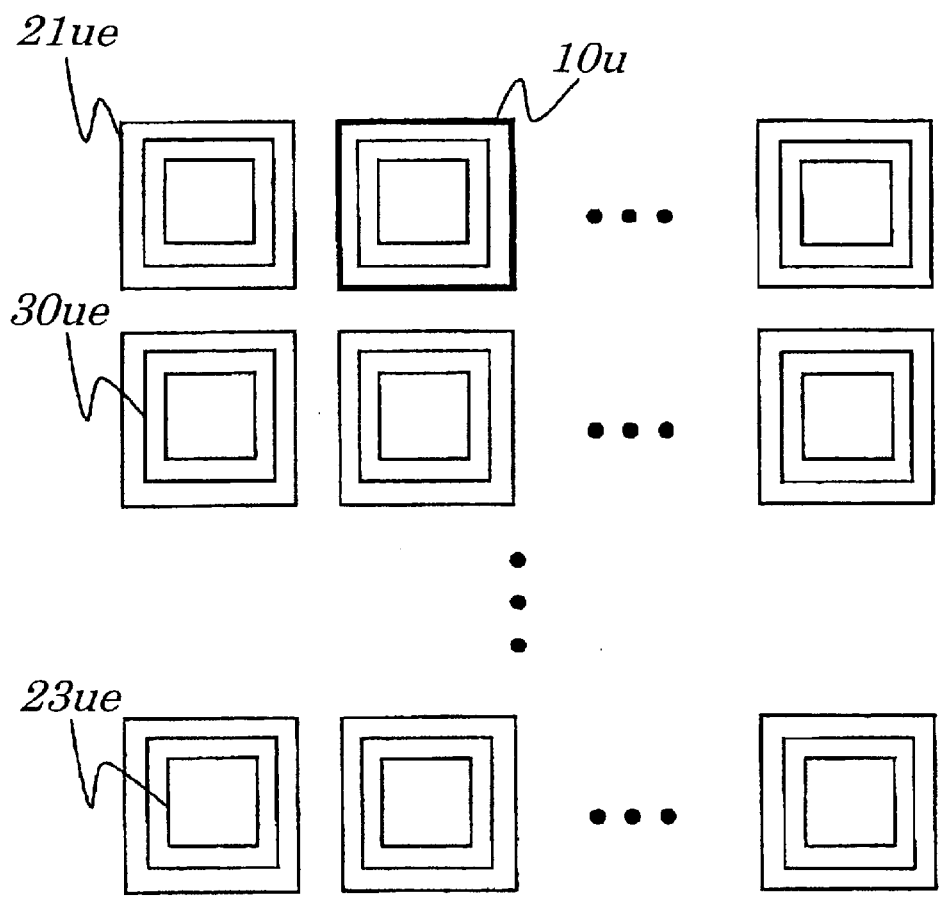
Figure 27A:
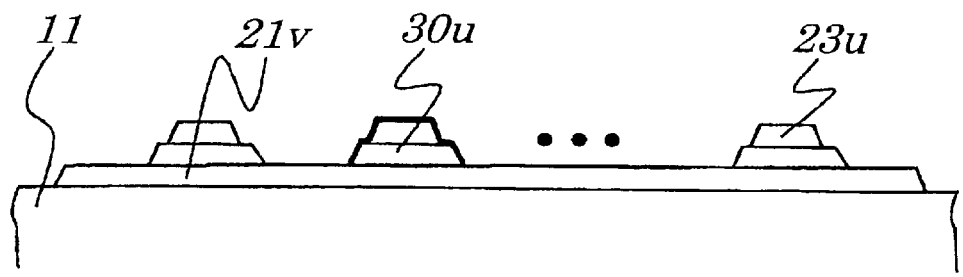

Configurations of a group of light emitting elements 10u to 10w using light emitting bodies of the present invention and being placed in juxtaposition in a plane manner will be explained by referring to FIGS. 26A to 28B. FIG. 26A is a cross-sectional a view of a group of light emitting elements and FIG. 26B is a plan view conceptually illustrating the group of the light emitting elements according to the sixth embodiment of the present invention. FIG. 27A is a cross-sectional view of a group of other light emitting elements and FIG. 26B is a plan view conceptually illustrating the group of the other light emitting elements according to the sixth embodiment. FIG. 28A is a cross-sectional view of a group of still other light emitting elements and FIG. 28B is a plan view conceptually illustrating the group of the still other light emitting elements according to the sixth embodiment. Therefore, each size of a layer of light emitting bodies shown in each of drawings and each arrangement of the light emitting bodies are only to provide positional relations in the light emitting bodies and which are provided just for reference.

Moreover, in FIGS. 26A to 28B, same reference numbers are assigned to components having same functions or configurations or being made from same materials as those in FIG. 5A to FIG. 8H. If a component in FIG. 26A to FIG. 28B is made from the same material and the same function as that in FIG. 5A to FIG. 8H but has a shape different from that in FIG. 5A to FIG. 8H, suffixes "u" to "w" is added to a same numerical number as signed to each of the components in FIG. 26A to FIG. 28C. Also, a second suffix "e" is additionally assigned to the above number having a first suffix to express an end portion of each of layers in plan views shown in FIGS. 26B, 27B, and 28B.

Furthermore, a plurality of the light emitting bodies is formed on the substrate. The substrate is a base body on which the plurality of the light emitting bodies and other films or elements are formed. As in the above embodiments, even in the case of an electrode having no layer structure, since it has overlapped portions forming a layer in some cases, such the electrode is expressed by adding a word of a "layer" to the electrode.

Each of the light emitting bodies 10u to 10w making up the group of the light emitting elements, as the light emitting bodies 10j to 10s shown in FIGS. 18A to 25C, is of a type of the substrate surface light emitting type in which light is emitted in a downward direction of the substrate 11 and in which a display can be seen from a lower face of the substrate 11 toward a surface of stacked layers.

In each of the light emitting bodies 10u shown FIGS. 26A to 26B, a transparent electrode layer 21u is formed on the substrate 11 by a patterning method and a light emitting layer 30u is formed on the transparent electrode layer 21u by the pattern method. On a pattern for the light emitting material layer 30u is formed a pattern for an upper electrode layer 23u in a manner that the upper electrode layer 23 covers all regions of the pattern for the light emitting layer 30u. A plurality of such the light emitting bodies 10v as described above is arranged in vertical and horizontal directions.

Figure 27B:
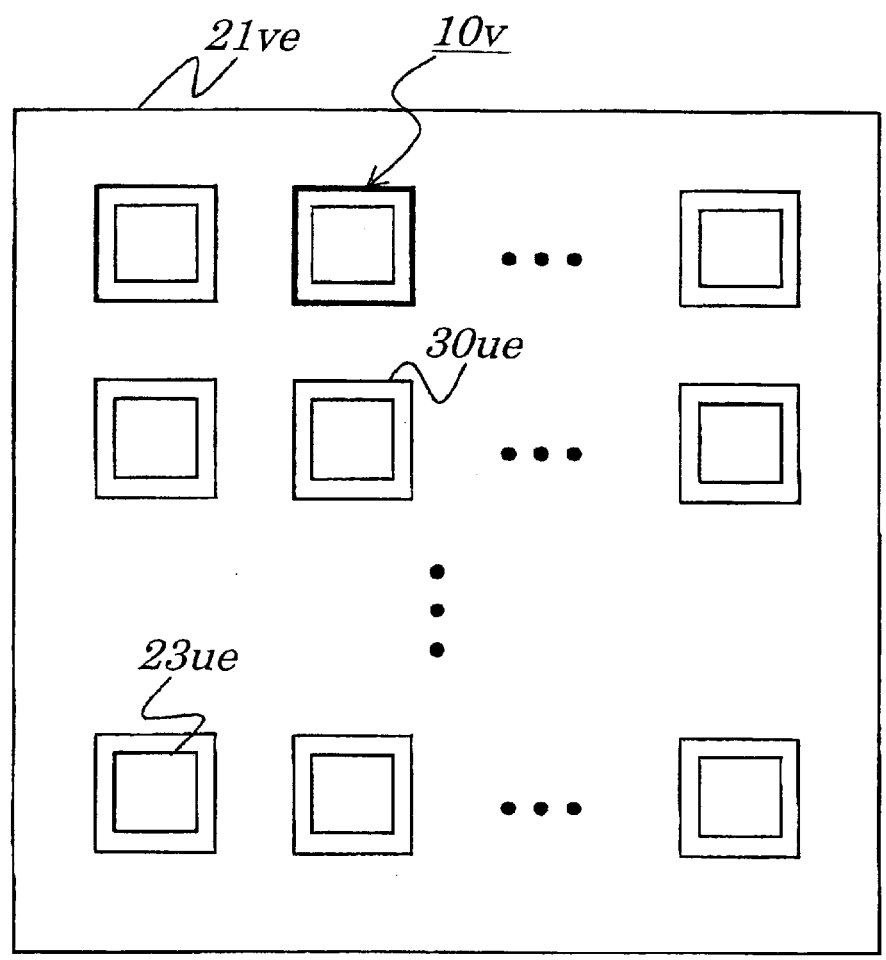
Figure 28A:
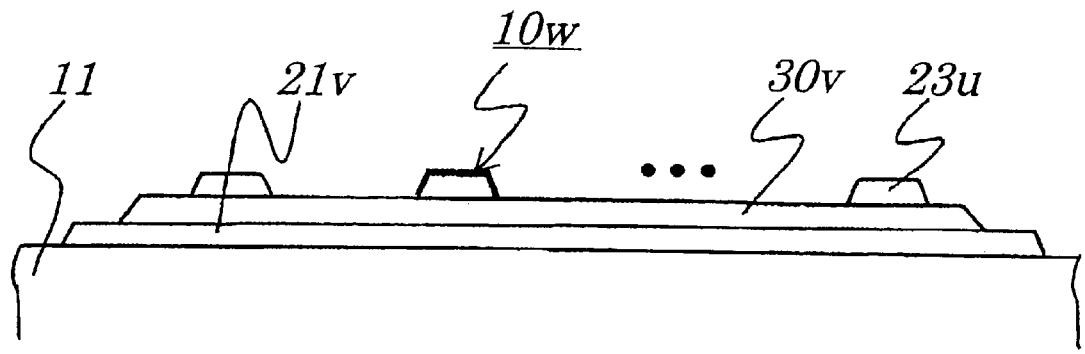
FIG. 28A is a cross-sectional view of a group of still other light emitting elements and FIG. 28B is a plan view conceptually illustrating the group of the still other light emitting elements according to the sixth embodiment of the present invention.
Figure 28B:
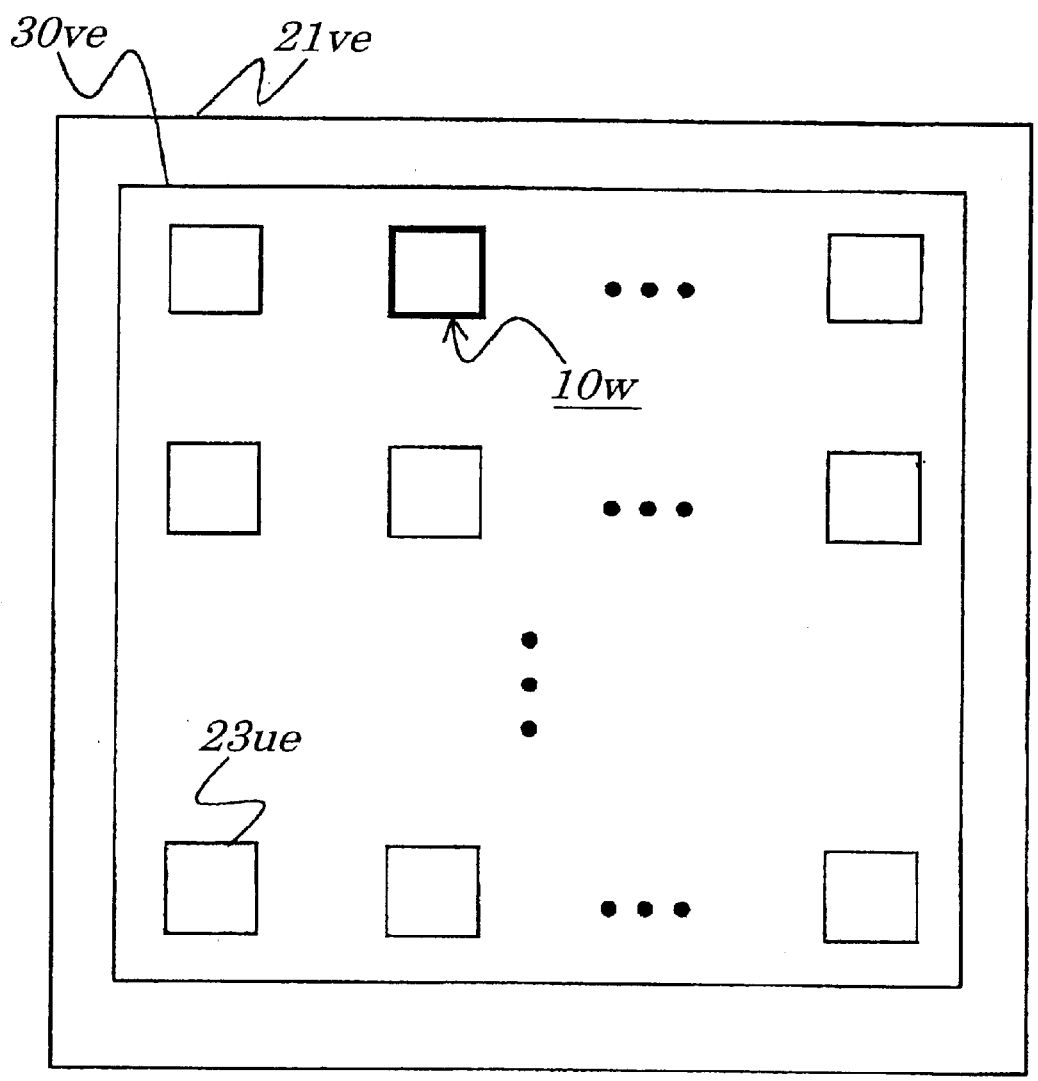

A group of the light emitting bodies 10v shown in FIGS. 27A and 27B differs from that shown in FIGS. 26A and 26B in that a transparent electrode layer 21v is formed on the substrate 11 commonly for all the light emitting bodies 10v being arranged in vertical and horizontal directions. Therefore, the pattern of the transparent electrode layer 21v exists under patterns of the plurality of the light emitting material layers 30u. On the pattern of each of the light emitting material layers 30u is formed a pattern of each of the upper electrode layers 23u.

In FIG. 27A, though the pattern of the transparent electrode layer 21 is formed commonly for all the light emitting bodies 10v, it may be formed only for two or more light emitting bodies 10v. Therefore, each of the light emitting bodies 10v is made up of the transparent electrode layer 21v, which serves to support commonly other two or more light emitting bodies, light emitting material layer 30u and upper electrode layer 23u.

A group of the light emitting bodies low shown in FIGS. 28A and 28B differs from that shown in FIGS. 27A and 27B in that a pattern for the transparent electrode layer 21v is formed, by a patterning method, on the substrate commonly for all the light emitting bodies 10w and a pattern for the light emitting body layer 30v is formed, by the patterning method, on the transparent electrode layer 21v for all the light emitting bodies low. That is, the pattern of the transparent electrode layer 21v supports the pattern of the light emitting material layer 30v which supports commonly all the light emitting bodies low.

In FIG. 28A, though the pattern of the transparent electrode layer 21v is formed commonly for all the light emitting bodies 10w and the pattern for the transparent electrode layer 30v is formed also commonly for all the light emitting bodies low, they may be formed only for two or more light emitting bodies low. Therefore, each of the light emitting bodies low is made up of the transparent electrode layer 21v which serves to support commonly two or more light emitting bodies low, light emitting material layer 30v which also serves to support commonly two or more light emitting bodies low and upper electrode layer 23u.

As a material for the transparent electrode layer 21u and 21v, the substance "In$_{2-x}$Sn$_x$O$_{3-y}$ (0.05≦y≦0.2)" is used which contains a mixture of an oxide of indium with tin as a chief component.

Configurations of the group of the light emitting elements are described by referring to FIG. 26A to FIG. 28, however, it is needless to say that the light emitting body explained in the fifth embodiment can be used in the example shown in FIG. 26 to FIG. 28.

Seventh Embodiment

Figure 29A:
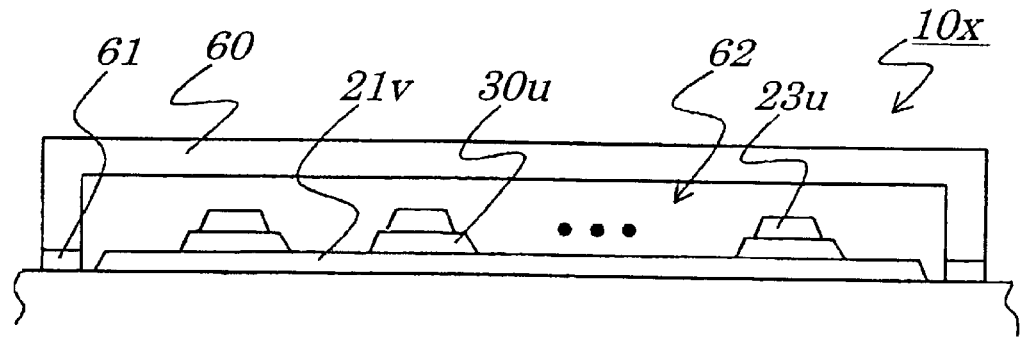
FIG. 29A is a cross-sectional view of a light emitting body made up of a group of light emitting elements and FIG. 29B is a plan view conceptually illustrating the light emitting body according to a seventh embodiment of the present invention.
Figure 29B:
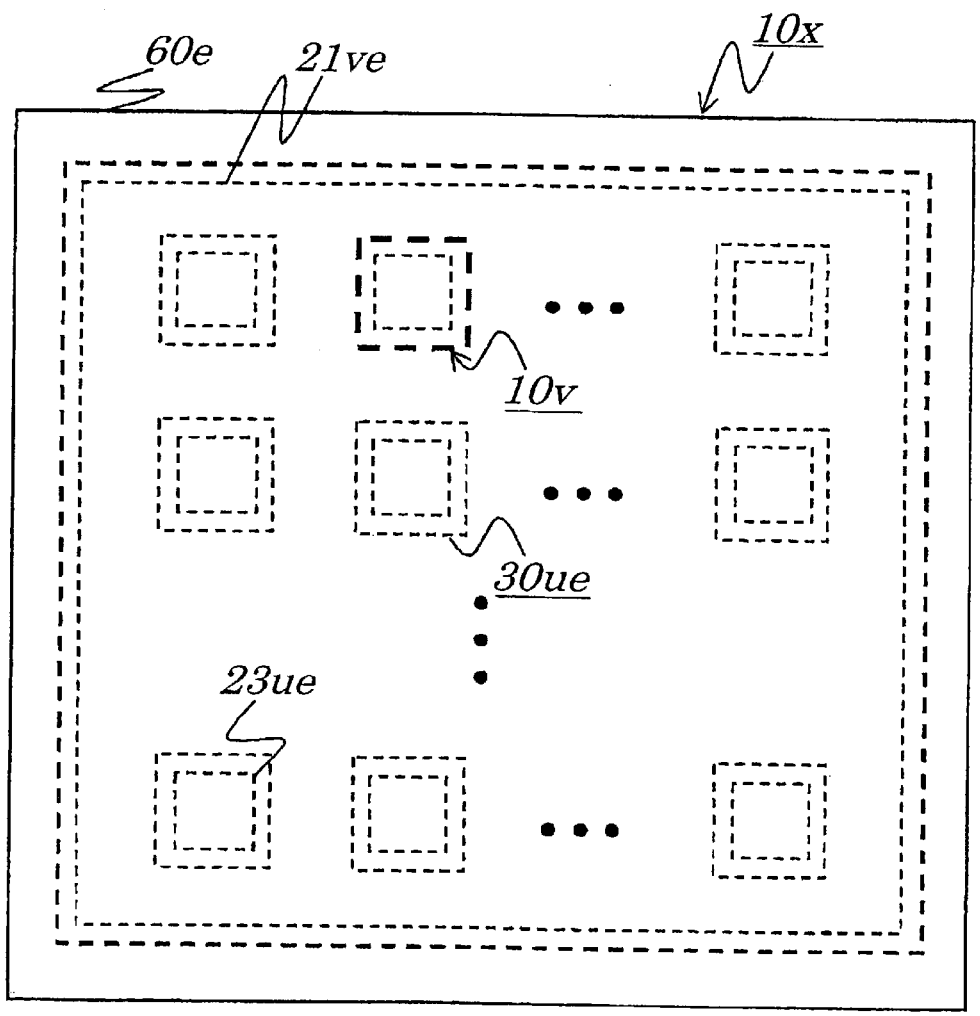

One example of a light emitting body lox made up of a group of light emitting elements will be described by referring to FIG. 29A and FIG. 29B. FIG. 29A is a cross-sectional view of the light emitting body lox made up of a group of light emitting elements and FIG. 29B is a plan view conceptually illustrating the light emitting body lox according to a seventh embodiment of the present invention. In the light emitting body lox, as shown in FIG. 29A, an entire group of light emitting elements is sealed in a hermetic manner and its inner part is filled with inert gas.

The light emitting body 10x is so configured that an encapsulating member 60 is placed around the group of light emitting bodies 10v provided in FIGS. 27A and 27B and an adhesive 61 is put between the encapsulating member 60 and the substrate 11. The encapsulated space is filled with inert gas 62. That is, by one encapsulating member 60, the plurality of light emitting bodies 10v is encapsulated to produce one light emitting body lox.

In this description, only one example of the encapsulated structure is shown using the light emitting body 10v, however, the same encapsulating method as explained here may be applied to other light emitting body or an aggregate of such light emitting bodies described in the above embodiment.

Eighth Embodiment

Figure 30A:
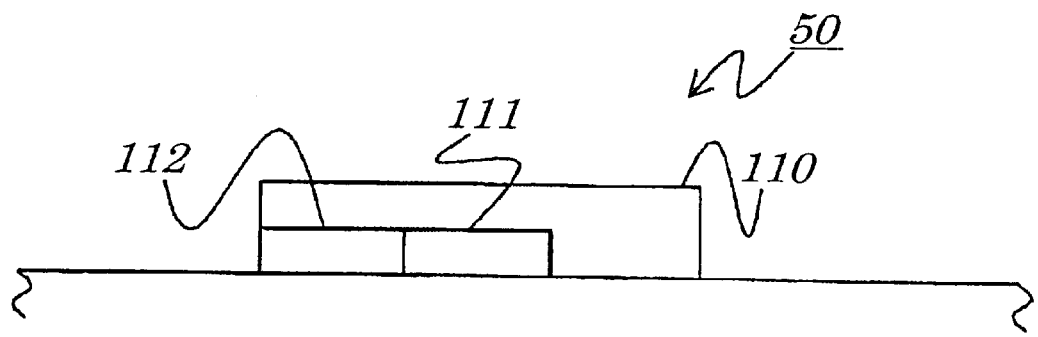
FIG. 30A is a cross-sectional view of a light emitting element portion and FIG. 30B is a plan view of the light emitting element portion according to an eighth embodiment of the present invention.
Figure 30B:
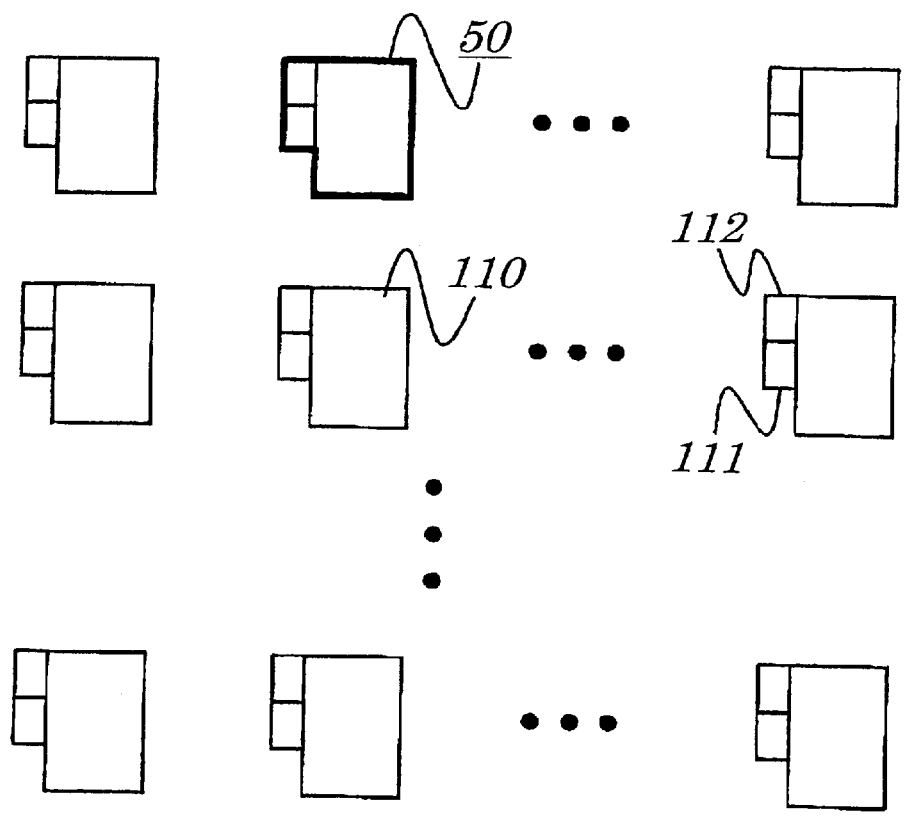

Configurations of a light emitting element portion 50 containing an element required for light emission of a light emitting body will be described by referring to FIGS. 30A and 30B. FIG. 30A is a cross-sectional view of the light emitting element portion 50 and FIG. 30B is a plan view of the light emitting element portion 50 according to the eighth embodiment of the present invention. Each size of the light emitting element portion 50 and each arrangement illustrated in FIGS. 30A and 30B are only to provide positional relations in the light emitting element portion 50 and which are provided just for reference.

As shown in FIGS. 30A and 30B, the light emitting element portion 50 is made up of a light emitting element serving as a light emitting body 110, a current supplying element 111 and a switching element 112. The light emitting element 110 is connected to the current supplying element 111 and the current supplying element 111 is connected to the switching element 112.

As shown in FIG. 30B, a plurality of the light emitting element portions 50 is arranged.

Any of the light emitting bodies 10a to 10w described above may be the light emitting element 110 shown in FIGS. 30A and 30B.

Ninth Embodiment

Figure 31:
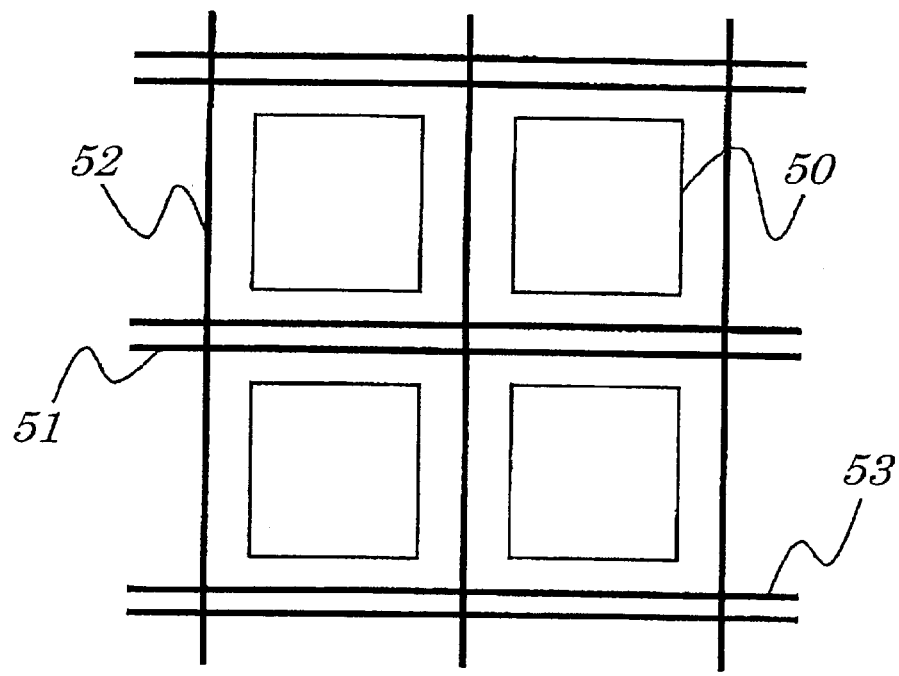
FIG. 31 is a plan view illustrating a positional relation between wirings and the light emitting element portion shown in FIGS. 30A to 30B according to a ninth embodiment of the present invention.
Figure 32:
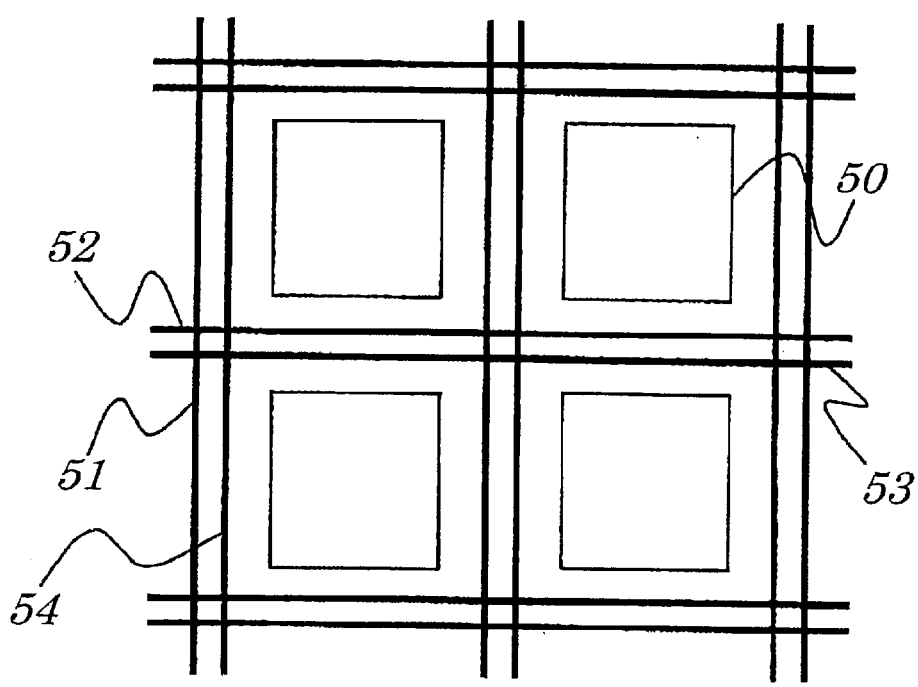
FIG. 32 is a plan view illustrating a positional relation between wirings and another light emitting element portion according to the ninth embodiment of the present invention.
Figure 33:
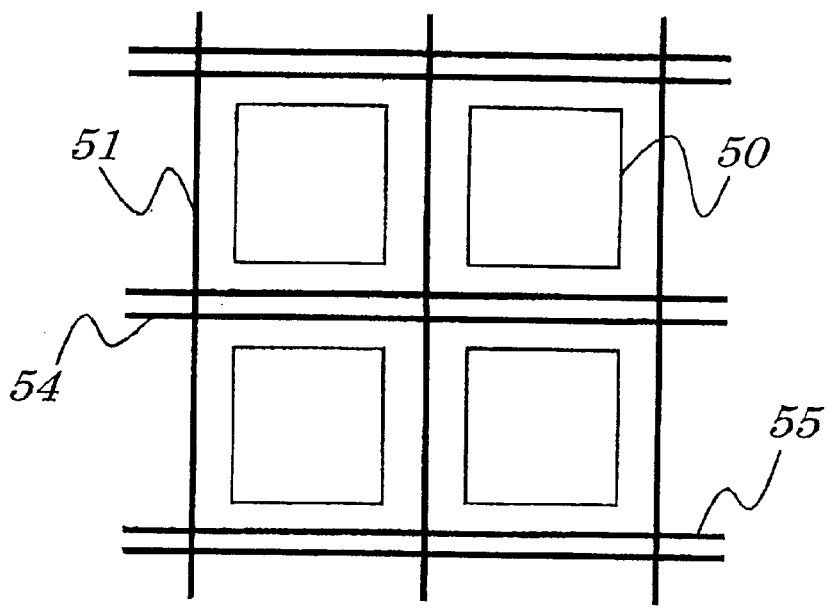
FIG. 33 is a plan view illustrating a positional relation between wirings and still another light emitting element portion according to the ninth embodiment of the present invention.

States of wirings for a plurality of light emitting element portions 50 described in the eighth embodiment being arranged in vertical and horizontal directions will be explained by referring to FIGS. 31 to 33. FIG. 31 is a plan view illustrating a positional relation between wirings and the light emitting element portion 50 according to the ninth embodiment of the present invention. FIG. 32 is a plan view illustrating a positional relation between wirings and another light emitting element portion 50 according to the ninth embodiment. FIG. 33 is a plan view illustrating a positional relation between wirings and still another light emitting element portion 50 according to the ninth embodiment. As shown in FIGS. 31 to 33, a first switching wiring 51, a second switching wiring 52, a ground wiring 53, a current supplying wiring 54 and a common wiring 55 are provided to the light emitting element portion 50. As explained by referring to FIG. 30A, the light emitting element portion 50 is connected to the current supplying element being connected to the switching element. The wirings are provided in vertical and horizontal directions. The light emitting element portion 50 is placed between the wirings provided in the vertical direction and the wirings provided in the horizontal direction.

In FIG. 31, a plurality of the light emitting element portions 50 is arranged in vertical and horizontal directions. The first switching wiring 51 and the ground wiring 53, as a pair, extend in a horizontal direction while the second switching wiring 52 extends in a vertical direction. Each of the light emitting element portions 50 is surrounded by the first switching wiring 51, second switching wiring 52, and ground wiring 53.

In the example, the ground wiring 22 extends in a horizontal direction, however, may extend in a vertical direction.

In FIG. 32, a plurality of the light emitting element portions 50 is arranged in vertical and horizontal directions. The second switching wiring 52 and the ground wiring 53, as a pair, extend in a horizontal direction while the first switching wiring 51 and the current supplying wiring 54, as a pair, extend in a vertical direction. Each of the light emitting element portions 50 is surrounded by the current supplying wiring 54, ground wiring 53, and second switching wiring 52.

In the example, the ground wiring 53 extents in a horizontal direction, however, may extend in a vertical direction. Moreover, the current supplying wiring 54 extends in a vertical direction, however, may extends in a horizontal direction.

In FIG. 33, the current supplying wiring 54 and a common wiring 55 which can be used commonly as the ground wiring 53 and the second switching wiring 52, as a pair, extend in a horizontal direction while the first switching wiring 51 extends in a vertical direction.

In the example, the current supplying wiring 54 extends in a horizontal direction, however, may extend in a vertical direction.

Tenth Embodiment

Figure 34:
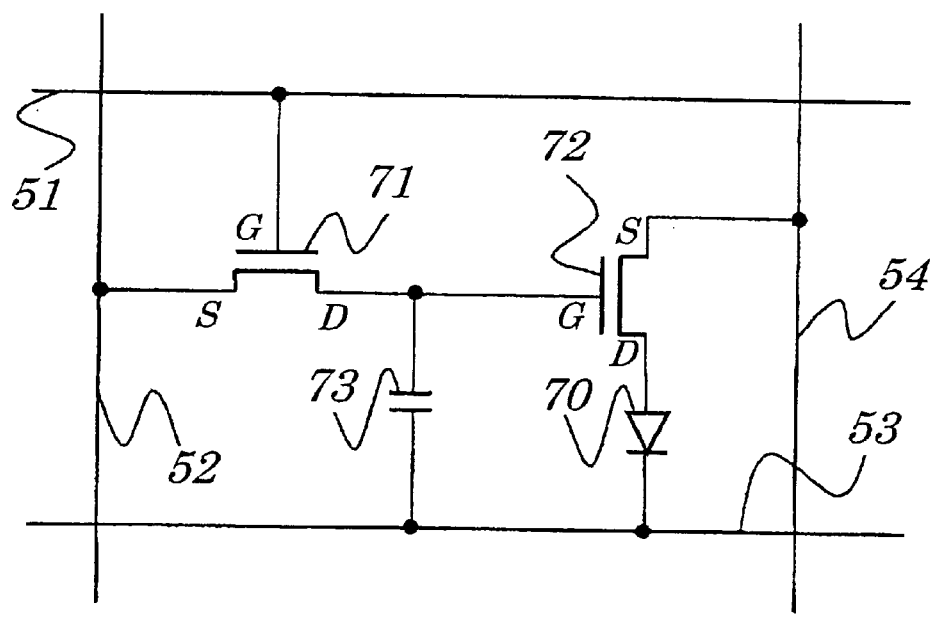
FIG. 34 is a circuit diagram showing a light emitting element portion and connection of wirings to a light emitting element portion according to a tenth embodiment of the present invention.

A circuit of alight emitting element portion of the present invention including a light emitting body 70, a switching transistor 71 serving as a switching element, a current supplying transistor 72 serving as a current supplying element and a voltage holding capacitor 73 and connection of wirings to the circuit will be described by referring to FIG. 34 to FIG. 39. FIG. 34 is a circuit diagram showing the light emitting element portion and connection of wirings to the light emitting element portion according to the tenth embodiment of the present invention. FIG. 34 is a circuit diagram of the light emitting element portion shown in FIG. 30A. In FIG. 34, same reference numbers are assigned to wirgns having same functions as in the ninth embodiment.

As shown in FIG. 34, a first switching wiring 51 extends in a horizontal direction and a second switching wiring 52 in a vertical direction. A gate 71G of the switching transistor 71 is connected to the first switching wiring 51 and a source 71S of the switching transistor 71 is connected to the second switching wiring 52. A drain 71D of the switching transistor 71 is connected to a gate 72G of the current supplying transistor 72 and to one terminal of the voltage holding capacitor 73. Another terminal of the voltage holding capacitor 73 is connected to a ground wiring 53. A source of the current supplying transistor 72 is connected to a current supplying wiring 54 and its drain 72D is connected to an anode of a light emitting body 70. A cathode of the light emitting body 70 is connected to the ground wiring 53.

In a state of connection of wirings described above, when a voltage is applied to the first switching wiring 51, the voltage is fed to the gate 71G of the first switching transistor 71, which causes the source 71S and drain 71D to be brought into conduction. In this state, when a voltage is applied to the second switching wiring 52, the voltage is fed to the gate 72G of the current supplying transistor 72, which causes an electric charge to be stored in the voltage holding capacitor 73. As a result, even if no voltage is applied to the first switching wiring 51 or to the second switching wiring 52, a voltage continues to be fed to the gate 72G of the current supplying transistor 72 until electric charges stored in the voltage holding capacitor 73 are erased. Thus, by application of the voltage to the gate 72G of the current supplying transistor 72, the source 72S and drain 72D become conducting and a current flows from the current supplying wiring 54 through the light emitting body 70 to the ground wiring 53 and, as a result, light is emitted from the light emitting body 70.

On the other hand, if no driving voltage is fed to either of the first switching wiring 51 or the second switching wiring 52, since a voltage is not applied to the gate 72G of the current supplying transistor 72, no current flows through the light emitting body and no light is emitted therefrom.

Figure 35:
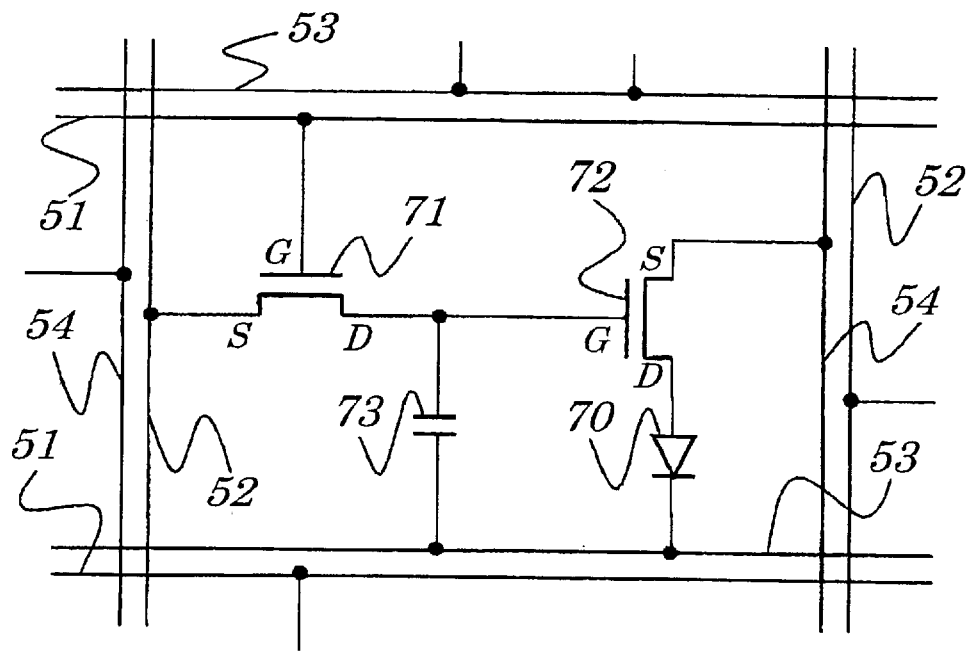
FIG. 35 is a circuit diagram showing another light emitting element portion and connection of wirings to the another light emitting element portion according to the tenth embodiment of the present invention.

FIG. 35 is also a circuit diagram showing another light emitting element portion 50 and connection of wirings to the another light emitting element portion 50 according to the tenth embodiment. As shown in FIG. 35, other wirings are added to the light emitting element portions 50 each being placed in an adjacent manner shown in FIG. 34. That is, a pair of the first switching wiring 51 and ground wiring 53 extends in a horizontal direction and a pair of the second switching wiring 52 and current supplying wiring 54 extends in a vertical direction.

Figure 36:
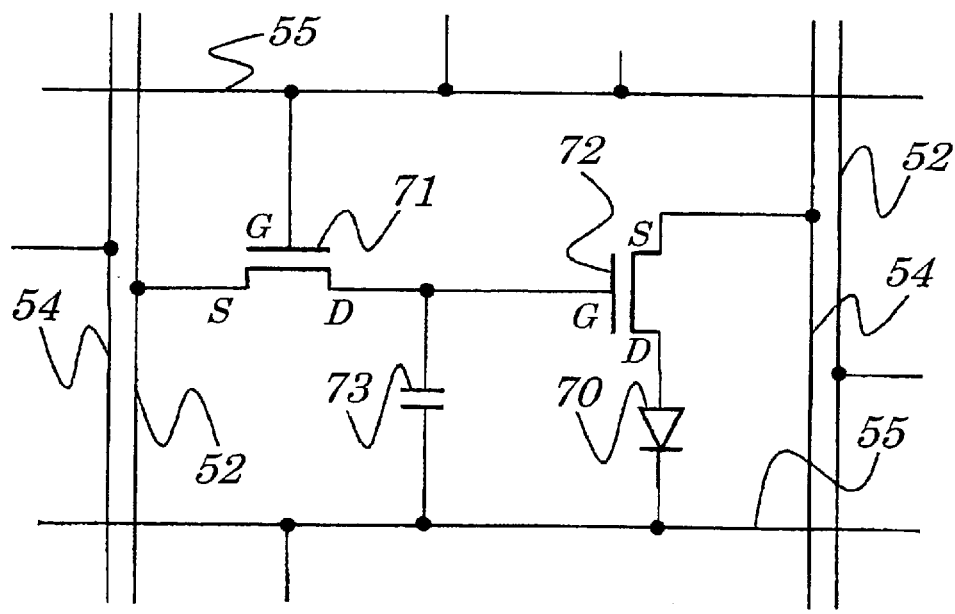
FIG. 36 is a circuit diagram showing still another light emitting element portion and connection of wirings to the still another light emitting element portion according to the tenth embodiment of the present invention.

FIG. 36 is also a circuit diagram showing still another light emitting element portion 50 and connection of wirings to the still another light emitting element portion 50 according to the tenth embodiment. As shown in FIG. 36, instead of the first switching wiring 51 and the ground wiring 53 used in FIG. 35, one common wiring 55 is used.

Figure 37:
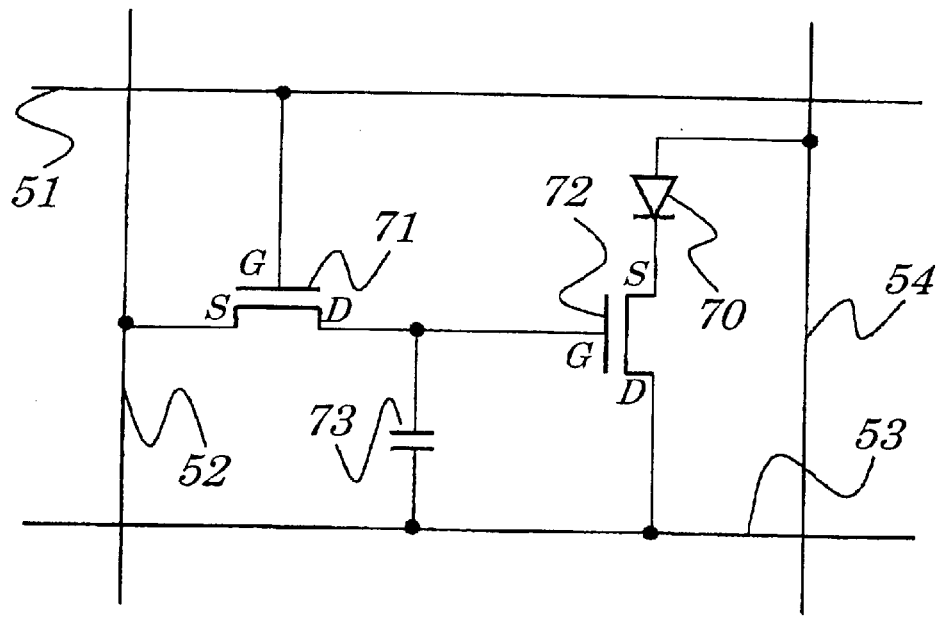
FIG. 37 is a circuit diagram showing still another light emitting element portion and connection of wirings to the still another light emitting element portion according to the tenth embodiment of the present invention.

FIG. 37 is also a circuit diagram showing still another light emitting element portion 50 and connection of wirings to the still another light emitting element portion 50 according to the tenth embodiment. As shown in FIG. 37, the light emitting body 70 being connected to the drain 72D of the current supplying transistor 72 in FIG. 34 is connected to the source 72S of the current supplying transistor 72. That is, the source 72S of the current supplying transistor 72 is connected to the light emitting body 70 and the drain 72D is connected to the ground wiring 53. An anode of the light emitting body 70 is connected to a current supplying source 191.

By configuring as above, when a driving voltage is simultaneously applied to the first switching wiring 51 and second switching wiring 52, as described above, a stable potential can be applied to the gate 72G of the current supplying transistor 72. Therefore, a current flows from the current supplying wiring 54 through the light emitting body 70, the source and drain of the current supplying transistor 72 to the ground wiring 53. As a result, light is emitted from the light emitting body 70.

On the other hand, if no driving voltage is fed to either of the first switching wiring 51 or the second switching wiring 52, since a voltage is not applied to the gate 72G of the current supplying transistor 72, no current flows through the light emitting body .70 and, as a result, no light is emitted therefrom.

Figure 38:
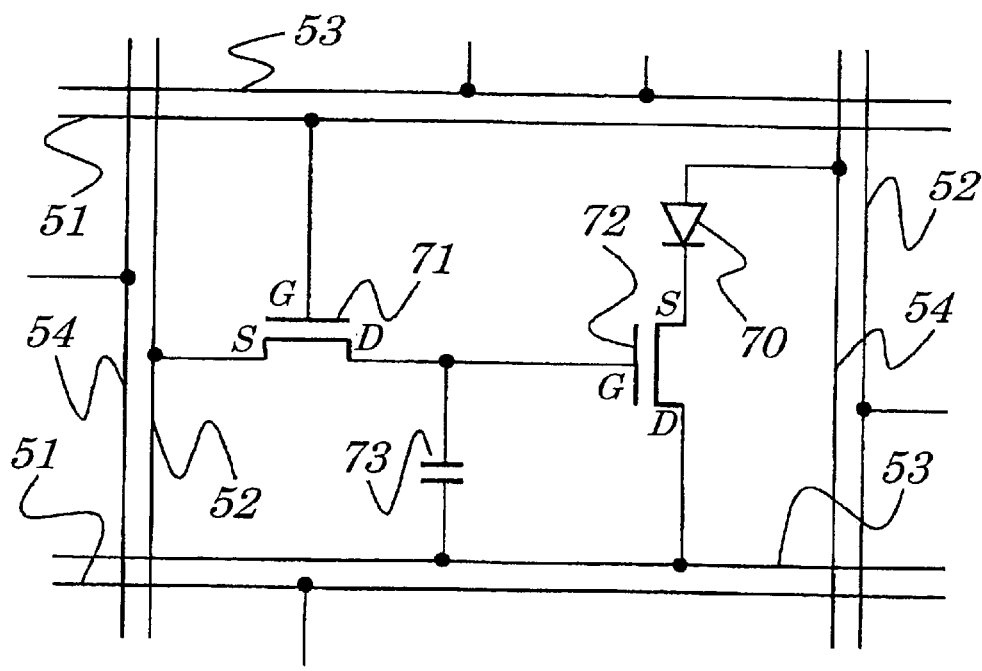
FIG. 38 is a circuit diagram showing still another light emitting element portion and connection of wirings to the still another light emitting element portion according to the tenth embodiment of the present invention.

FIG. 38 is also a circuit diagram showing still another light emitting element portion 50 and connection of wirings to the still another light emitting element portion 50 according to the tenth embodiment. As shown in FIG. 38, other wirings are added to the light emitting element portions 50 each being placed in an adjacent manner shown in FIG. 37. That is, a pair of the first switching wiring 51 and ground wiring 53 extends in a horizontal direction and a pair of the second switching wiring 52 and current supplying wiring 54 extends in a vertical direction.

Figure 39:
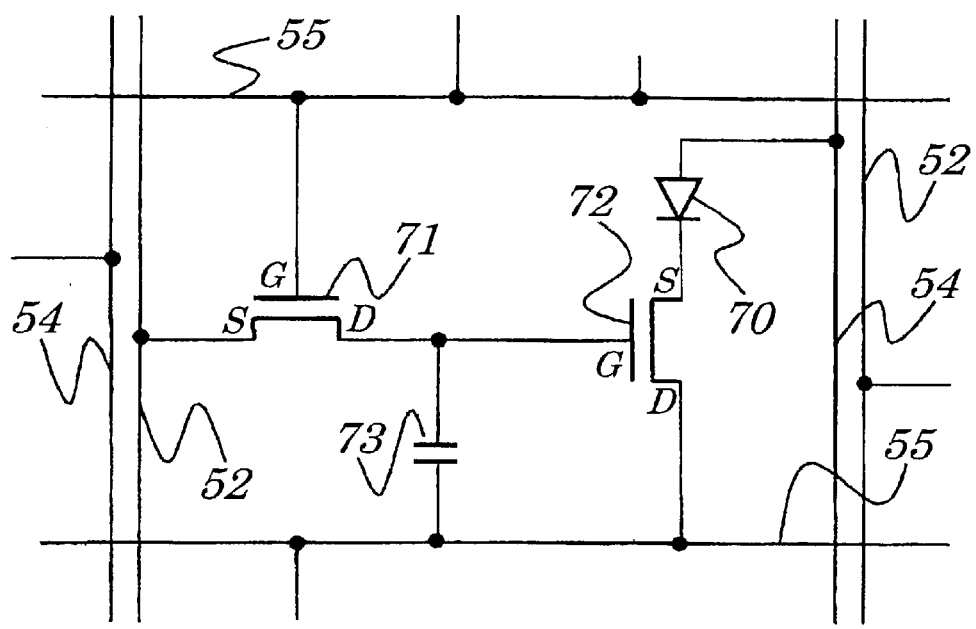
FIG. 39 is a circuit diagram showing still another light emitting element portion and connection of wirings to the still another light emitting element portion according to the tenth embodiment of the present invention.

FIG. 39 is also a circuit diagram showing still another light emitting element portion 50 and connection of wirings to the still another light emitting element portion 50 according to the tenth embodiment. As shown in FIG. 39, instead of the first switching wiring 51 and the ground wiring 53 used in FIG. 38, one common wiring 55 is used.

Eleventh Embodiment

Figure 40:
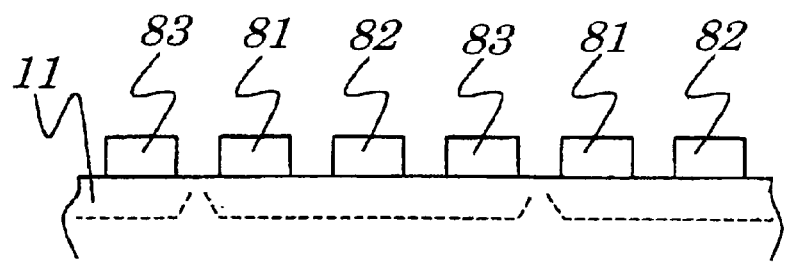
FIG. 40 is a cross-sectional view of an arrangement of light emitting elements serving to produce a color according to an eleventh embodiment of the present invention.

An arrangement of light emitting elements 81 to 83 serving to produce a color and a relation between the light emitting elements and a substrate will be described by referring to FIG. 40 to FIG. 42. FIG. 40 is a cross-sectional view of the arrangement of light emitting elements 81 to 83 serving to produce a color according to an eleventh embodiment. The light emitting element 81 for a first color, light emitting element 82 for a second color, and light emitting element 83 for a third color are alternately arranged on the substrate 11. Typically, the light emitting element 81 for the first color is made up of a light emitting element to produce a blue color, the light emitting element 82 for the second color is made up of a light emitting element to produce a green color and the light emitting element 82 for the second color is made up of a light emitting element to produce a red color.

Figure 41:
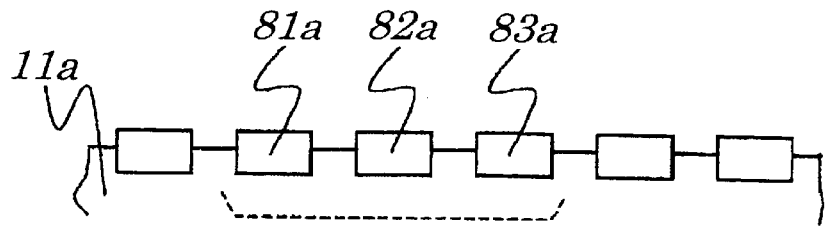
FIG. 41 is also a cross-sectional view of an arrangement of light emitting elements serving to produce a color according to the eleventh embodiment of the present invention.

FIG. 41 is also a cross-sectional view of an arrangement of light emitting elements 81a, 82a and 83a serving to produce a color according to the eleventh embodiment. As shown in FIG. 41, each of the light emitting elements 81a, 82a and 83a for the first, second and third colors being arranged alternately is partially buried in the substrate 11a. Typically, the light emitting element 81a for the first color is made up of a light emitting element to produce a blue color, the light emitting element 82a for the second color is made up of a light emitting element to produce a green color and the light emitting element 82a for the second color is made up of a light emitting element to produce a red color.

Figure 42:
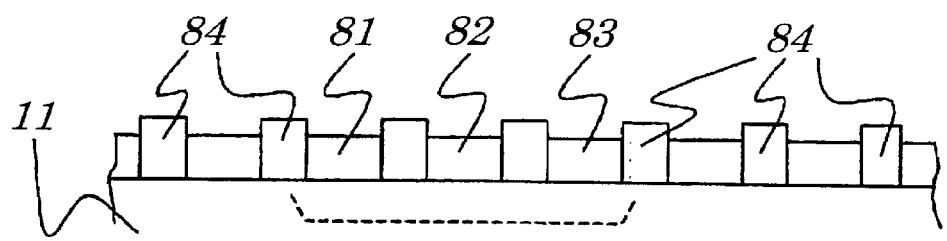
FIG. 42 is also a cross-sectional view of an arrangement of light emitting elements serving to produce a color according to the eleventh embodiment of the present invention.

FIG. 42 is also a cross-sectional view of an arrangement of light emitting elements serving to produce a color according to the eleventh embodiment. As shown in FIG. 42, a rib 84 is formed among the light emitting elements 81a, 82a and 83a for the first, second and third colors being arranged alternately. That is, the rib 84 is formed between the light emitting elements 81a and 82a and between the light emitting elements 82a and 83a. Other configurations shown in FIG. 42 are the same as in FIG. 40.

Next, a layer structure of each light emitting element will be described by referring to FIG. 43 to FIG. 45.

Figure 43:
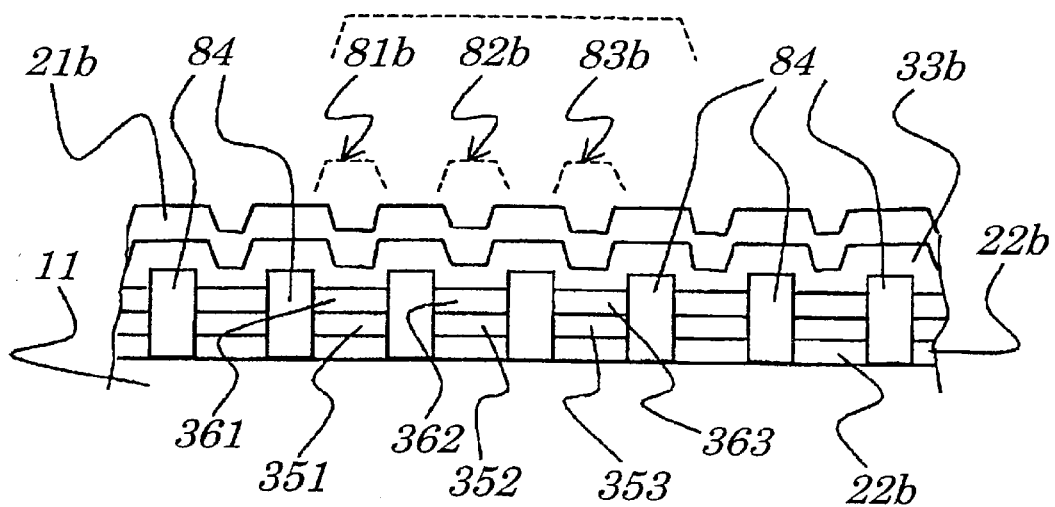
FIG. 43 is a cross-sectional view illustrating an arrangement of a light emitting element to produce a color and its layer configuration.

FIG. 43 is a cross-sectional view illustrating an arrangement of the light emitting element to produce a color and its layer configuration. As shown in FIG. 43, light emitting elements 81b, 82b, and 83b are partitioned by ribs 84. A hole injecting layer 33b covers all surfaces of the three-layer structured light emitting elements Bib, 82b and 83b including surfaces of the ribs 84. A transparent electrode layer 21b covers 4 all surfaces of the hole layer 33b. Therefore, the light emitting element 81b is so constructed that a lower electrode layer 22b is formed on a substrate 11, a first color electron transporting layer 351 is formed on the lower electrode layer 22, a first color light emitting layer 361 is formed on the first color electron transporting layer 351, the hole injecting layer 33 is formed on the fist color electron transporting layer 351 and a transparent electrode layer 21b is formed on the hole injecting layers. That is, the light emitting element 81b is five-layer structured. Other light emitting elements 82b and 83b have the same layer configurations as for the light emitting element Bib. Typically, the first color is given by blue color light, second color by green color light and third color by red color light.

Figure 44:
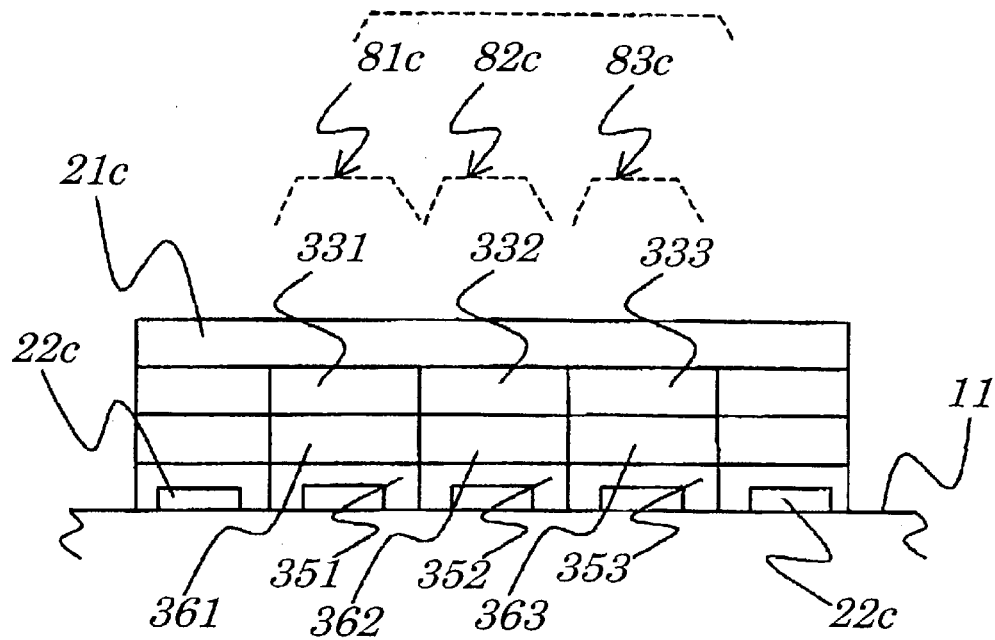
FIG. 44 is a cross-sectional view illustrating an arrangement of another light emitting element to produce a color and its layer configuration.

FIG. 44 is a cross-sectional view illustrating an arrangement of another light emitting element to produce a color and its layer configuration. As shown in FIG. 44, first, a plurality of patterns for a lower electrode layer 22c is formed on a substrate 11. Each of electron transporting layers 351 to 353 corresponding to each of three colors is formed so as to cover each of the patterns for the lower electrode layer 22c. Then, each of light emitting layers 361 to 363 is formed on each of the electron transporting layers 351 to 353. Each of hole injecting layers 331 to 333 is formed on the light emitting layers 361 to 363. A transparent electrode layer 21c covers all surfaces of each of hole injecting layers 331 to 333. The lower electrode layers 22c, the electron transporting layers 351 to 353, the light emitting layers 361 to 363 and hole injecting layers 331 to 333 are individually partitioned from each other and the partitioned layers are adjacent to each other. Therefore, for example, the light emitting element 81c is made up of five layers including the lower electrode layer 22c, electron transporting layer 351, light emitting layer 361, hole injecting layer 331 and transparent electrode layer 21c being stacked, in order, on the substrate 11. Other light emitting elements 82c and 83c have the same layer configurations as for the light emitting element 81b.

Figure 45:
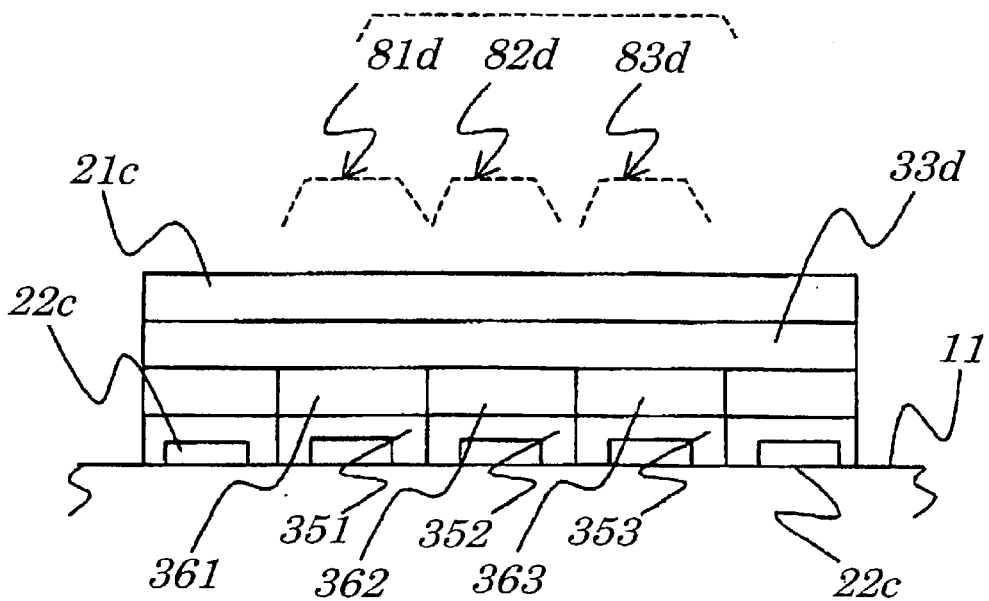
FIG. 45 is a cross-sectional view illustrating an arrangement of still another light emitting element to produce a color and its layer configuration.

FIG. 45 is also a cross-sectional view illustrating an arrangement of still another light emitting element to produce a color and its layer configuration. The light emitting element shown in FIG. 45 is different from that in FIG. 44 in a portion of a hole injecting layer 33d. That is, first, a lower electrode layer 22c is formed on a substrate 11. Each of electron transporting layers corresponding to each of three colors is formed on the lower electrode layer 22c so as to cover each of the electron transporting layers 351 to 353. Then, Each of light emitting layers 361 to 363 is formed on the electron transporting layers 351 to 353. A hole injecting layer 33d is formed on the light emitting layers 361 to 363 so as to cover all surfaces of the light emitting layers 361 to 363. A transparent electrode layer 21 is formed on the hole injecting layer 33d so as to cover all surfaces of the hole injecting layers 33d. The lower electrode layers 22c, the electron transporting layers 351 to 353, the light emitting layers 361 to 363 are individually partitioned from each other and partitioned layers are adjacent to each other.

Therefore, for example, the light emitting element 81d is made up of five layers including the lower electrode layer 22c, first color electron transporting layer 351, first color light emitting layer 361, hole injecting layer 33d and transparent electrode layer 21c being stacked in order on the substrate 11. Other light emitting elements 82d and 83d have the same layer configurations as for the light emitting element 81c.

Twelfth Embodiment

A positional relation between a light emitting body 410 and a substrate 411a will be described by referring to FIG. 46 and FIG. 47. The light emitting body 410 shown in FIGS. 46 and 47 is made up of five layers including a lower electrode layer 422, electron transporting layer 435, light emitting layer 436, hole injecting layer 433 and transparent electrode layer 421 being stacked in order on the substrate 411a.

Figure 46:
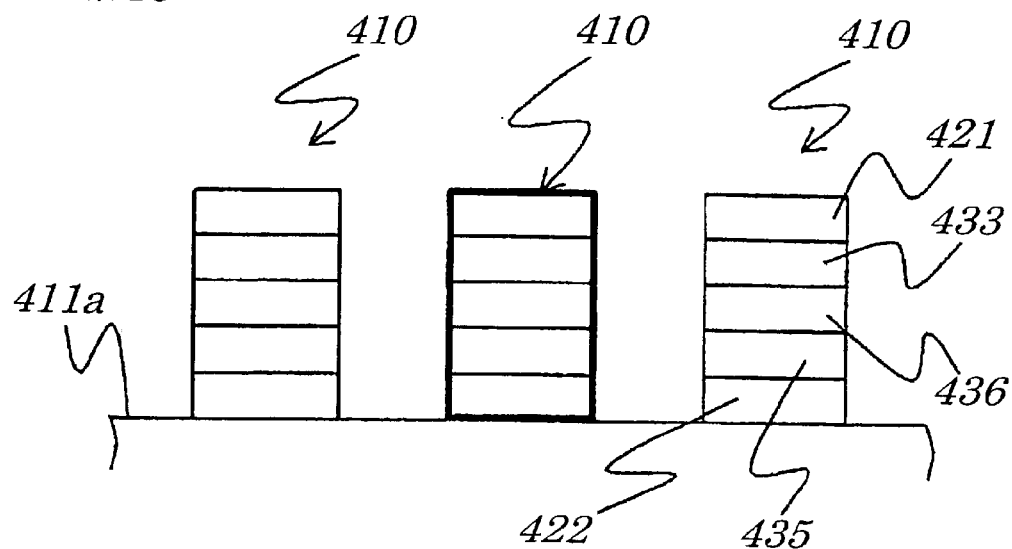
FIG. 46 is a cross-sectional view illustrating a positional relation between a light emitting body and a substrate according to a twelfth embodiment of the present invention.

FIG. 46 is a cross-sectional view illustrating the positional relation between the light emitting body 410 and the substrate 411a according to a twelfth embodiment. As shown in FIG. 46, a plurality of the light emitting bodies 410 is arranged at intervals with its lower electrode layer 422 being adhered on the plane substrate 411a.

Figure 47:
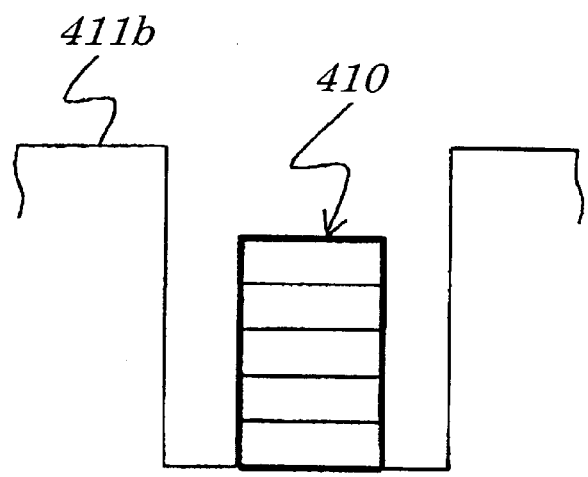
FIG. 47 is also a cross-sectional view illustrating a positional relation between another light emitting body and a substrate according to the twelfth embodiment of the present invention.

FIG. 47 is also a cross-sectional view illustrating a positional relation between another light emitting body 410 and a substrate 411b according to the twelfth embodiment. As shown in FIG. 47, the substrate 411b has a concave portion, in which a light emitting body 410 is placed with its lower electrode layer 422 being adhered on the plane substrate 411a.

Thirteenth Embodiment

Figure 48:
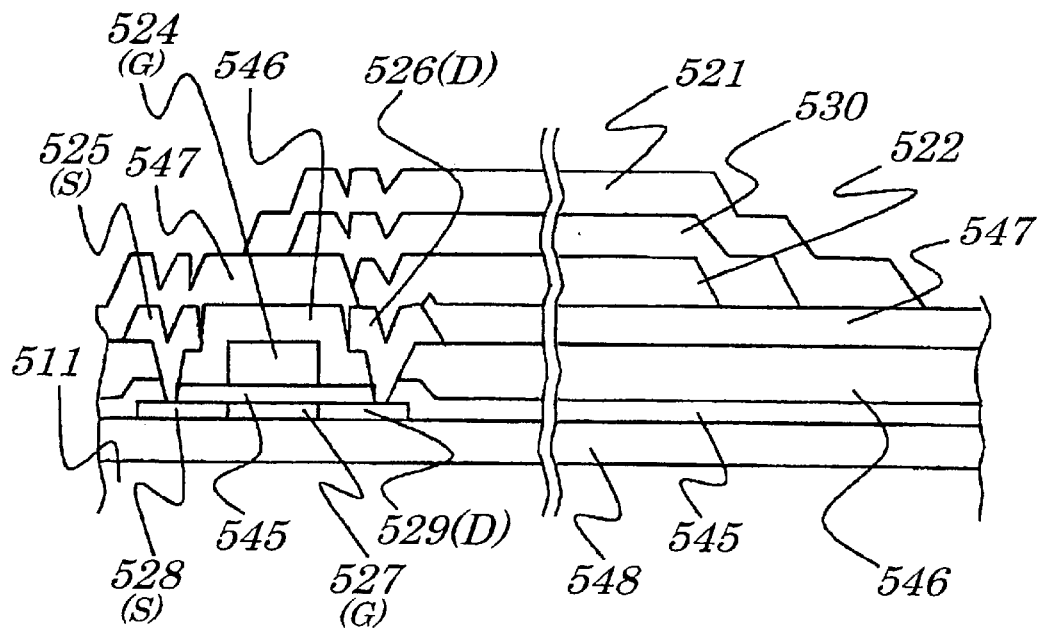
FIG. 48 is a cross-sectional view illustrating a configuration of a light emitting body (light emitting element) according to a thirteenth embodiment of the present invention.
Figure 49:
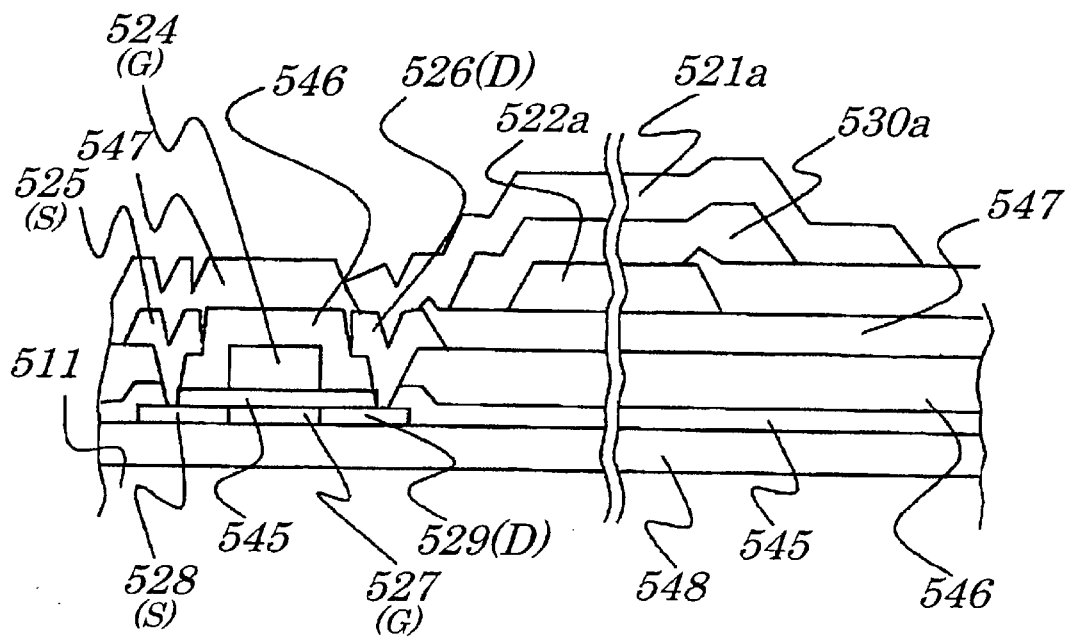
FIG. 49 is also a cross-sectional view illustrating a configuration of another light emitting body (light emitting element) according to the thirteenth embodiment of the present invention.

Configurations of a light emitting body will be described by referring to FIG. 48 and FIG. 49. The drawings show a connection between the light emitting body 10 shown in FIGS. 30A and 30B and the current supplying element 111 and its positional relation. Each size of the layer and each pattern illustrated in FIGS. 48 and 49 are only to provide positional relations in the layers and which are provided just for reference. In FIGS. 48 and 49, same reference numbers are assigned to components having same functions or configurations or being made from same materials as those described above. If a component in FIGS. 48 and 49 is made from the same material and the same function as that described above but has a shape different from that described above, a suffix "a" is added to a same numerical number as signed to each of the components in FIGS. 48 and 49. FIG. 48 is a cross-sectional view illustrating the configurations of the light emitting body (light emitting element) according to a thirteenth embodiment.

In FIG. 48, first, on a substrate 511 is formed a barrier layer 548. On the barrier layer 548 are formed Thin Film Transistors (TFT). Therefore, a gate section 527 of the TFT, a source section 528, and a drain section 529 are formed on the barrier layer 548. A gate insulating film 545 is formed on all surfaces of the gate section 527, source section 528 and drain section 529 and on all surfaces of the barrier layer 548. However, a hole is made in a portion of the gate insulating film 545 being located on the source section 528 and on the drain section 529 of the TFT.

Moreover, a gate electrode 524 is formed in a portion being located above the gate section 527 of the TFT on the gate insulating film 545. That is, the gate section 527 is insulated from the gate electrode 524 by the gate insulating film 545. A first interlayer dielectric 546 is formed on all surfaces of the gate insulating film 545 and of the gate electrode 524 formed on the gate insulating film 545. However, as in the case of the gate insulating film 545, a hole is made in a portion of the first interlayer dielectric 546 being located on the source section 528 and on the drain section 529 of the TFT. In one hole, a source electrode 525 is formed so as to be in contact with the source section 528 of the TFT. In another hole, a drain electrode 526 is formed so as to be in contact with the drain section 529 of the TFT.

Moreover, a second interlayer dielectric 547 is formed on the first interlayer dielectric 546, except on the drain electrode 526. Though not shown, a switching element is connected to the source electrode 525. On the second interlayer dielectric 547 is formed a pattern of a lower electrode layer 522 so as to be in contact with the drain electrode 526 being exposed upward. A light emitting material layer 530 is formed on the lower electrode layer 522 in a manner that the light emitting material layer 530 covers the lower electrode layer 522 and a transparent electrode layer 521 is then formed on the light emitting material layer 530.

The light emitting material layer 530 is made up of three layers including an electron transporting layer, light emitting layer and hole injecting layer being stacked in order, or of two layers including the light emitting layer serving also as the electron transporting layer and hole injecting layer being stacked in order or of a single layer of light emitting layer serving also as the electron transporting layer and as the hole injecting layer. Moreover, the light emitting material layer 53b and the transparent electrode layer 521 are formed in a form of an individual pattern. A pattern large enough to cover a plurality of components making up the light emitting body may be used.

FIG. 49 is also a cross-sectional view illustrating a configuration of another light emitting body (light emitting element) according to the third embodiment. Unlike in the case shown in FIG. 48, a lower electrode layer 522a is not in contact with a drain electrode 526 and a transparent electrode layer 521a is in contact with a drain electrode 526. Therefore, alight emitting material layer 530a is inserted between the lower electrode layer 522a and transparent electrode layer 521a.

Fourteenth Embodiment

Figure 50:
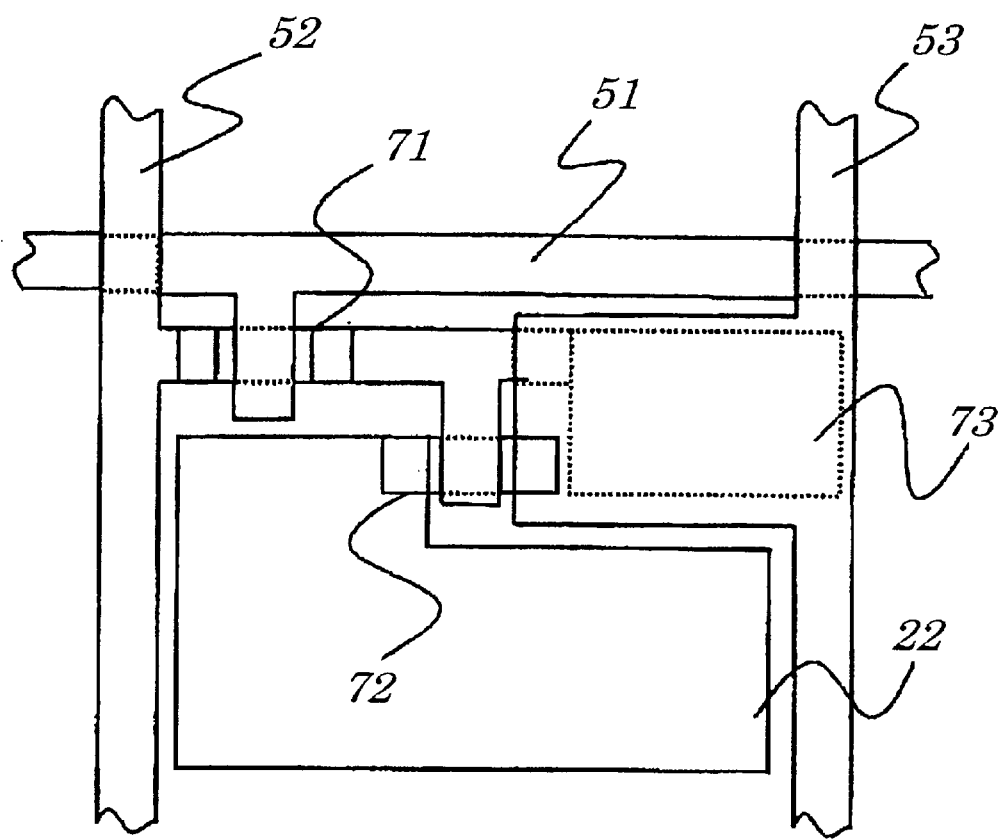
FIG. 50 is a plan view illustrating a structural relation between a light emitting element portion and its wiring according to a fourteenth embodiment of the present invention.

Plan structures of portions surrounding a light emitting element including a light emitting element portion and wirings will be described by referring to FIG. 50. FIG. 50 is a plan view illustrating a structural relation between the light emitting element portion and its wiring according to the fourteenth embodiment. It is presumed that the connection state shown in FIG. 37 is applied in the circuit shown in FIG. 50.

In FIG. 50, a first switching wiring 51 is a gate line which is connected to a gate section 71G of a switching transistor 71. A second switching wiring 52 is a data line which is connected to a source section 71S of a switching transistor 71. A drain section 71D of the switching transistor 71 is connected to both a gate section 72G of a current supplying transistor 72 and one terminal of a voltage holding capacitor 73 connected to a ground wiring 53. Another terminal of the voltage holding capacitor 73 is connected to the ground wiring 53. A source section 72S of a current supplying transistor 72 is connected to a lower electrode layer 22. Though not shown, on all surfaces of these gates, terminals, wirings, or a like shown in the drawing is a light emitting layer 30 and a transparent electrode layer 21 is further formed on the light emitting layer 30. The transparent electrode layer 21 is connected to a current supplying wiring 54 (not shown). A drain section 72D of the current supplying transistor 72 is connected to the ground wiring 53.

Fifteenth Embodiment

Each component making up a light emitting element will be described by referring to Table 1.

TABLE 1

| Components of light emitting element | |
|---|---|
| Substrate | Glass, resin, quarts |
| Transparent | ITO (Indium Tin Oxide) |

TABLE 1-continued

| Components of light emitting element | |
|---|---|
| electrode layer | Mixture of oxide of indium with tin |
| Metal electrode layer | MgAg, Al, LiAl |
| Electron transporting layer | Alumi-quinolinol (Alq) complex, PBD, TAZ, BND, Oxadiazole derivative (OXD), OXD-7, Polyphenylene vinylene (PPV) |
| Light emitting layer | Substance obtained by adding red fluorescent pigment to alumi-quinolinol complex, Alumi-quinolinol complex containing one kind of fluorescent substance, Beryllium benzoquinolinol complex containing one kind of fluorescent substance, Oxazole complex of zinc containing one kind of fluorescent substance, Precursor of conjugated polymer organic compound containing one kind of fluorescent substance. Precursor includes, for example, polyvinylene phenylene or its derivative. Fluorescent pigment includes Rhodamine B, distilbiphenyl, tetraphenyl butadiene, quinacridon and their derivatives. |
| Hole injecting layer | Triphenyldiamine derivative (TPD), Porphyrin compound of Copper (II) phthalocyanine, α-NPD |
| Anode buffer layer | CuPc, Polyaniline, Polythiophene |
| Protecting layer | Oxide of Al, Nitride of Al, Oxide of Si or their mixture |
| Hygroscopicity enhancing layer | Oxide of Ba |
| Switching element | Transistor |
| Current supplying element | Transistor |
| Switching wiring, current supplying wiring, common wiring and ground wiring | Al, Cu, Ta, Ru, WSi |

As shown above, as a material for the substrate, glass, resin, or quarts is used. As a material for the transparent electrode layer, ITO (Indium Tin Oxide) or mixture of an oxide of indium with tin is used. As a material for the metal electrode layer, silver magnesium (MgAg), Al (aluminum), or LiAl (aluminum lithium) is used. As a material for the electron transporting layer, alumi-quinolinol (Alq) complex, PBD, TAZ, BND, oxadiazole derivative (OXD), OXD-7, or polyphenylene vinylene (PPV) is used. As a material for the light emitting layer, the substance obtained by adding a red fluorescent pigment to alumi-quinolinol complex, alumi-quinolinol complex containing one kind of fluorescent substance, beryllium benzoquinolinol complex containing one kind of fluorescent substance, oxazole complex of zinc containing one kind of fluorescent substance, or a precursor of a conjugated polymer organic compound containing one kind of fluorescent substance is used. The precursor includes, for example, polyvinylene phenylene, or its derivative. The fluorescent pigment includes Rhodamine B, distilbiphenyl, tetraphenyl butadiene, quinacridon, and their derivatives.

As a material for the hole injecting layer, triphenyldiamine derivative (TPD), a porphyrin compound of copper (II) phthalocyanine, or α-NPD is used. As a material for the anode buffer layer, CuPc, polyaniline, or polythiophene is used. As a material for the protecting layer, an oxide of Al, nitride of Al, oxide of Si, or their mixture is used. As a material for the hygroscopicity enhancing layer, an oxide of Ba is used. As the switching element and current supplying element, transistors are used. Moreover, as a material for each of the switching wiring, current supplying wiring, common wiring and ground wiring, Al, Cu, Ta, Ru, or WSi is used.

Next, each component making up the switching transistor and current applying transistor will be described by referring to Table 2.

TABLE 2

| Components of transistor | |
|---|---|
| Each electrode of source, drain, and gate | Al, Cu, Ta, Ru, Wsi |
| Gate insulating film, interlayer dielectric, and barrier layer | Oxide of Al, nitride of Al, oxide of Si, nitride of Si, or their mixture |

As shown in Table 2, as a material for each of the source, drain and gate electrodes, Al, Cu, Ta, Ru, or Wsi is used. As a material for each of the gate insulating film, first interlayer dielectric, second interlayer dielectric and barrier layer, an oxide of Al, nitride of Al, oxide of Si, nitride of Si, or their mixture is used.

Next, components for encapsulation of the light emitting body will be explained by referring to Table 3.

TABLE 3

| Components for encapsulation of light emitting body | |
|---|---|
| Adhesive | UV (Ultraviolet) curing resin |
| Encapsulating material | Metal, glass, or resin |
| Sealing gas | Inert gas of $N_2$, $H_2$, or Ar |

As a material for the adhesive, the UV (Ultraviolet) curing resin is used. As a material for encapsulating components, metal, glass or resin is used. As a sealing gas, an inert gas such as $N_2$, $H_2$, or Ar is used.

Sixteenth Embodiment

A typical method for manufacturing a light emitting element portion will be described using the structure of the light emitting body shown in FIG. 48 by referring to FIG. 51A to FIG. 55B.

Figure 51A:
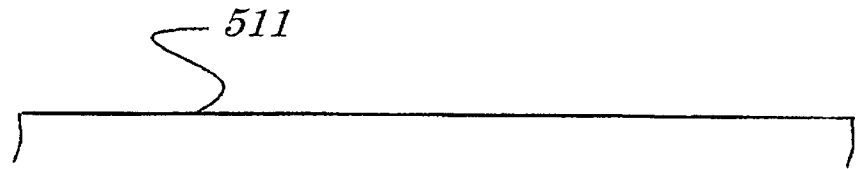
FIGS. 51A, 51B, and 51C are cross-sectional views illustrating a method for manufacturing a light emitting element portion at an initial stage according to a sixteenth embodiment of the present invention.
Figure 51B:
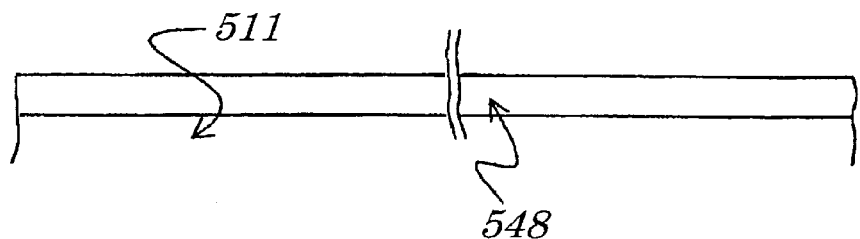
Figure 51C:
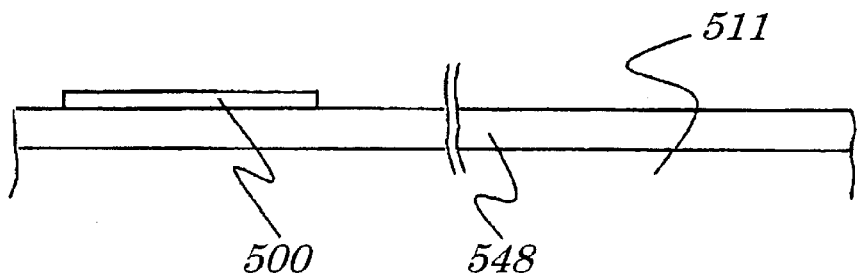

First, as shown in FIG. 51A, a substrate 511 is prepared. Typically, the substrate 511 is made from non-alkaline glass. Then, as shown in FIG. 51B, on the substrate 11 is formed a barrier layer 548 by a sputtering method or a CVD (Chemical Vapor Deposition) method. As shown in FIG. 51C, a silicon film 500 is formed by the sputtering method, CVD method, or a LP (Low Pressure) CVD method in which a temperature of, for example, about 500° C. is applied and is made polycrystalline by laser irradiation.

Figure 52A:
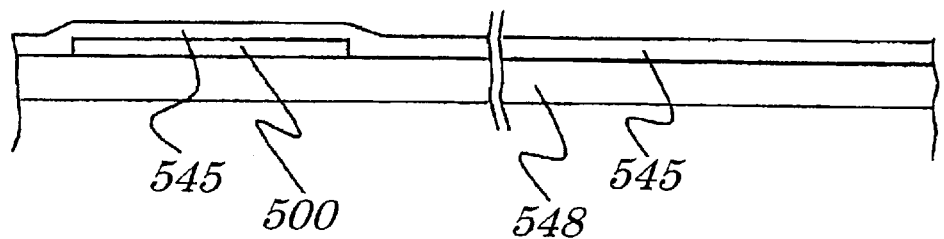
FIGS. 52A, 52B, and 52C are also cross-sectional view illustrating the method for manufacturing the light emitting element portion according to the sixteenth embodiment of the present invention.
Figure 52B:
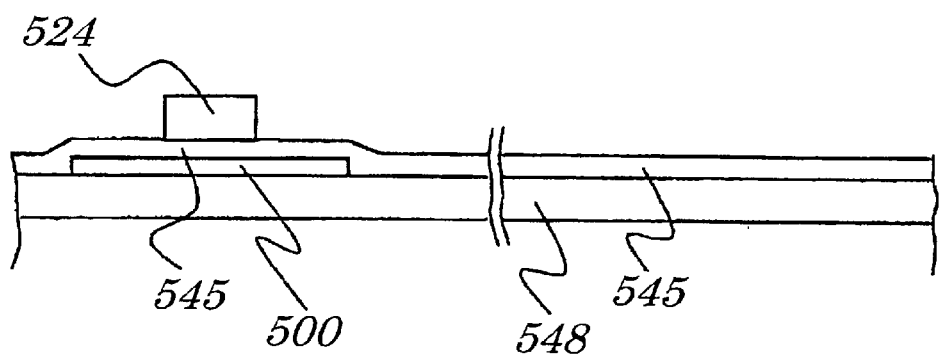

Then, as shown in FIG. 52A, a gate insulating film 545 is formed, by the sputtering method or the CVD method, on an upper 4E surface of the silicon film 500 and on surfaces of the barrier layer 548 being exposed. Typically, a "$SiO_2$" film is grown by a remote plasma CVD method.

Figure 52C:
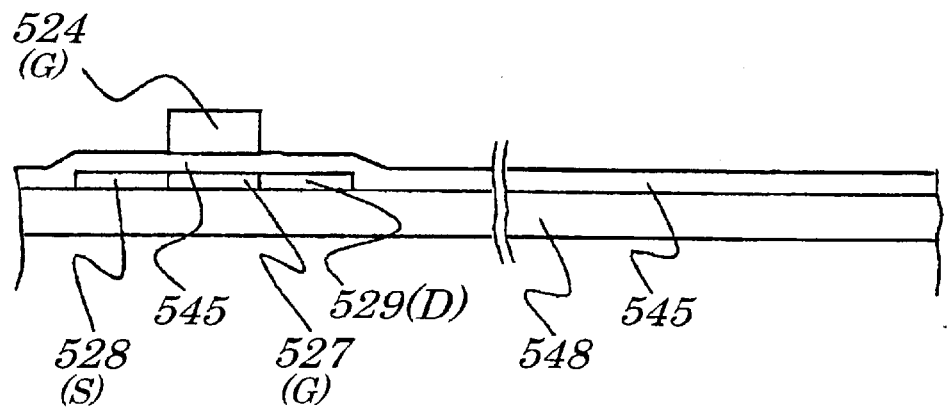

Then, as shown in FIG. 52C, a gate electrode 524 is formed in a center of an upper surface of the silicon film 500 which is also located above an upper face of the gate insulating film 545. A pattern for the gate electrode 524 is formed by first having agate electrode film, typically the "WSi" film grow by a sputtering method or by evaporation and then applying a photoresist by a spin coating method and performing patterning on the photoresist by exposure and development using an optical mask, and then removing a gate electrode film having no photoresist pattern by a milling method and then the photoresist by dissolving it in a solvent.

Next, as shown in FIG. 52C, after having coated portions other than the silicon film 500, by performing ion doping using boron or phosphorus, a source section 528 and a drain section 529 are formed. To activate the source section 528 and the drain section 529, heat treatment at a temperature of, for example, about 550° C. is done on them.

Figure 53A:
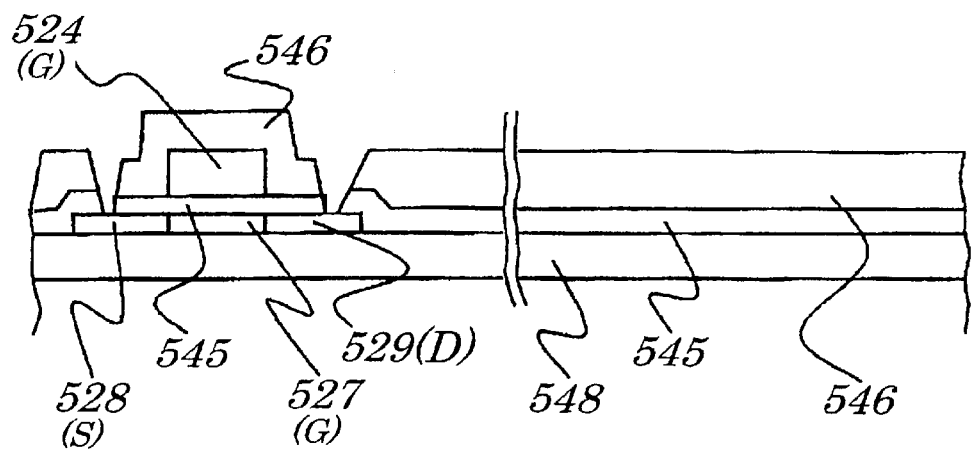
FIGS. 53A and 53B are also cross-sectional view illustrating the method for manufacturing the light emitting element portion according to the sixteeth embodiment of the present invention.

Next, as shown in FIG. 53A, a first interlayer dielectric 546 typically made from the "SiO$_2$" film is formed on the gate electrode 524 by the sputtering method or CVD method and then a hole is made by removing the gate insulating film 545 and the first interlayer dielectric 546 formed on the source section 528 and drain section 529. At this point, the same method as used in the patterning process of the gate electrode 524 is employed.

Figure 53B:
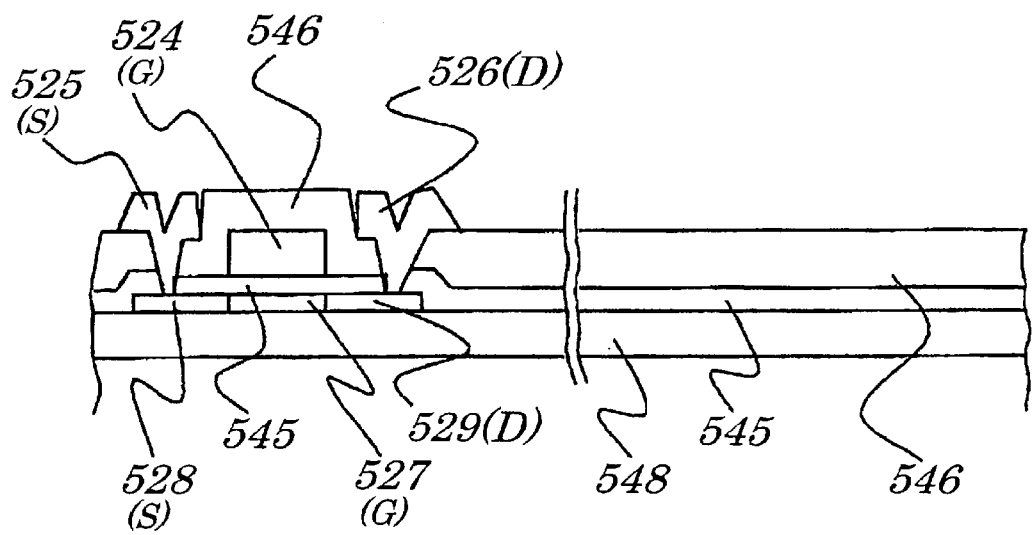

Then, as shown in FIG. 53B, a source electrode 525 and a drain electrode 526 both being made from aluminum (Al) are formed by a patterning method. Also, at this point, the same method as used in the patterning process of the gate electrode 524 is employed.

Figure 54A:
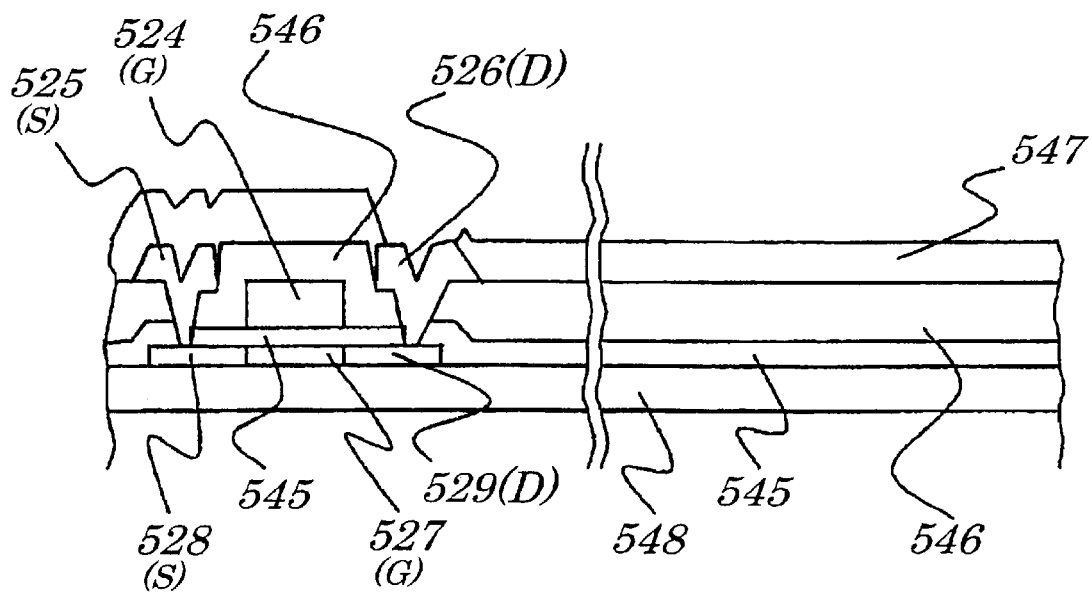
FIGS. 54A and 54B are also cross-sectional view illustrating the method for manufacturing the light emitting element portion according to the sixteenth embodiment of the present invention.

Next, as shown in FIG. 54A, a second interlayer dielectric Au 547 typically made up of the "SiO$_2$" film is formed by the patterning method. At this time, a part of an upper surface of the drain electrode 526 is exposed. Also, at this point, the same method as used in the patterning process of the gate electrode 524 is employed.

Figure 54B:
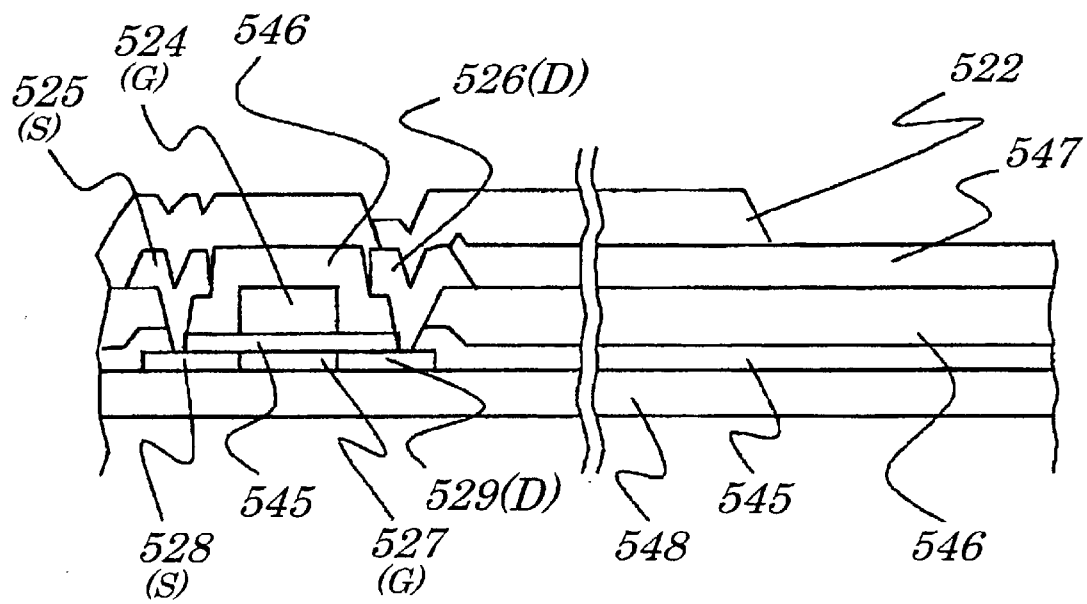

Then, as shown in FIG. 54B, a pattern for a lower electrode layer 522 made from metal is formed so that it covers an upper surface of the drain electrode 526 being exposed and an upper surface of the second interlayer dielectric 547. Also, at this point, the same method as used in the patterning process of the gate electrode 524 is employed.

Figure 55A:
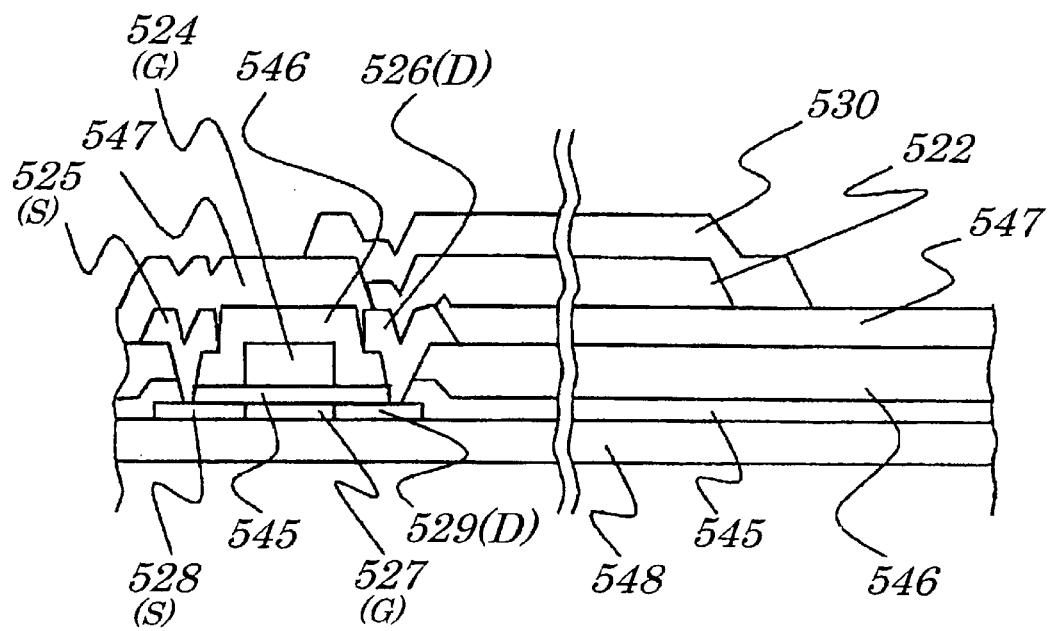
FIGS. 55A and 55B are also cross-sectional view illustrating the method for manufacturing the light emitting element portion according to the sixteenth embodiment of the present invention.

Next, as shown in FIG. 55A, a pattern for a light emitting material layer 530 is formed so that it covers the pattern for the lower electrode layer 522. To form the pattern for the light emitting material layer 530, a forming method by an evaporation method using a metal mask or an ink jet header.

Figure 55B:
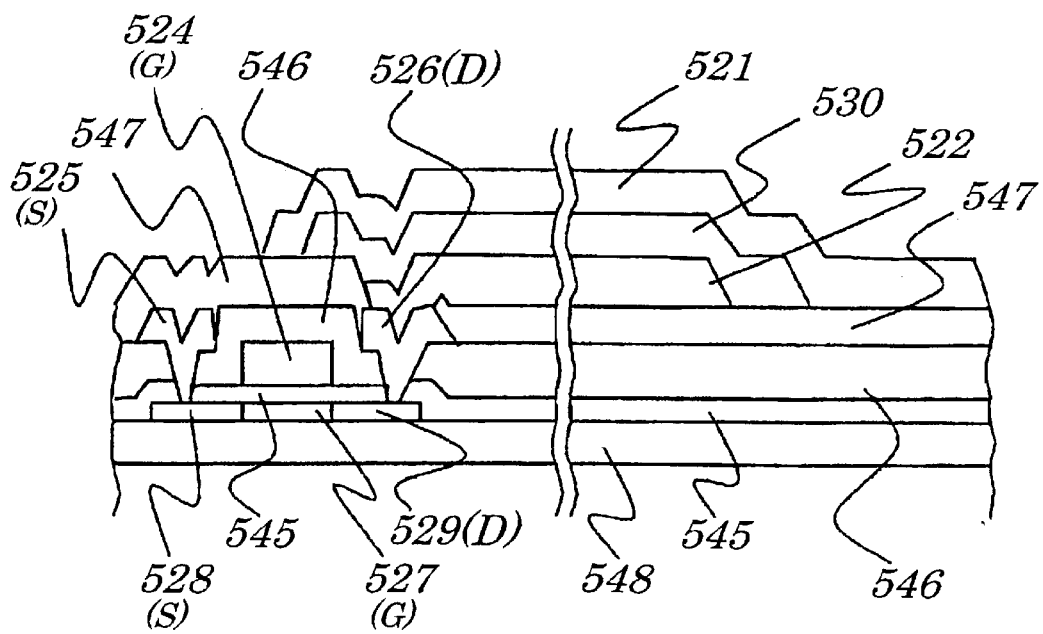

Next, as shown in FIG. 55B, a pattern for a transparent electrode layer 521 is formed so that it covers an upper surface of the pattern for the light emitting material layer 530. The transparent electrode layer 521 is formed by the sputtering method, CVD method, or the spin coating method, and then the same method as used in the patterning process of the gate electrode 524 is employed.

EXAMPLE

Results obtained by setting following conditions to a prototype of a light emitting display device using a light emitting element having configurations described below will be described. The light emitting body used in the prototype has the same layer structure as shown in FIG. 8D, that is, it is made up of the transparent electrode layer 21, anode buffer layer 41, hole injecting layer 33, light emitting layer 36 also serving as the electron transporting layer 35, upper electrode layer 23 and protecting layer 42 all being stacked in order on the substrate 11. Configurations of the light emitting body shown in FIGS. 18A to 18C are used here. Therefore, in this light emitting body, light is emitted downward to the substrate and a display is seen from a direction a lower side of the substrate 11 made up of the glass substrate upward an upper portion of stacked layers. The light emitting body is so constructed that, as shown in FIG. 27, the transparent electrode layer 21$v$ is formed which commonly supports the plurality of the light emitting bodies on the substrate 11 that, as shown in FIG. 29, the plurality of the light emitting bodies are encapsulated in a hermetic manner. Moreover, the light emitting body is so constructed that, as shown in FIG. 30, the switching element and the current supplying element are added and that, it has the configuration shown in FIG. 50 with the wirings shown in FIG. 35 connected.

One unit element is 30 $\mu$m×100 m in size and a display section using this unit element is 40 mm×40 mm in size.

In the prototype, non-alkaline glass is used as the material for the substrate, AlLi is used as the metal electrode layer, α-NPD is used as the material for the hole injecting layer and Alq is used as the material for the light emitting layer also serving as the electron transporting layer. Polyaniline is used as the material for the anode buffer layer. The substance "In$_{2-x}$Sn$_x$O$_{3-y}$" being the mixture of an oxide of indium with tin is used as the material for the transparent electrode layer. Aluminum (Al) is used as the material for the first switching wiring, second switching wiring and ground wiring.

The mixture of the oxide of indium with tin is produced by performing reactive sputtering using a substance "In$_{2-x}$Sn$_x$O$_{3-y}$" as a target in an atmosphere of Ar+O$_2$. A value of "y" in the In$_{2-x}$Sn$_x$O$_{3-y}$ film is changed by changing a ratio of O$_2$ to Ar. The value of "y" is obtained by analysis on the "In$_{2-x}$Sn$_x$O$_{3-y}$" film separately prepared, by a Rutherford back scattering (RBS) method. The value of "xx", contained in the film's structural formula "In$_{2-x}$Sn$_x$O$_{3-y}$" is a symbol value indicating that this value is not analyzed and that there is a possibility that there is a difference between the value "x" contained in the substance "In$_{2-x}$Sn$_x$" used as the target and the value "xx".

In the prototype using the light emitting body shown in FIG. 18C, as the material for the hygroscopicity enhancing layer, an oxide of barium (Ba) is used.

As the switching element and current supplying element, transistors are employed. Aluminum is used for the source electrode and the drain electrode of the transistor. Tungsten silicide is used for the gate electrode of the transistor. An oxide of silicon is used for the gate insulating film, first interlayer dielectric, second interlayer dielectric and barrier layer. The light emitting element, after being put in an atmosphere of nitrogen, is encapsulated by a metal cap.

After applying a voltage of 5 V to the anode made up of the transparent electrode in the light emitting device and applying a voltage of 5 V to all the first switching wirings (gate lines) in and all the second switching wirings (data lines), time required until light emitted from the light emitting element decreases in half is measured at a room temperature using a photometer.

Table 4 shows a relation between the value "y" in the "In$_{2-x}$Sn$_x$O$_{3-y}$" film in the case of using the substance "In$_{2-x}$Sn$_x$" as the target and the time (hour) required till an amount of light emitted from the light emitting body decrease in half. Data are provided for a case (A) in which the light emitting body shown in FIG. 18A is used and for a case (C) in which the light emitting body shown in FIG. 18C is used.

TABLE 4

Data on time required for amount of light to decrease in half

| | (A) | | | | | | | (C) |
|---|---|---|---|---|---|---|---|---|
| | y = 0.01 | y = 0.03 | y = 0.06 | y = 0.1 | y = 0.15 | y = 0.2 | y = 0.3 | y = 0.06 |
| X = 0.05 | 49 | 48 | 340 | 280 | 320 | 220 | 21 | 570 |
| X = 0.1 | 52 | 90 | 350 | 360 | 320 | 240 | 18 | 580 |
| X = 0.2 | 47 | 45 | 360 | 330 | 340 | 250 | 17 | 460 |

As shown in FIG. 4, the time required for the amount of light emitted from the light emitting body to decrease in half is less than 100 hours if the value "y" is not more than "0.03" in the case where the value "x" in the substance "$In_{2-x}Sn_x$" used as the target is any one of "0.05, 0.1 and 0.2". When the value "y" is within a range of 0.06 to 0.2, the above time is not less than 220 hours. When the value "y" is 0.3, the time is not more than 21 hours, showing a rapid decrease.

This indicates that an appropriate value of the "y" to have the light emission time to last sufficiently is within a range of 0.06 to 0.2. Therefore, the value "y" is set to be within a range of 0.06 to 0.2.

Since the "$In_{2-x}Sn_xO_{3-y}$" film also exhibits an oxygen deficiency characteristic to some extent, it is excellent in hygroscopicity and it can absorb moisture existing around the light emitting body and, as a result, light emission life of the light emitting body is improved.

Moreover, the time required for an amount of light to decrease in half in the light emitting body having the structure shown in FIG. 18c and being produced using the "y" value being 0.06, is longer by 1.5 times than the time in the light emitting body containing the "$In_{2-x}Sn_xO_{3-y}$" film produced using the same "y" value (y=0.06) as in the former. Thus, the "$In_{2-x}Sn_xO_{3-y}$" film absorbs moisture existing around the light emitting body and the hygroscopicity enhancing layer further absorbs the moisture, which severs to further reduce water content around the light emitting body, thus improving the light emission life of the light emitting body.

It is apparent that the present invention is not limited to the above embodiments but may be changed and modified without departing from the scope and spirit of the invention.

What is claimed is:

1. A light emitting body comprising:
    a substrate;
    a transparent electrode;
    a light emitting material;
    an upper electrode;
    wherein said transparent electrode is formed on said substrate and said light emitting material and said upper electrode are formed in order on said transparent electrode;
    wherein said transparent electrode is made up of a mixture of an oxide of indium with tin having a structural formula of "$In_{2-x}Sn_xO_{3-y}$" as a chief component and a value of said "y" is set to be within a range between not less than 0.05 and not more than 0.2.

2. The light emitting body according to claim 1, wherein a layer made of a hygroscopic material is formed adjacent to said transparent electrode.

3. The light emitting body according to claim 1, wherein a light emitting element portion comprises a layer of said transparent electrode, a layer of said light emitting material and a layer of said upper electrode is an electroluminescence device.

4. The light emitting body according to claim 3, wherein said electroluminescence device using an organic material as said light emitting material has a structure in which light is emitted from a thin film made of said organic material when a current is fed to said thin film.

5. The light emitting body according to claim 3, wherein a hole injecting layer is formed between said layer of said transparent electrode and said layer of said light emitting material.

6. The light emitting body according to claim 3, wherein an electron transporting layer is formed between said layer of said light emitting material and said layer of said upper electrode.

7. A light emitting body using said light emitting body according to claim 3 as light emitting element and comprising three groups of said light emitting element comprising a first light emitting element group, a second light emitting element group and a third light emitting element group, each being independently stacked and each being made up of at least one of said light emitting elements and each being placed in juxtaposition in a plane manner on a substrate wherein said first light emitting element group emits light at a wavelength region for a red color, said second light emitting element group emits light at a wavelength region for a green color and said third light emitting element group emits light at a wavelength region for a blue color.

8. The light emitting body according to claim 7, wherein each of said light emitting groups is so configured that light is emitted simultaneously at each of wavelength regions for red, green and blue colors.

9. The light emitting body according to claim 7, wherein mixed color light is emitted which contains light in blue, red and green colors produced by each of said plurality of light emitting element groups being placed in juxtaposition in a plane manner on said substrate.

10. A light emitting element portion using as light emitting element said light emitting body according to claim 3 comprising said layer of said transparent electrode, said layer of said light emitting material and said layer of said upper electrode, said light emitting element portion comprising said light emitting element and current supplying element used to be connected electrically and feed a current to said light emitting element.

11. The light emitting element portion according to claim 10, further comprising a switching element connected to said current supplying element which has a function to judge whether or not a current is to be fed to said light emitting element comprising said layer of said transparent electrode, said layer of said light emitting material, and said layer of said upper electrode.

12. The light emitting element portion according to claim 11, further comprising wirings connected to said current supplying element and used to feed a current to said current supplying element and wirings to supply voltage information about an ON/OFF state to said switching element.

13. A light emitting display device having a plurality of said light emitting element portions according to claim 12, wherein said wirings to feed a current to said current supplying element and wirings to supply voltage information about an ON/OFF state to said switching element are arranged in a matrix form.

14. A light emitting body comprising:

a substrate;

a transparent electrode;

a light emitting material;

a lower electrode;

wherein said lower electrode is formed on said substrate and said light emitting material and said transparent electrode are formed in order on said lower electrode; and wherein said transparent electrode is made up of a mixture of an oxide of indium with tin having a structural formula of "$In_{2-x}Sn_xO_{3-y}$" as a chief component and a value of said "y" is set to be within a range between not less than 0.05 and not more than 0.2.

15. The light emitting body according to claim 14, wherein a layer made of a hygroscopic material is formed adjacent to said transparent electrode.

16. The light emitting body according to claim 14, wherein a light emitting element portion comprises a layer of said transparent electrode, a layer of said light emitting material and a layer of said lower electrode is an electroluminescence device.

17. The light emitting body according to claim 16, wherein said electroluminescence device using an organic material as said light emitting material has a structure in which light is emitted from a thin film made of said organic material when a current is fed to said thin film.

18. The light emitting body according to claim 16, wherein a hole injecting layer is formed between said layer of said transparent electrode and said layer of said light emitting material.

19. The light emitting body according to claim 16, wherein an electron transporting layer is formed between said layer of said light emitting material and said lower electrode.

20. A light emitting body using said light emitting body according to claim 16 as light emitting element and comprising three groups of said light emitting element comprising a first light emitting element group, a second light emitting element group and a third light emitting element group, each being independently stacked and each being made up of at least one of said light emitting elements and each being placed in juxtaposition in a plane manner on a substrate wherein said first light emitting element group emits light at a wavelength region for a red color, said second light emitting element group emits light at a wavelength region for a green color and said third light emitting element group emits light at a wavelength region for a blue color.

21. The light emitting body according to claim 20, wherein each of said light emitting groups is so configured that light is emitted simultaneously at each of wavelength regions for red, green and blue colors.

22. The light emitting body according to claim 20, wherein mixed color light is emitted which contains light in blue, red and green color produced by each of said plurality of light emitting element groups being placed in juxtaposition in a plane manner on said substrate.

23. A light emitting element portion using as light emitting elements said light emitting body according to claim 16 comprising said layer of said transparent electrode, said layer of said light emitting material and said layer of said lower electrode, said light emitting element portion comprising said light emitting element and current supplying element used to be connected electrically and feed a current to said light emitting.

24. The light emitting element portion according to claim 23, further comprising a switching element connected to said current supplying element which has a function to judge whether or not a current is to be fed to said light emitting element comprising said layer of said transparent electrode, said layer of said light emitting material, and said layer of said lower electrode.

25. The light emitting element portion according to claim 24, further comprising wirings connected to said current supplying element and used to feed a current to said current supplying element and wirings to supply voltage information about an ON/OFF state to said switching element.

26. A light emitting display device having a plurality of said light emitting element portions according to claim 25, wherein said wirings to feed a current to said current supplying element and wirings to supply voltage information about an ON/OFF state to said switching element are arranged in a matrix form.

* * * * *